(12) United States Patent
Kamimura et al.

(10) Patent No.: US 8,110,333 B2
(45) Date of Patent: *Feb. 7, 2012

(54) RESIST COMPOSITION CONTAINING NOVEL SULFONIUM COMPOUND, PATTERN-FORMING METHOD USING THE RESIST COMPOSITION, AND NOVEL SULFONIUM COMPOUND

(75) Inventors: Sou Kamimura, Shizuoka (JP); Yasutomo Kawanishi, Kanagawa (JP); Kenji Wada, Shizouka (JP); Tomotaka Tsuchimura, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 624 days.

This patent is subject to a terminal disclaimer.

(21) Appl. No.: 12/184,780

(22) Filed: Aug. 1, 2008

(65) Prior Publication Data

US 2009/0042124 A1    Feb. 12, 2009

(30) Foreign Application Priority Data

Aug. 3, 2007 (JP) ................................. 2007-203152

(51) Int. Cl.
  *G03F 7/004* (2006.01)
  *G03F 7/30* (2006.01)
(52) U.S. Cl. ............... 430/270.1; 430/326; 430/905; 562/37; 549/44
(58) Field of Classification Search ............... 562/37; 549/44; 430/270.1, 326, 905
See application file for complete search history.

(56) References Cited

U.S. PATENT DOCUMENTS

| | | | |
|---|---|---|---|
| 6,548,221 B2 | 4/2003 | Uetani et al. | |
| 6,680,157 B1 | 1/2004 | Fedynyshyn | |
| 2008/0081288 A1* | 4/2008 | Kawanishi et al. | 430/281.1 |
| 2009/0047598 A1* | 2/2009 | Yamashita et al. | 430/270.1 |

FOREIGN PATENT DOCUMENTS

| | | |
|---|---|---|
| EP | 1338921 A2 | 8/2003 |
| EP | 1480078 A1 | 11/2004 |
| EP | 1693705 A2 | 8/2006 |
| EP | 1705518 A2 | 9/2006 |
| EP | 1736824 A2 | 12/2006 |
| EP | 1816519 A1 | 8/2007 |
| EP | 1840651 A1 | 10/2007 |

OTHER PUBLICATIONS

Extended European Search Report dated Apr. 1, 2009.
Communication from the European Patent Office dated Apr. 7, 2010 issued in counterpart Application No. 08013561.3-1226.
Jerry March: "Advanced Organic Chemistry Fourth Edition" Wiley Interscience ISBN: 0-471-60180-2 pp. 248-252 and pp. 263-272, (2001).
Dr. Edward Valente: "Ch. 24 Phenol" Mississippi College website Mar. 16, 2003, Retrieved from the Internet: URL:http://bio-che.mc.edu/valente/ch24.pdf [retrieved on Mar. 23, 2010] 6 pages 24.1-24.5.

* cited by examiner

*Primary Examiner* — John Chu
(74) *Attorney, Agent, or Firm* — Sughrue Mion, PLLC

(57) ABSTRACT

A resist composition includes (A) a compound represented by the following formula (I):

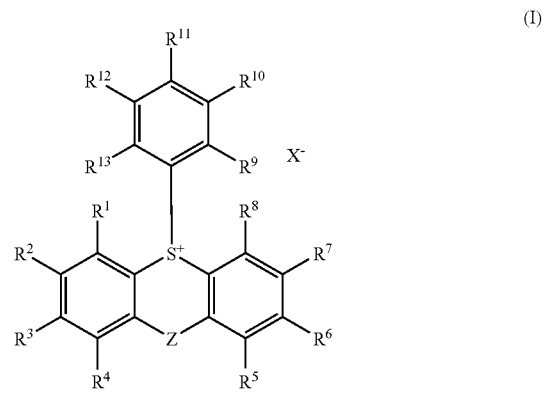

wherein each of $R^1$ to $R^{13}$ independently represents a hydrogen atom or a substituent, provided that at least one of $R^1$ to $R^{13}$ is a substituent containing an alcoholic hydroxyl group; Z represents a single bond or a divalent linking group; and $X^-$ represents an anion containing a proton acceptor functional group.

9 Claims, No Drawings

RESIST COMPOSITION CONTAINING NOVEL SULFONIUM COMPOUND, PATTERN-FORMING METHOD USING THE RESIST COMPOSITION, AND NOVEL SULFONIUM COMPOUND

BACKGROUND OF THE INVENTION

1. Field of the Invention

The present invention relates to a resist composition capable of changing the property by reaction upon irradiation with actinic ray or radiation (electron beam, X-ray, EUV, UV, etc.), a compound for use in the resist composition, and a pattern-forming method using the resist composition. More specifically, the invention relates to a resist composition for use in a manufacturing process of semiconductors, e.g., IC, the manufacture of circuit substrates such as liquid crystals, thermal heads and the like, and other photo-fabrication processes, lithographic printing plates, and acid-curable compositions, and also the invention relates to a compound for use in the resist composition, and a pattern-forming method using the resist composition.

2. Description of the Related Art

Chemical amplification resist compositions are pattern-forming materials capable of generating an acid at the area irradiated with radiation such as a far ultraviolet ray, changing the solubility in a developing solution of the area irradiated with the actinic radiation and the non-irradiated area by the reaction with the acid as a catalyst, and forming a pattern on a substrate.

When a KrF excimer laser is used as the exposure light source, resins having poly(hydroxystyrene) as a fundamental skeleton that is small in absorption in the region of 248 nm are mainly used, so that a high sensitivity and high resolution are secured and good pattern is formed as compared with conventionally used naphthoquinonediazide/novolak resins.

On the other hand, when a light source of further shorter wavelength, e.g., an ArF excimer laser (193 nm), is used as the exposure light source, since compounds having an aromatic group substantially show large absorption in the region of 193 nm, even the above chemical amplification resist compositions are not sufficient.

To cope with this problem, resists for an ArF excimer laser containing a resin having an alicyclic hydrocarbon structure have been developed.

Regarding an acid generator that is the main constituent of chemical amplification resists, triphenylsulfonium salts are generally known (e.g., refer to U.S. Pat. No. 6,548,221).

However, these acid generators are still insufficient in various points, and a resist composition improved in sensitivity, resolution, roughness, iso/dense bias, and falling down of a pattern is desired.

Further, when light sources such as electron beams, X-rays and EUV are used, exposure is carried out under vacuum, so that compounds having a low boiling point such as solvents and resist materials decomposed by high energy are volatilized to contaminate the exposure apparatus, i.e., outgassing is a serious problem. In recent years, various investigations are in progress on the reduction of outgassing, and a variety of trials are suggested, e.g., restraint of volatilization of low molecular weight compounds by forming a top coat layer (e.g., refer to EP 1,480,078), and addition of a radical trapping agent capable of inhibiting decomposition of a polymer (e.g., refer to U.S. Pat. No. 6,680,157). In connection with acid generators, some contrivances are also required on the reduction of outgassing.

SUMMARY OF THE INVENTION

The invention provides a resist composition excellent in sensitivity, resolution, roughness, exposure latitude, falling down of a pattern, and outgassing characteristics. The invention also provides a compound for use in the resist composition. The invention further provides a pattern-forming method using the resist composition.

The above problems have been dissolved by the following constitution by a novel sulfonium compound represented by formula (I).

<1> A resist composition comprising:

(A) a compound represented by the following formula (I):

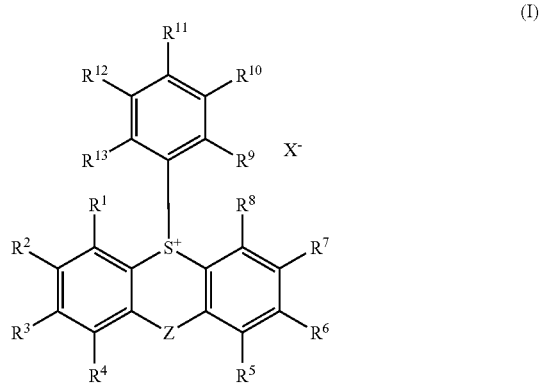

wherein each of $R^1$ to $R^{13}$ independently represents a hydrogen atom or a substituent, provided that at least one of $R^1$ to $R^{13}$ is a substituent containing an alcoholic hydroxyl group;

Z represents a single bond or a divalent linking group; and $X^-$ represents an anion containing a proton acceptor functional group.

<2> The resist composition according to <1>, further comprising:

(B) a resin capable of decomposing by the action of an acid to increase solubility in an alkali developing solution.

<3> The resist composition according to <2>, wherein the resin (B) is a resin having a hydroxystyrene repeating unit, <4> The resist composition according to any one of <1> to <3>, which is exposed with X-ray, electron beam or EUV.

The preferred embodiments of the invention will be described below.

<5> The resist composition according to any one of <1> to <4>, wherein $X^-$ in formula (I) is an anion of an acid represented by the following formula (II) or an anion represented by the following formula (III):

$$Q-R \quad\quad (II)$$

wherein

Q represents a sulfo group ($-SO_3H$) or a carboxyl group ($-CO_2H$); and

R represents a univalent organic group containing a proton acceptor functional group;

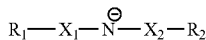 (III)

wherein each of $R_1$ and $R_2$ independently represents a univalent organic group, and either $R_1$ or $R_2$ contains a proton acceptor functional group, or $R_1$ and $R_2$ may be bonded to each other to form a ring and the formed ring may contain a proton acceptor functional group; and each of $X_1$ and $X_2$ independently represents —CO— or —$SO_2$—.

<6> The resist composition according to any one of <1> to <5>, wherein $X^-$ in formula (I) is an anion represented by the following formula (IV);

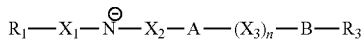 (IV)

wherein each of $R_1$ and $R_3$ independently represents a univalent organic group, provided that either $R_1$ or $R_3$ has a proton acceptor functional group, or $R_1$ and $R_3$ may be bonded to each other to form a ring and the formed ring may contain a proton acceptor functional group;

each of $X_1$, $X_2$ and $X_3$ independently represents —CO— or —$SO_2$—;

A represents a divalent linking group;

B represents a single bond, an oxygen atom, or —N(Rx)—;

Rx represents a hydrogen atom or a univalent organic group;

when B represents —N(Rx)—, $R_3$ and Rx may be bonded to each other to form a ring; and n represents 0 or 1.

<7> The resist composition according to <2>, wherein the resin (B) has a hydroxystyrene structural unit.

<8> The resist composition according to <2>, wherein the resin (B) contains a repeating unit having a monocyclic or polycyclic hydrocarbon structure.

<9> The resist composition according to <2>, wherein the resin (B) is a resin which contains a repeating unit having an alcoholic hydroxyl group and is capable of decomposing by the action of an acid to increase solubility in an alkali developing solution.

<10> The resist composition according to <9>, wherein the repeating unit having an alcoholic hydroxyl group in resin (B) is a repeating unit having at least one structure selected from a monohydroxy adamantane structure, a dihydroxy adamantane structure, and a trihydroxy adamantane structure.

<11> The resist composition according to <2>, wherein the resin (B) is a resin containing a repeating unit having a lactone structure.

<12> The resist composition according to <2>, wherein the resin (B) is a resin having at least one kind of methacrylic acid ester repeating unit and at least one kind of acrylic acid ester repeating unit.

<13> The resist composition according to <2>, wherein the resin (B) has a fluorine atom on the main chain or side chain.

<14> The resist composition according to <2>, wherein the resin (B) has a hexafluoro-2-propanol structure.

<15> The resist composition according to any one of <5> to <14>, further comprising:

(D) a dissolution inhibiting compound which is capable of decomposing by the action of an acid to increase solubility in an alkali developing solution and has a molecular weight of 3,000 or less.

<16> The resist composition according to <2>, wherein the resin (B) contains:

at least one kind of repeating unit selected from 2-alkyl-2-adamantyl (meth)acrylates and dialkyl(1-adamantyl)methyl (meth)acrylates, at least one kind of repeating unit having a lactone structure, and at least one kind of repeating unit having two or more hydroxyl groups.

<17> The resist composition according to <16>, wherein the resin (B) further contains a repeating unit having a carboxy group.

<18> The resist composition according to <3>, wherein the resin (B) contains:

at least one kind of repeating unit selected from 2-alkyl-2-adamantyl (meth)acrylates and dialkyl(1-adamantyl)methyl (meth)acrylates, and at least one kind of repeating unit having a hydroxystyrene structure.

<19> The resist composition according to any one of <1> to <18>, further comprising:

(F) a basic compound, and (G) a fluorine and/or silicon surfactant.

<20> The resist composition according to <19>, wherein the basic compound (F) is a compound having a structure selected from an imidazole structure, a diazabicyclo structures an onium hydroxide structure, an onium carboxylate structure, a trialkylamine structure, an aniline structure, and a pyridine structure; an alkylamine derivative having a hydroxyl group and/or an ether bond; or an aniline derivative having a hydroxyl group and/or an ether bond.

<21> A pattern-forming method comprising:

forming a resist film with the resist composition according to any of <1> to <20>, exposing the resist film, and developing the resist film.

DETAILED DESCRIPTION OF THE INVENTION

The invention will be described in detail below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

The present invention is based on finding a novel compound represented by formula (I) (hereinafter also referred to as "compound (A)") that is useful for a resist composition.

A resist composition in the invention contains compound (A), and resin (B) capable of decomposing by the action of an acid to increase solubility in an alkali developing solution, and if necessary, dissolution inhibiting compound (D)

capable of decomposing by the action of an acid to increase solubility in an alkali developing solution having a molecular weight of 3,000 or less,

[1] Compound Represented by Formula (I) (Compound (A)):

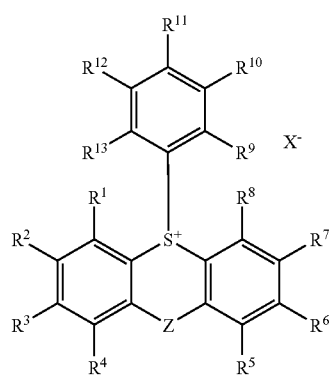

(I)

In formula (I), each of $R^1$ to $R^{13}$ independently represents a hydrogen atom or a substituent, and at least one of $R^1$ to $R^{13}$ is a substituent containing an alcoholic hydroxyl group.

Z represents a single bond or a divalent linking group.

$X^-$ represents an anion containing a proton acceptor functional group.

The alcoholic hydroxyl group in the invention means a hydroxyl group bonding to the carbon atom of an alkyl group.

When $R^1$ to $R^{13}$ each represents a substituent containing an alcoholic hydroxyl group, each of $R^1$ to $R^{13}$ is represented by —W—Y, where Y is an alkyl group substituted with a hydroxyl group, and W is a single bond or a divalent linking group.

As the alkyl group represented by Y, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a boronyl group can be exemplified, preferably an ethyl group, a propyl group, an isopropyl group, an n-butyl group, an isobutyl group, and a sec-butyl group, and more preferably an ethyl group, a propyl group, and an isopropyl group. Y especially preferably has a structure of —$CH_2CH_2OH$.

The divalent linking group represented by W is not especially restricted, and, for example, divalent groups obtained by substituting an arbitrary hydrogen atom of a monovalent group with a single bond can be exemplified, and as such monovalent groups, e.g., an alkoxyl group, an acyloxy group, a carbamoyloxy group, an alkoxycarbonyloxy group, an aryloxycarbonyloxy group, an acylamino group, an aminocarbonylamino group, an alkoxycarbonylamino group, an aryloxycarbonylamino group, a sulfamoylamino group, an alkylsulfonylamino group, an arylsulfonylamino group, an alkylthio group, an arylthio group, a sulfamoyl group, an alkylsulfonyl group, an arylsulfinyl group, an alkylsulfonyl group, an arylsulfonyl group, an acyl group, an aryloxycarbonyl group, an alkoxycarbonyl group, and a carbamoyl group can be exemplified.

W preferably represents a single bond, or a divalent group obtained by substituting an arbitrary hydrogen atom of an alkoxyl group, an acyloxy group, an acylamino group, an alkylsulfonylamino group, an arylsulfonylamino group, an alkylthio group, an alkylsulfonyl group, an acyl group, an alkoxycarbonyl group, or a carbamoyl group with a single bond, and more preferably a single bond, or a divalent group obtained by substituting an arbitrary hydrogen atom of an acyloxy group, an alkylsulfonyl group, an acyl group, or an alkoxycarbonyl group with a single bond.

When $R^1$ to $R^{13}$ each represents a substituent containing an alcoholic hydroxyl group, the number of carbon atoms contained in the substituent is preferably from 2 to 10, more preferably from 2 to 6, and especially preferably from 2 to 4.

The substituent containing an alcoholic hydroxyl group represented by $R^1$ to $R^{13}$ may have two or more alcoholic hydroxyl groups. The number of the alcoholic hydroxyl groups of the substituent containing an alcoholic hydroxyl group represented by $R^1$ to $R^{13}$ is from 1 to 6, preferably from 1 to 3, and more preferably 1.

The number of alcoholic hydroxyl groups of the compound represented by formula (I) is from 1 to 10 in total of $R^1$ to $R^{13}$, preferably from 1 to 6, and more preferably from 1 to 3.

When each of $R^1$ to $R^{13}$ does not contain an alcoholic hydroxyl group, each of $R^1$ to $R^{13}$ independently represents a hydrogen atom or a substituent, and any substituent may be used with no particular restriction, e.g., a halogen atom, an alkyl group (including a cycloalkyl group, a bicycloalkyl group, and a tricycloalkyl group), an alkenyl group (including a cycloalkenyl group, and a bicycloalkenyl group), an alkynyl group, an aryl group, a heterocyclic group, a cyano group, a nitro group, a carboxyl group, an alkoxyl group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—$B(OH)_2$), a phosphato group (—$OPO(OH)_2$), a sulfato group (—$OSO_3H$), and other known substituents are exemplified as the substituents. These substituents may be further substituted.

Further, contiguous two of $R^1$ to $R^{13}$ can also form a ring together (e.g., aromatic or non-aromatic hydrocarbon rings, heterocyclic rings, and polycyclic condensed rings formed by combination of these rings, e.g., a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxthine ring, a phenothiazine ring, and a phenazine ring are exemplified).

When each of $R^1$ to $R^{13}$ does not contain an alcoholic hydroxyl group, $R^1$ to $R^{13}$ each preferably represents a hydrogen atom, a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a cyano group, a carboxyl group, an alkoxyl group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkylsulfonylamino group, an arylsulfonylamino group, an alkylthio group, an arylthio group, a sulfamoyl group, an alkylsulfonyl group, an arylsulfonyl group, an aryloxycarbonyl group, an alkoxycarbonyl group, a carbamoyl group, an imido group, a silyl group, or a ureido group.

When each of $R^1$ to $R^{13}$ does not contain an alcoholic hydroxyl group, $R^1$ to $R^{13}$ each more preferably represents a hydrogen atom, a halogen atom, an alkyl group (including a cycloalkyl group, a bicycloalkyl group, and a tricycloalkyl group), a cyano group, an alkoxyl group, an acyloxy group, an acylamino group, an aminocarbonylamino group, an alkoxycarbonylamino group, an alkylsulfonylamino group, an arylsulfonylamino group, an alkylthio group, a sulfamoyl group, an alkylsulfonyl group, an arylsulfonyl group, an alkoxycarbonyl group, or a carbamoyl group.

Further, when each of $R^1$ to $R^{13}$ does not contain an alcoholic hydroxyl group, $R^1$ to $R^{13}$ each especially preferably represents a hydrogen atom, an alkyl group (including a cycloalkyl group, a bicycloalkyl group, and a tricycloalkyl group), a halogen atom, or an alkoxyl group.

In formula (I), at least one of $R^1$ to $R^{13}$ contains an alcoholic hydroxyl group, and preferably at least one of $R^9$ to $R^{13}$ contains an alcoholic hydroxyl group.

Z represents a single bond or a divalent linking group, and as the divalent linking groups, e.g., an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, —CH═CH—, —C≡C—, an aminocarbonylamino group, and an aminosulfonylamino group are exemplified, which groups may have a substituent. As the substituents of these groups, the same substituents as those described in $R^1$ to $R^{13}$ are exemplified. Z preferably represents a single bond, or a substituent not having an electron attractive property, e.g., an alkylene group, an arylene group, an ether group, a thioether group, an amino group, —CH═CH—, —C≡C—, an aminocarbonylamino group, or an aminosulfonylamino group, more preferably a single bond, an ether group, or a thioether group, and especially preferably a single bond.

The compound represented by formula (I) has an anion containing a proton acceptor functional group as a counter anion $X^-$. As the anion, an organic anion is preferred. The organic anion is an anion containing at least one carbon atom. Further, the organic anion is preferably a non-nucleophilic anion. The non-nucleophilic anion is an anion having extremely low ability of causing a nucleophilic reaction and capable of restraining the aging decomposition due to intramolecular nucleophilic reaction.

As the non-nucleophilic anions, e.g., a sulfonate anion, a carboxylate anion, a sulfanilamide anion, a bis(alkylsulfonyl) imide anion, and a tris(alkylsulfonyl)methyl anion can be exemplified.

As the non-nucleophilic sulfonate anions, e.g., an alkylsulfonate anion, an arylsulfonate anion, and a camphorsulfonate anion are exemplified. As the non-nucleophilic carboxylate anions, e.g., an alkylcarboxylate anion, an arylcarboxylate anion and an aralkylcarboxylate anion are exemplified.

The alkyl moiety in the alkylsulfonate anion may be an alkyl group or a cycloalkyl group, preferably an alkyl group having from 1 to 30 carbon atoms and a cycloalkyl group having from 3 to 30 carbon atoms, e.g., a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbonyl group, and a boronyl group can be exemplified.

The aryl group in the arylsulfonate anion is preferably an aryl group having from 6 to 14 carbon atoms, e.g., a phenyl group, a tolyl group, and a naphthyl group can be exemplified.

As the substituents of the alkyl group, cycloalkyl group and aryl group of the alkylsulfonate anion and arylsulfonate anion, e.g., a nitro group, a halogen atom (a fluorine atom, a chlorine atom, a bromine atom, and an iodine atom), a carboxyl group, a hydroxyl group, an amino group, a cyano group, an alkoxyl group (preferably having from 1 to 5 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms), and an alkoxycarbonyloxy group (preferably having from 2 to 7 carbon atoms) can be exemplified. As for the aryl group and cyclic structure of each group, an alkyl group (preferably having from 1 to 15 carbon atoms) can further be exemplified as the substituent.

As the alkyl moiety in the alkylcarboxylate anion, the same alkyl groups and cycloalkyl groups as in the alkylsulfonate anion can be exemplified. As the aryl group in the arylcarboxylate anion, the same aryl groups as in the arylsulfonate anion can be exemplified. As the aralkyl group in the aralkylcarboxylate anion, preferably an aralkyl group having from 6 to 12 carbon atoms, e.g., a benzyl group, a phenethyl group, a naphthylmethyl group, and a naphthylethyl group can be exemplified.

As the substituents of the alkyl group, cycloalkyl group, aryl group and aralkyl group in the alkylcarboxylate anion, arylcarboxylate anion and aralkylcarboxylate anion, e.g., the same halogen atoms, alkyl groups, cycloalkyl groups, alkoxyl groups and alkylthio groups as in the arylsulfonate anion can be exemplified. As the sulfonylimide anion, e.g., a saccharin anion can be exemplified.

The alkyl group in the bis(alkylsulfonyl)imide anion and tris(alkylsulfonyl)-methyl anion is preferably an alkyl group having from 1 to 5 carbon atoms, e.g., a methyl group, an ethyl group, a propyl group, an isopropyl group, an n-butyl group, an isobutyl group, a sec-butyl group, a pentyl group and a neopentyl group are exemplified. As the substituents on these alkyl groups, e.g., a halogen atom, an alkyl group substituted with a halogen atom, an alkoxyl group, and an alkylthio group can be exemplified.

As other non-nucleophilic anions, e.g., fluorinated phosphorus, fluorinated boron and fluorinated antimony can be exemplified.

A proton acceptor functional group of an anion represented by $X^-$ is a functional group having a group or a lone electron-pair capable of electrostatically interacting with a proton, for example, a functional group having a macrocyclic structure such as cyclic polyether, and a functional group having a nitrogen atom having a lone electron-pair little in contribution of π conjugation can be exemplified. The nitrogen atom having a lone electron-pair little in contribution of on conjugation is, for example, a nitrogen atom having a partial structure represented by the following formula:

As preferred partial structures of the proton acceptor functional group, e.g., crown ether, azacrown ether, tertiary amine, secondary amine, primary amine, pyridine, imidazole, pyrazine, and aniline structures can be exemplified. A preferred number of carbon atoms is from 4 to 30. As groups containing these structures, an alkyl group, a cycloalkyl group, an aryl group, an aralkyl group, and an alkenyl group can be exemplified. The alkyl group, cycloalkyl group, aryl group, aralkyl group and alkenyl group are the same as those enumerated above.

As the examples of the substituents that the above groups may have, e.g., a halogen atom, a hydroxyl group, a nitro group, a cyano group, a carboxy group, a carbonyl group, a cycloalkyl group (preferably having from 3 to 10 carbon atoms), an aryl group (preferably having from 6 to 14 carbon atoms), an alkoxy group (preferably having from 1 to 10 carbon atoms), an acyl group (preferably having from 2 to 20 carbon atoms), an acyloxy group (preferably having from 2 to 10 carbon atoms), an alkoxycarbonyl group (preferably having from 2 to 20 carbon atoms), and an aminoacyl group (preferably having from 2 to 20 carbon atoms) are exemplified. In connection with the cyclic structures in the aryl group and cycloalkyl group, an alkyl group (preferably having from 1 to 20 carbon atoms) can further be exemplified as a substituent. Regarding the aminoacyl group, an alkyl group (preferably having from 1 to 20 carbon atoms) can further be exemplified as a substituent.

$X^-$ is preferably the anion of an acid represented by the following formula (II) or an anion represented by the following formula (III).

(II)

In formula (II), Q represents a sulfo group (—SO$_3$H) or a carboxyl group (—CO$_2$H).

R represents a univalent organic group containing a proton acceptor functional group.

The anion of an acid represented by formula (II) is an anion formed by separating the hydrogen atom of the sulfo group or carboxyl group represented by Q.

The univalent organic group represented by R preferably has from 1 to 40 carbon atoms and, e.g., an alkyl group, a cycloalkyl group, an aryl group, an aralkyl group, and an alkenyl group can be exemplified. When R contains a proton acceptor functional group, it may be present anywhere on the terminal, in the chain or side chain of the alkyl group, cycloalkyl group, aryl group, aralkyl group, and alkenyl group.

The alkyl group represented by R may further have a substituent. The alkyl group is preferably a straight chain or branched alkyl group having from 1 to 30 carbon atoms, and the alkyl group may have an oxygen atom, a sulfur atom, or a nitrogen atom in the alkyl chain. Specifically, straight chain alkyl groups, e.g., a methyl group, an ethyl group, an n-propyl group, an n-butyl group, an n-pentyl group, an n-hexyl group, an n-octyl group, an n-dodecyl group, an n-tetradecyl group, and an n-octadecyl group, and branched alkyl groups, e.g., an isopropyl group, an isobutyl group, a t-butyl group, a neopentyl group, and a 2-ethylhexyl group can be exemplified.

The cycloalkyl group represented by R may further have a substituent. The cycloalkyl group is preferably a cycloalkyl group having from 3 to 20 carbon atoms, and the cycloalkyl group may have an oxygen atom or a nitrogen atom in the ring. Specifically, a cyclopropyl group, a cyclopentyl group, a cyclohexyl group, a norbornyl group, and an adamantyl group can be exemplified.

The aryl group represented by R may further have a substituent. The aryl group is preferably an aryl group having from 6 to 14 carbon atoms and, e.g., a phenyl group and a naphthyl group can be exemplified.

The aralkyl group represented by R may further have a substituent. The aralkyl group is preferably an aralkyl group having from 7 to 20 carbon atoms and, e.g., a benzyl group, a phenethyl group, a naphthylmethyl group, and a naphthylethyl group can be exemplified.

The alkenyl group represented by R may further have a substituent, and a group having a double bond at an arbitrary position of the above alkyl group can be exemplified.

As the examples of the substituents that each of the above groups may have, e.g., a halogen atom, a hydroxyl group, a nitro group, a cyano group, a carboxyl group, a carbonyl group, a cycloalkyl group (preferably having from 3 to 10 carbon atoms), an aryl group (preferably having from 6 to 14 carbon atoms), an alkoxyl group (preferably having from 1 to 10 carbon atoms), an acyl group (preferably having from 2 to 20 carbon atoms), an acyloxy group (preferably having from 2 to 10 carbon atoms), an alkoxycarbonyl group (preferably having from 2 to 20 carbon atoms), and an aminoacyl group (preferably having from 2 to 10 carbon atoms) can be exemplified.

In connection with the cyclic structure in the aryl group and the cycloalkyl group, an alkyl group (preferably having from 1 to 10 carbon atoms) can further be exemplified as the substituent. As further substituents with respect to the aminoacyl group, an alkyl group (preferably having from 1 to 10 carbon atoms) can be exemplified. As the alkyl group having a substituent, a perfluoroalkyl group e.g., a perfluoromethyl group, a perfluoroethyl group, a perfluoropropyl group, and a perfluorobutyl group can be exemplified.

(III)

In formula (III), each of R$_1$ and R$_2$ independently represents a univalent organic group, and either one contains a proton acceptor functional group, or R$_1$ and R$_2$ may be bonded to each other to form a ring and the formed ring may contain a proton acceptor functional group.

Each of X$_1$ and X$_2$ independently represents —CO— or —SO$_2$—.

As the specific examples of the univalent organic groups represented by R$_1$ and R$_2$ in formula (III), the same groups as exemplified above as the groups represented by R in formula (II) can be exemplified.

In formula (III), it is preferred that at least one of $X_1$ and $X_2$ represents —$SO_2$—.

The anion represented by formula (III) is preferably an anion represented by the following formula (IV).

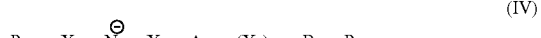

In formula (IV), each of $R_1$ and $R_3$ independently represents a univalent organic group, provided that either $R_1$ or $R_3$ has a proton acceptor functional group; $R_1$ and $R_3$ may be bonded to each other to form a ring, and the formed ring may contain a proton acceptor functional group.

Each of $X_1$, $X_2$ and $X_3$ independently represents —CO— or —$SO_2$—,

A represents a divalent linking group.

B represents a single bond, an oxygen atom, or —N(Rx)—. Rx represents a hydrogen atom or a univalent organic group.

When B represents —N(Rx)—, $R_3$ and Rx may be bonded to each other to form a ring.

n represents 0 or 1.

As the specific examples of the univalent organic groups represented by $R_1$ and $R_3$ in formula (IV), the same groups as exemplified above as the groups represented by R in formula (II) can be exemplified.

The divalent linking group represented by A is preferably a divalent linking group having a fluorine atom having from 1 to 8 carbon atoms, for example, an alkylene group having a fluorine atom having from 1 to 8 carbon atoms, and a phenylene group having a fluorine atom are exemplified. More preferably, an alkylene group having a fluorine atom is exemplified, and carbon atom number is preferably from 2 to 6, and more preferably from 2 to 4. An oxygen atom and a sulfur atom may be contained in the alkylene chain. The alkylene group is preferably an alkylene group obtained by substituting from 30 to 100% of the number of hydrogen atoms with fluorine atoms, more preferably a perfluoroalkylene groups and especially preferably a perfluoroethylene group, a perfluoropropylene group, and a perfluorobutylene group.

The univalent organic group represented by Rx preferably has from 4 to 30 carbon atoms, e.g., an alkyl group, a cycloalkyl group, an aryl group, an aralkyl group, and an alkenyl group can be exemplified. As the alkyl group, cycloalkyl group, aryl group, aralkyl group, and alkenyl group, the same groups as described above can be exemplified.

In formula (III), each of $X_1$, $X_2$ and $X_3$ preferably represents —$SO_2$—.

The compound represented by formula (I) can be used by one kind alone, or two or more kinds in combination. The addition amount of the compound represented by formula (I) is preferably from 0.1 to 20 mass % in total based on all the

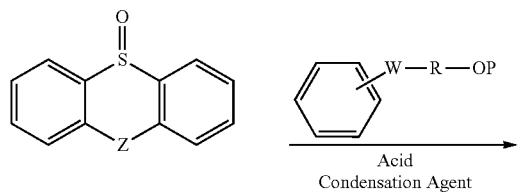

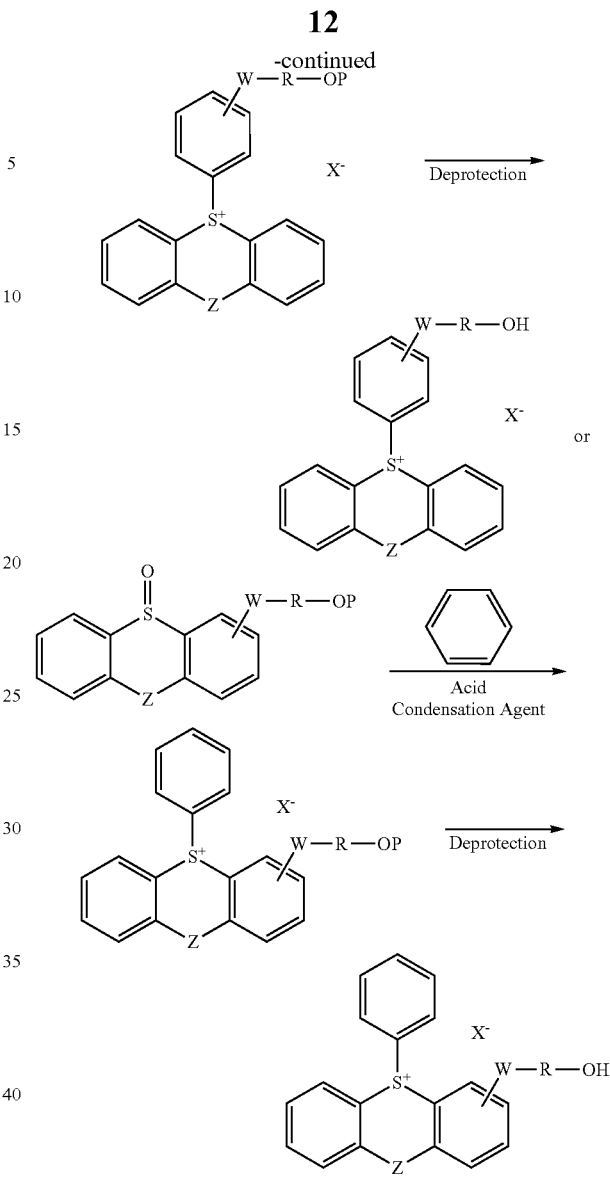

In the above reaction scheme, W represents a divalent linking group, R represents an alkylene group, and P represents a protective group.

The specific examples of the compounds represented by formula (I) are shown below, but the invention is not restricted to these compounds.

-continued
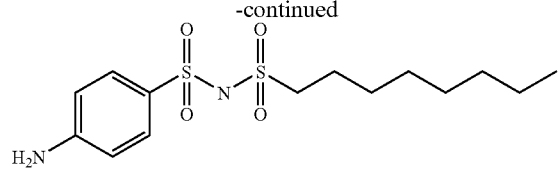
(A-2)
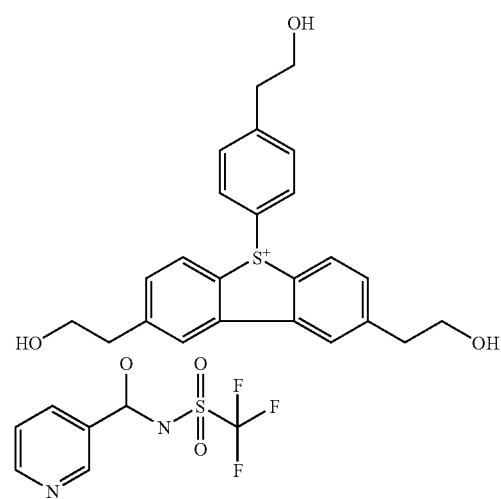
(A-3)
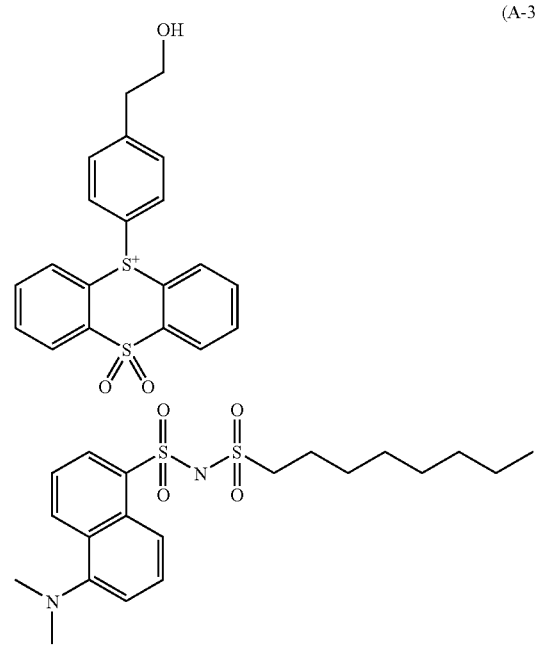
(A-4)
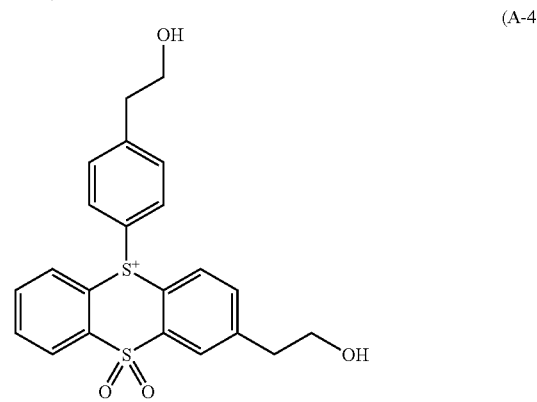
-continued
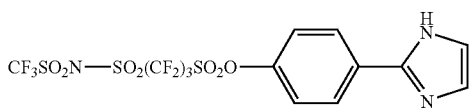
(A-5)
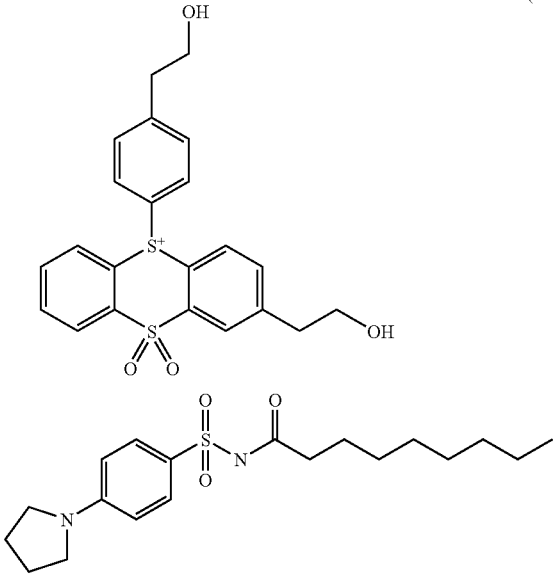
(A-6)
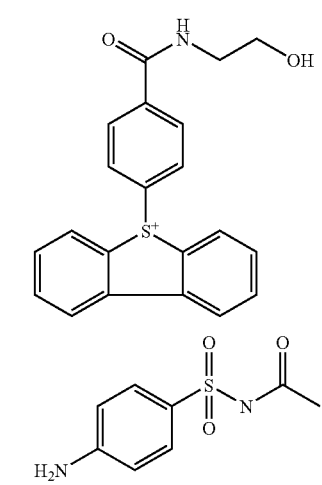
(A-7)
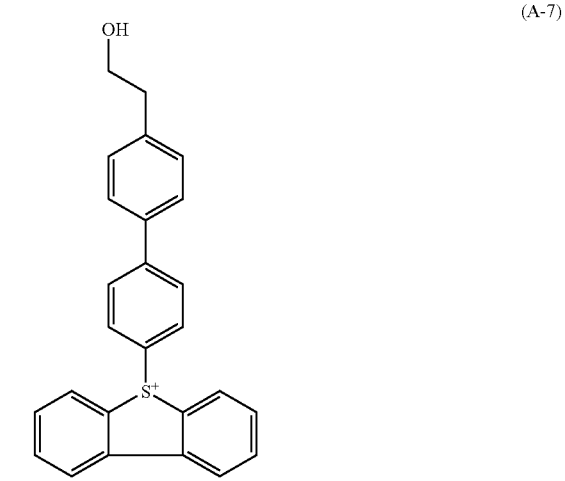

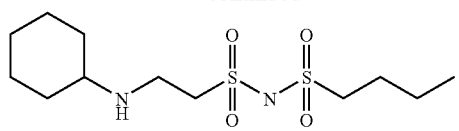
(A-8)
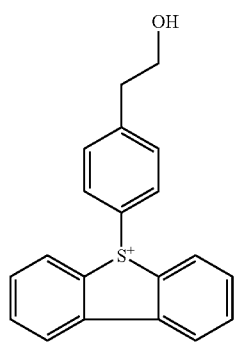
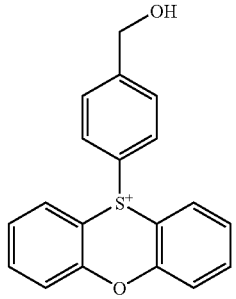
(A-11)
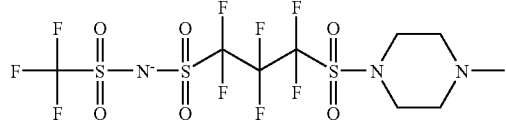
(A-9)
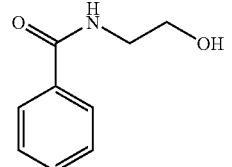
(A-12)
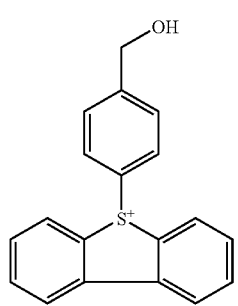
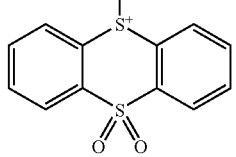
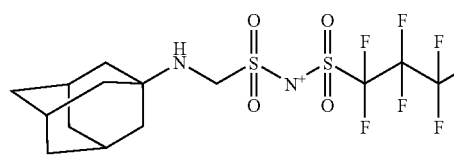
(A-10)
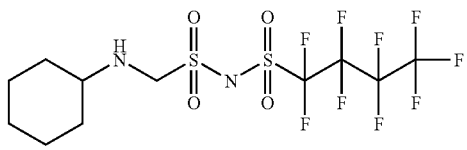
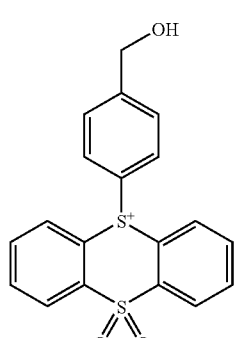
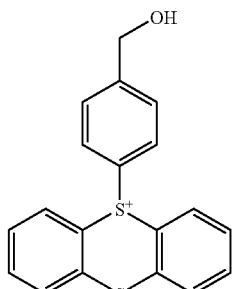
(A-13)
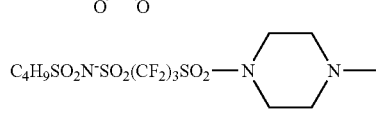
C₄H₉SO₂N⁻SO₂(CF₂)₃SO₂—N⌐⌐N—CH₃

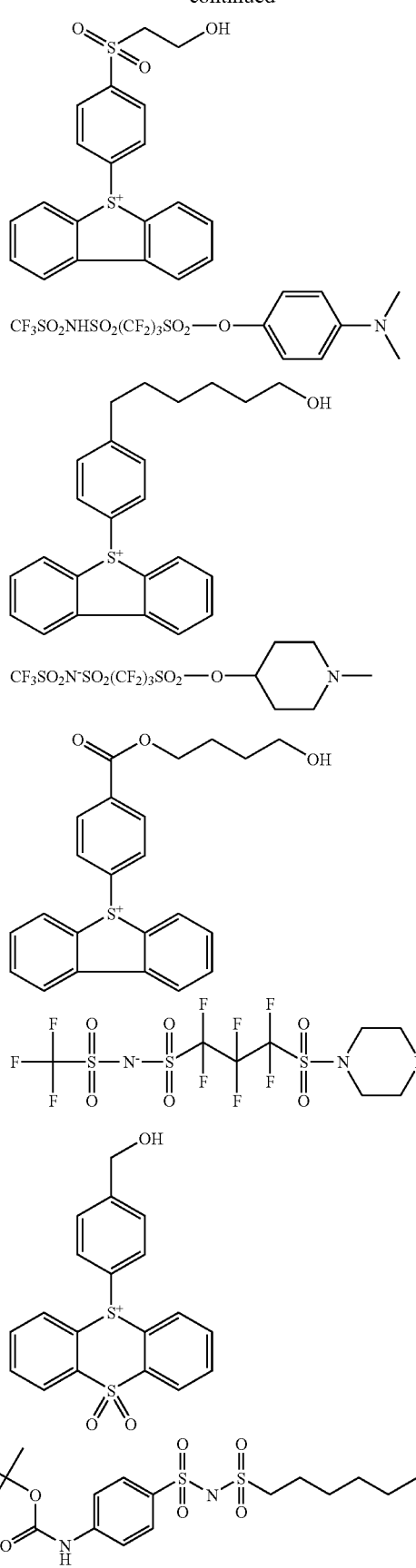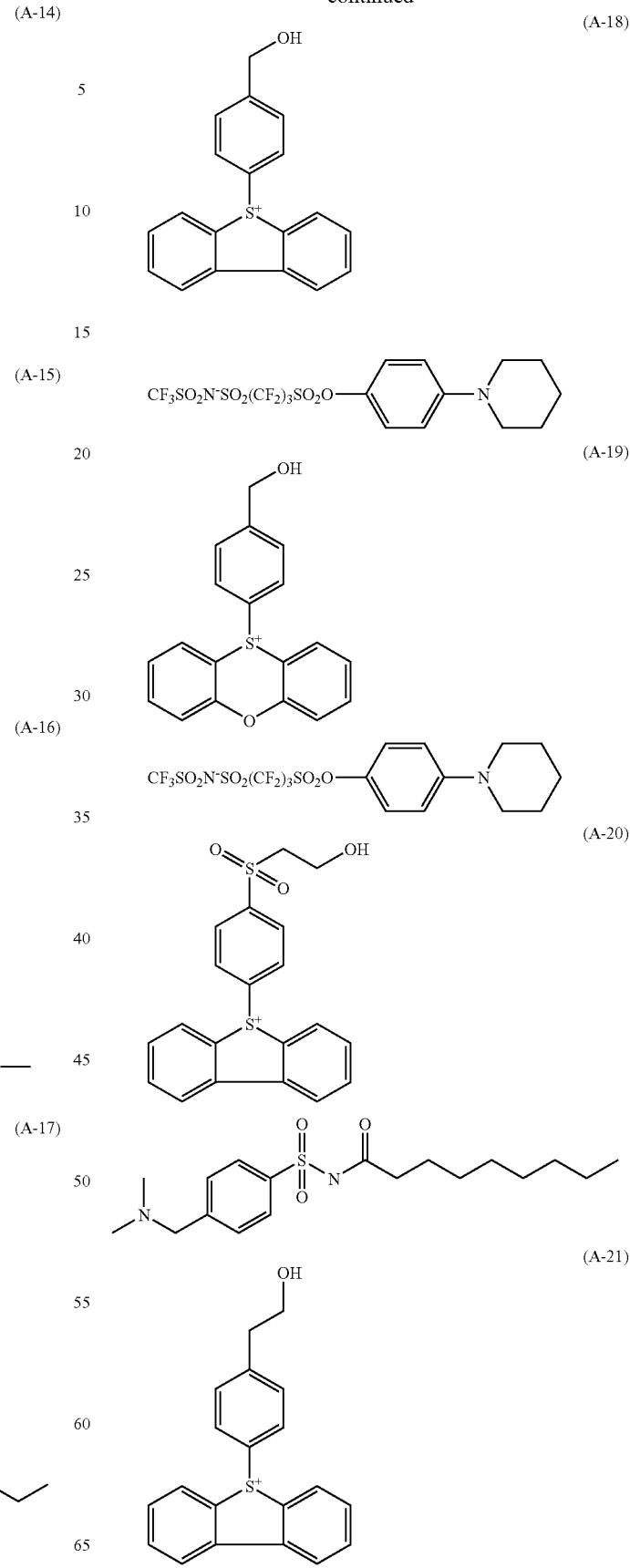

-continued
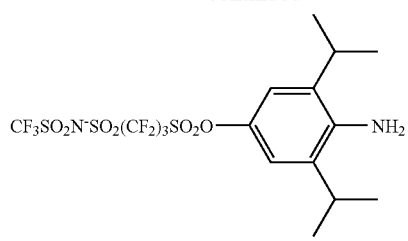
(A-22)
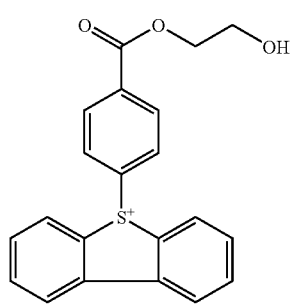
(A-23)
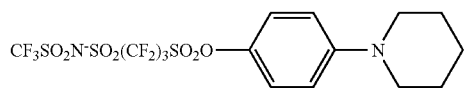
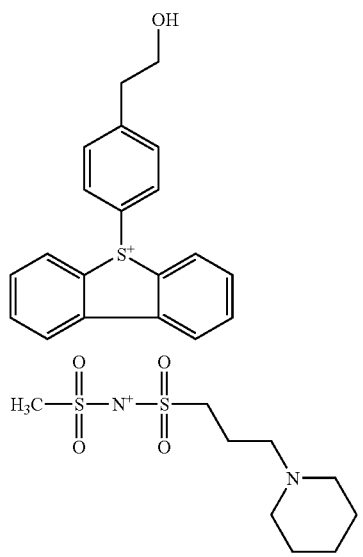
(A-24)
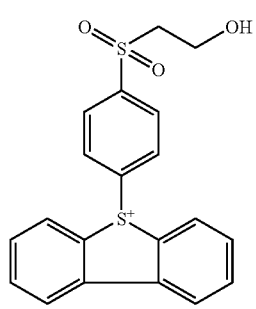
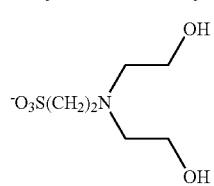
-continued
(A-25)
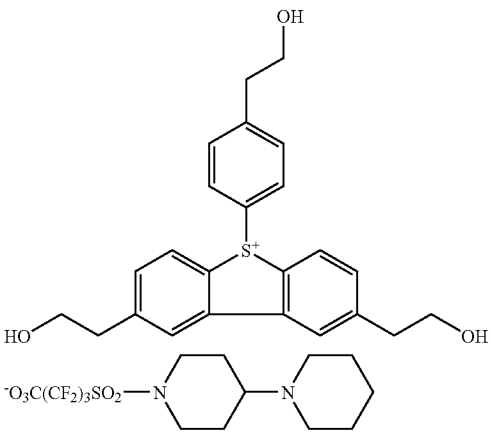
(A-26)
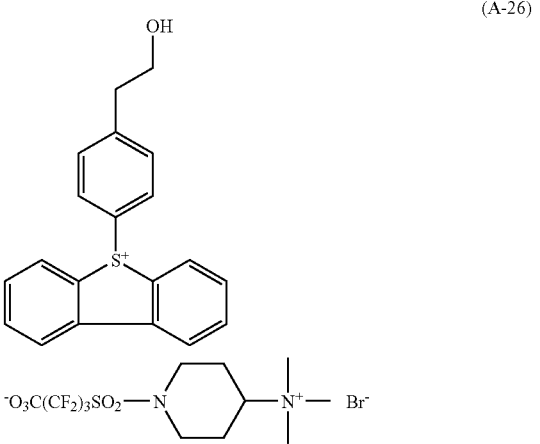
(A-27)
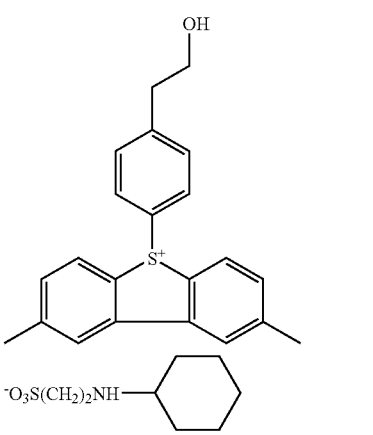
(A-28)
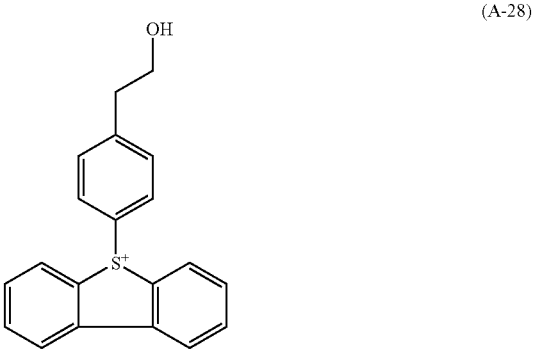

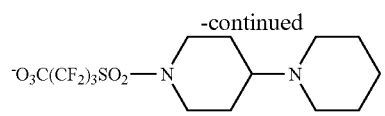
(A-29)

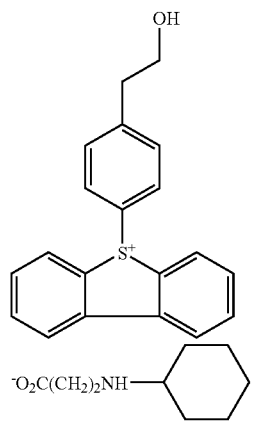
(A-30)

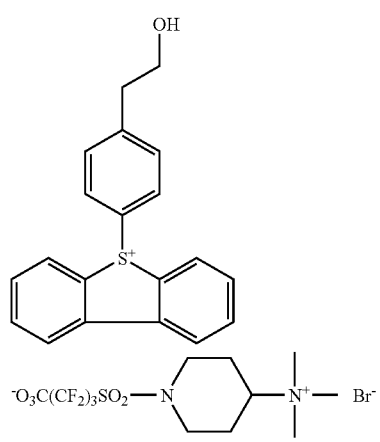

[2] Compound Capable of Generating an Acid Upon Irradiation with Actinic Ray or Radiation (Acid Generator):

A resist composition in the invention may use an acid generator in combination with the compound represented by formula (I).

As the acid generator, a photo-initiator for cationic photopolymerization, a photo-initiator for radical photopolymerization, photodecoloring agent for dyestuffs, a photodiscoloring agent, well-known compounds capable of generating an acid upon irradiation with actinic ray or radiation that are used in micro-resists and the like, and the mixtures of these compounds can be optionally selected and used.

For example, as the acid generator diazonium salt, phosphonium salt, sulfonium salt, iodonium salt, imidosulfonate, oximesulfonate, diazodisulfone, disulfone, and o-nitrobenzylsulfonate are exemplified.

Further, compounds obtained by introducing a group or a compound capable of generating an acid upon irradiation with actinic ray or radiation to the main chain or side chain of polymers, for example, the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853, JP-A-63-146029, etc, can be used.

The compounds generating an acid by the action of light as disclosed in U.S. Pat. No. 3,779,778, EP 126,712, etc, can also be used.

As preferred compounds among the compounds capable of generating an acid upon irradiation with actinic ray or radiation, compounds represented by any of the following formulae (ZI), (ZII) and (ZII) can be exemplified.

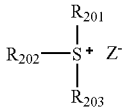
ZI

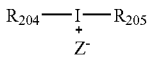
ZII

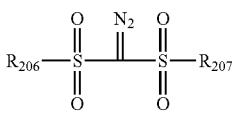
ZIII

In formula (ZI), each of $R_{201}$, $R_{202}$ and $R_{203}$ independently represents an organic group.

The number of carbon atoms of the organic groups represented by $R_{201}$, $R_{202}$ and $R_{203}$ is generally from 1 to 30, and preferably from 1 to 20.

Two of $R_{201}$, $R_{202}$ and $R_{203}$ may be bonded to each other to form a cyclic structure, and an oxygen atom, a sulfur atom, an ester bond, an amido bond or a carbonyl group may be contained in the ring. As the group formed by bonding two of $R_{201}$, $R_{202}$ and $R_{203}$, an alkylene group (e.g., a butylene group and a pentylene group) can be exemplified.

$Z^-$ represents a non-nucleophilic anion.

The examples of the non-nucleophilic anions represented by $Z^-$ include, e.g., a sulfonate anion, a carboxylate anion, a sulfonylimide anion, a bis(alkylsulfonyl)imide anion, and a tris(alkylsulfonyl)methyl anion.

A non-nucleophilic anion is an anion having extremely low ability of causing a nucleophilic reaction and capable of restraining the aging decomposition due to an intramolecular nucleophilic reaction, so that the aging stability of a resist can be improved with a non-nucleophilic anion. As sulfonate anions, e.g., an aliphatic sulfonate anion, an aromatic sulfonate anion and a camphor sulfonate anion are exemplified.

As the carboxylate anions, e.g., an aliphatic carboxylate anion, an aromatic carboxylate anion and an aralkylcarboxylate anion are exemplified.

The aliphatic moiety in the aliphatic sulfonate anion may be an alkyl group or a cycloalkyl group, preferably an alkyl group having from 1 to 30 carbon atoms and a cycloalkyl group having from 3 to 30 carbon atoms, e.g., a methyl group, an ethyl group, a propyl group, an isopropyl group, an n-butyl group, an isobutyl group, a sec-butyl group, a pentyl group, a neopentyl group, a hexyl group, a dodecyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbonyl group, and a boronyl group are exemplified.

The aromatic group in the aromatic sulfonate anion is preferably an aryl group having from 6 to 14 carbon atoms, e.g., a phenyl group, a tolyl group, and a naphthyl group are exemplified.

The alkyl group, cycloalkyl group and aryl group in the aliphatic sulfonate anion and aromatic sulfonate anion may each have a substituent. As the substituents of the alkyl group, cycloalkyl group and aryl group in the aliphatic sulfonate anion and aromatic sulfonate anion, e.g., a nitro group, a halogen atom (a fluorine atom, a chlorine atom, a bromine atom, and an iodine atom), a carboxyl group, a hydroxyl group, an amino group, a cyano group, an alkoxyl group (preferably having from 1 to 5 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms), and an alkoxycarbonyloxy group (preferably having from 2 to 7 carbon atoms) are exemplified. As for the aryl group and the cyclic structure of each group, an alkyl group (preferably having from 1 to 15 carbon atoms) can further be exemplified as the substituent.

As the aliphatic moiety in the aliphatic carboxylate anion, the same alkyl groups and cycloalkyl groups as in the aliphatic sulfonate anion can be exemplified.

As the aromatic group in the aromatic carboxylate anion, the same aryl groups as in the aromatic sulfonate anion can be exemplified.

As the aralkyl group in the aralkylcarboxylate anion, preferably an aralkyl group having from 6 to 12 carbon atoms, e.g., a benzyl group, a phenethyl group, a naphthylmethyl group, and a naphthylethyl group can be exemplified.

The alkyl group, cycloalkyl group, aryl group and aralkyl group in the aliphatic carboxylate anion, aromatic carboxylate anion and aralkylcarboxylate anion may have a substituent. As the substituents of the alkyl group, cycloalkyl group, aryl group and aralkyl group in the aliphatic carboxylate anion, aromatic carboxylate anion and aralkylcarboxylate anion, e.g., the same halogen atom, alkyl group, cycloalkyl group, alkoxyl group and alkylthio group as in the aromatic sulfonate anion can be exemplified.

As the sulfonylimide anion, e.g., a saccharin anion can be exemplified.

The alkyl group in the bis(alkylsulfonyl)imide anion and tris(alkylsulfonyl)-methyl anion is preferably an alkyl group having from 1 to 5 carbon atoms, e.g., a methyl group, an ethyl group, a propyl group, an isopropyl group, an n-butyl group, an isobutyl group, a sec-butyl group, a pentyl group, and a neopentyl group are exemplified. As the substituents of these alkyl groups, a halogen atom, an alkyl group substituted with a halogen atom, an alkoxyl group, and an alkylthio group can be exemplified, and an alkyl group substituted with a fluorine atom is preferred.

As other non-nucleophilic anions, e.g., fluorinated phosphorus, fluorinated boron and fluorinated antimony can be exemplified.

As the non-nucleophilic anions represented by $Z^-$, an aliphatic sulfonate anion in which the $\alpha$-position of the sulfonic acid is substituted with a fluorine atom, an aromatic sulfonate anion substituted with a fluorine atom or a group having a fluorine atom, a bis(alkylsulfonyl)imide anion having an alkyl group substituted with a fluorine atom, and a tris(alkylsulfonyl)methide anion having an alkyl group substituted with a fluorine atom are preferred. More preferred non-nucleophilic anions are an aliphatic perfluorosufonate anion having from 4 to 8 carbon atoms, and a benzenesulfonate anion having a fluorine atom, and still more preferred non-nucleophilic anions are a nonafluorobutanesulfonate anion, a perfluorooctanesulfonate anion, a pentafluoro-benzenesulfonate anion, and a 3,5-bis(trifluoromethyl)benzenesulfonate anion.

As the examples of the organic groups represented by $R_{201}$, $R_{202}$ and $R_{203}$, the corresponding groups in the later-described compounds represented by formula (ZI-1), (ZI-2) or (ZI-3) can be exemplified.

The compound represented by formula (ZI) may be a compound having a plurality of structures represented by formula (ZI). For instance, compound (ZI) may be a compound having a structure that at least one of $R_{201}$, $R_{202}$ and $R_{203}$ of a compound represented by formula (ZI) is bonded to at least one of $R_{201}$, $R_{202}$ and $R_{203}$ of another compound represented by formula (ZI).

The following compounds (ZI-1), (ZI-2) and (ZI-3) can be exemplified as more preferred components (ZI).

Compound (ZI-1) is an arylsulfonium compound that at least one of $R_{201}$ to $R_{203}$ in formula (ZI) represents an aryl group, i.e., a compound having arylsulfonium as a cation.

All of $R_{201}$ to $R_{203}$ of the arylsulfonium compound way be aryl groups, or a part of $R_{201}$ to $R_{203}$ may be an aryl group and the remainder may be an alkyl group or a cycloalkyl group.

As the arylsulfonium compounds, e.g., a triarylsulfonium compound, a diarylalkylsulfonium compound, an aryldialkylsulfonium compound, a diarylcycloalkylsulfonium compound, and an aryldicycloalkylsulfonium compound are exemplified.

As the aryl groups of the arylsulfonium compound, a phenyl group and a naphthyl group are preferred, and the more preferred group is a phenyl group. The aryl group may be an aryl group having a heterocyclic structure having an oxygen atom, a nitrogen atom or a sulfur atom. As the aryl group having a heterocyclic structure, e.g., a pyrrole residue (a group formed by eliminating one hydrogen atom from pyrrole), a furan residue (a group formed by eliminating one hydrogen atom from furan), a thiophene residue (a group formed by eliminating one hydrogen atom from thiophene), an indole residue (a group formed by eliminating one hydrogen atom from indole), a benzofuran residue (a group formed by eliminating one hydrogen atom from benzofuran), and a benzothiophene residue (a group formed by eliminating one hydrogen atom from benzothiophene) can be exemplified. When the arylsulfonium compound has two or more aryl groups, these two or more aryl groups may be the same or different.

As the alkyl group or the cycloalkyl group that the arylsulfonium compound has according to necessity, a straight chain or branched alkyl group having from 1 to 15 carbon atoms and a cycloalkyl group having from 3 to IS carbon atoms are preferred, e.g., a methyl group, an ethyl group, a propyl group, an n-butyl group, a sec-butyl group, a t-butyl group, a cyclopropyl group, a cyclobutyl group and a cyclohexyl group can be exemplified.

The aryl group, alkyl group and cycloalkyl group represented by $R_{201}$, $R_{202}$ and $R_{203}$ may have a substituent and, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and a straight chain, branched or cyclic alkoxyl group having from 1 to 12 carbon atoms, and the more preferred substituents are an alkyl group having from 1 to 4 carbon atoms and an alkoxyl group having from 1 to 4 carbon atoms. The substituent may be substituted on any one of three of $R_{201}$ to $R_{203}$, or may be substituted on all of the three. When $R_{201}$, $R_{202}$ and $R_{203}$ each represents an aryl group, it is preferred that the substituent be substituted on the p-position of the aryl group.

Compound (ZI-2) will be described below.

Compound (ZI-2) is a compound in the case where each of $R_{201}$, $R_{202}$ and $R_{203}$ in formula (ZI) independently represents an organic group not containing an aromatic ring. The aromatic ring here also includes aromatic rings containing a hetero atom.

The organic groups not containing an aromatic ring represented by $R_{201}$, to $R_{203}$ generally have from 1 to 30 carbon atoms, and preferably from 1 to 20 carbon atoms.

$R_{201}$, $R_{202}$ and $R_{203}$ each preferably represents an alkyl group, a cycloalkyl group, an alkyl group, or a vinyl group, more preferably a straight chain or branched 2-oxoalkyl group, a 2-oxocycloalkyl group or an alkoxycarbonylmethyl group, and especially preferably a straight or branched 2-oxoalkyl group.

The all group and cycloalkyl group represented by $R_{201}$ to $R_{203}$ are preferably a straight chain or branched alkyl group having from 1 to 10 carbon atoms (e.g., a methyl group, an ethyl group, a propyl group, a butyl group, and a pentyl group), and a cycloalkyl group having from 3 to 10 carbon atoms (e.g., a cyclopentyl group, a cyclohexyl group, and a norbonyl group). The alkyl group is more preferably a 2-oxoalkyl group or an alkoxycarbonylmethyl group. The cycloalkyl group is more preferably a 2-oxocycloalkyl group.

The 2-oxoalkyl group may be either straight chain or branched, and a group having >C=O on the 2-position of the above alkyl group can be exemplified as a preferred group.

The 2-oxocycloalkyl group is preferably a group having >C=O on the 2-position of the above cycloalkyl group.

As the alkoxyl group in the alkoxycarbonylmethyl group, preferably an alkoxyl group having from 1 to 5 carbon atoms (e.g., a methoxy group, an ethoxy group, a propoxy group, a butoxy group, and a pentoxy group) can be exemplified.

$R_{201}$ to $R_{203}$ may further be substituted with a halogen atom, an alkoxyl group (e.g., having from 1 to 5 carbon atoms), a hydroxyl group, a cyano group, or a nitro group.

Compound (ZI-3) is a compound represented by the following formula (ZI-3), which compound has a phenacylsulfonium salt structure.

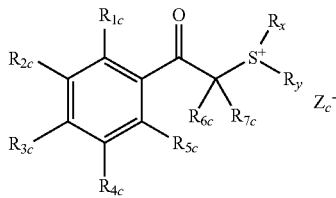

(ZI-3)

In formula (ZI-3), each of $R_{1c}$, $R_{2c}$, $R_{3c}$, $R_{4c}$ and $R_{5c}$ independently represents a hydrogen atom, an alkyl group, a cycloalkyl group, an alkoxyl group, or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an alkyl group, or a vinyl group.

Any two or more of $R_{1c}$ to $R_{5c}$, $R_{6c}$ and $R_{7c}$, and $R_x$, and $R_y$ may be bonded to each other to form cyclic structures respectively, and the cyclic structures may contain an oxygen atom, a sulfur atom, an ester bond, or an amido bond. As the groups formed by any two or more of $R_{1c}$ to $R_{5c}$, $R_{6c}$ and $R_{7c}$, and $R_x$ and $R_y$ by bonding, a butylene group, a pentylene group, etc., can be exemplified.

$Z_c^-$ represents a non-nucleophilic anion, and the same non-nucleophilic anions as represented by $Z^-$ in formula (ZI) can be exemplified.

The alkyl groups represented by $R_{1c}$ to $R_{7c}$ may be either straight chain or branched, e.g., an alkyl group having from 1 to 20 carbon atoms, preferably a straight chain or branched alkyl group having from 1 to 12 carbon atoms (e.g., a methyl group, an ethyl group, a straight chain or branched propyl group, a straight chain or branched butyl group, and a straight chain or branched pentyl group) can be exemplified. As the cycloalkyl groups represented by $R_{1c}$ to $R_{7c}$, a cycloalkyl group having from 3 to 8 carbon atoms (e.g., a cyclopentyl group and a cyclohexyl group) can be exemplified.

The alkoxyl groups represented by $R_{1c}$ to $R_{7c}$, may be any of straight chain, branched and cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group, a straight chain or branched pentoxy group), a cyclic alkoxyl group having from 3 to 8 carbon atoms (e.g., a cyclopentyloxy group, a cyclohexyloxy group) can be exemplified.

It is preferred that any of $R_{1c}$ to $R_{5c}$ represents a straight chain or branched alkyl group, a cycloalkyl group, or a straight chain, branched or cyclic alkoxyl group, it is more preferred that the sum total of the carbon atoms of $R_{1c}$ to $R_{5c}$ is from 2 to 15, by which the solubility in a solvent increases and generation of particles during preservation can be restrained.

As the alkyl group and cycloalkyl group represented by $R_x$ and $R_y$, the same alkyl groups and cycloalkyl groups represented by $R_{1c}$ to $R_{7c}$ can be exemplified, and a 2-oxoalkyl group, a 2-oxocycloalkyl group and an alkoxycarbonylmethyl group are more preferred.

As the 2-oxoalkyl group and the 2-oxocycloalkyl group, groups respectively having >O=O on the 2-position of the alkyl group and the cycloalkyl group represented by $R_{1c}$ to $R_{7c}$ can be exemplified.

As the alkoxyl group in the alkoxycarbonylmethyl group, the same alkoxyl groups as those represented by $R_{1c}$ to $R_{5c}$ can be exemplified.

Each of $R_x$ and $R_y$ preferably represents an alkyl group or a cycloalkyl group having 4 or more carbon atoms, more preferably 6 or more carbon atoms, and still more preferably an alkyl group or a cycloalkyl group having 8 or more carbon atoms.

In formulae (ZII) and (ZIII), each of $R_{204}$, $R_{205}$, $R_{206}$ and $R_{207}$ independently represents an aryl group, an alkyl group or a cycloalkyl group.

The aryl group represented by $R_{204}$ to $R_{207}$ is preferably a phenyl group or a naphthyl group, and more preferably a phenyl group. The aryl group represented by $R_{204}$ to $R_{207}$ may be an aryl group having a heterocyclic structure and having an oxygen atom, a nitrogen atom or a sulfur atom. As the aryl group having a heterocyclic structure, e.g., a pyrrole residue (a group formed by eliminating one hydrogen atom from pyrrole), a furan residue (a group formed by eliminating one hydrogen atom from furan), a thiophene residue (a group formed by eliminating one hydrogen atom from thiophene), an indole residue (a group formed by eliminating one hydrogen atom from indole), a benzofuran residue (a group formed by eliminating one hydrogen atom from benzofuran), and a benzothiophene residue (a group formed by eliminating one hydrogen atom from benzothiophene) can be exemplified.

The alkyl group and the cycloalkyl group represented by $R_{204}$ to $R_{207}$ are preferably a straight chain or branched alkyl group having from 1 to 10 carbon atoms (e.g., a methyl group, an ethyl group, a propyl group, a butyl group, a pentyl group), and a cycloalkyl group having from 3 to 10 carbon atoms (e.g., a cyclopentyl group, a cyclohexyl group, a norbonyl group).

The aryl group, alkyl group and cycloalkyl group represented by $R_{204}$ to $R_{207}$ may have a substituent. As the substituents that the aryl group, alkyl group and cycloalkyl group represented by $R_{204}$ to $R_{207}$ may have, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group, and a phenylthio group can be exemplified.

$Z^-$ represents a non-nucleophilic anion, and the same non-nucleophilic anions as those represented by $Z^-$ in formula (ZI) can be exemplified.

As the compounds capable of generating an acid upon irradiation with actinic ray or radiation usable in the invention, the compounds represented by the following formula (ZIV), (ZV) or (ZVI) can further be exemplified.

$$Ar_3\text{—}SO_2\text{—}SO_2\text{—}Ar_4 \quad \text{ZIV}$$

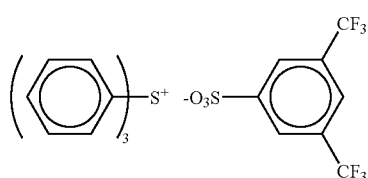

ZV

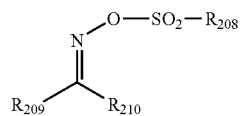

ZVI

In formulae (ZIV), (ZV) and (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Of the compounds capable of generating an acid upon irradiation with actinic ray or radiation, more preferred compounds are the compounds represented by formulae (ZI), (ZII) and (ZIII).

Further, as the compounds capable of generating an acid upon irradiation with an actinic ray or radiation, a compound capable of generating an acid having one sulfonic acid group or imido group is preferred, a compound capable of generating a monovalent perfluoroalkanesulfonic acid, a compound capable of generating an aromatic sulfonic acid substituted with a monovalent fluorine atom or a group containing a fluorine atom, and a compound capable of generating an imidic acid substituted with a monovalent fluorine atom or a group containing a fluorine atom are more preferred, and a sulfonium salt of a fluoride-substituted alkanesulfonic acid, a fluorine-substituted benzenesulfonic acid, or a fluorine-substituted imidic acid is still more preferred. The usable acid generators are especially preferably a fluoride-substituted alkanesulfonic acid, a fluoride-substituted benzenesulfonic acid, and a fluoride-substituted imidic acid each having pKa of generated acid of −1 or less are especially preferred, by which sensitivity is improved.

Of the compounds capable of generating an acid upon irradiation with actinic ray or radiation, especially preferred examples are shown below.

(z1)

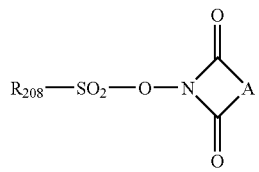

(z2)

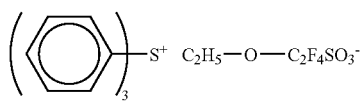

(z3)

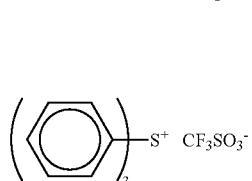

(z4)

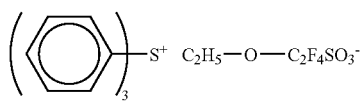

(z5)

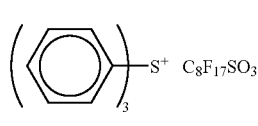

(z6)

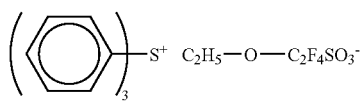

(z7)

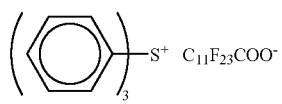

(z8)

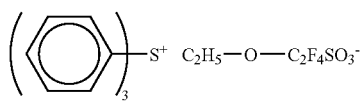

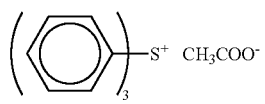
(z9)
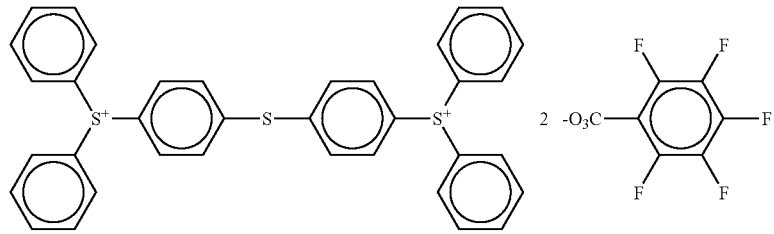
(z10)
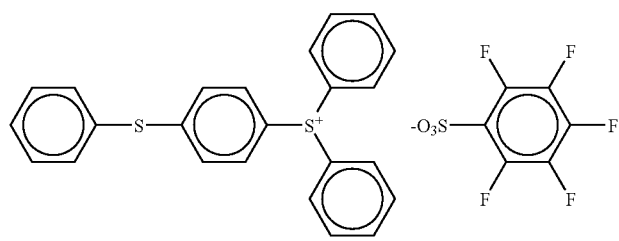
(z11)
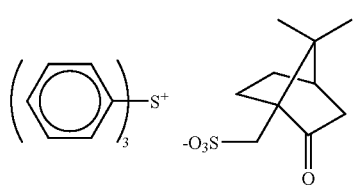
(z12)
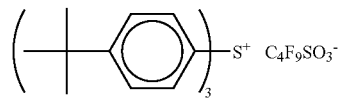
(z13)
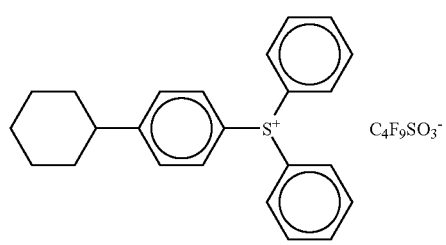
(z14)
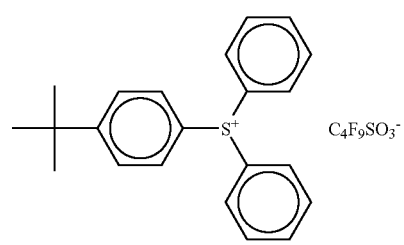
(z15)
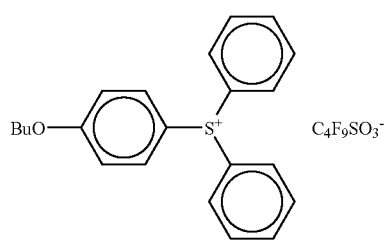
(z16)
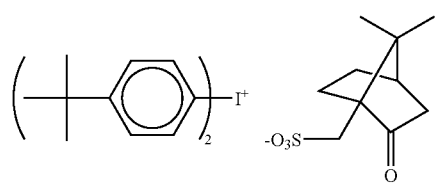
(z17)
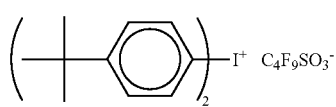
(z18)
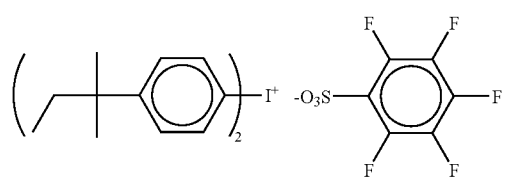
(z19)
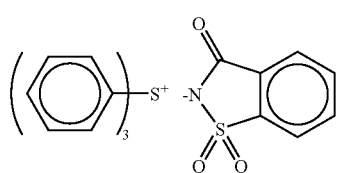
(z20)
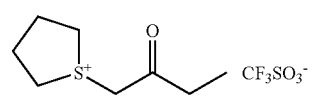
(z21)

-continued

-continued
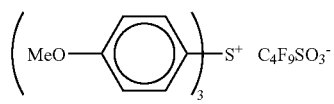 (z39)
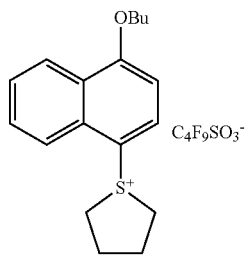 (z40)
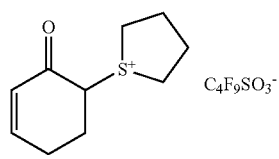 (z41)
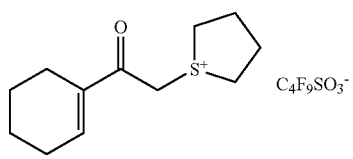 (z42)
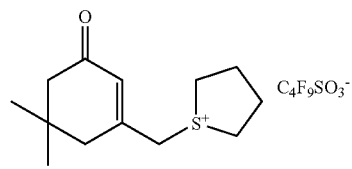 (z43)
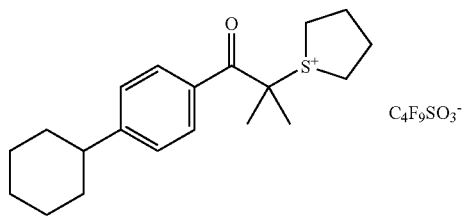 (z44)
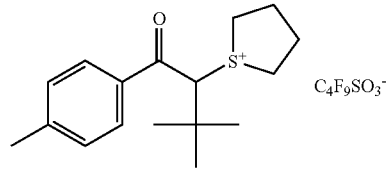 (z45)
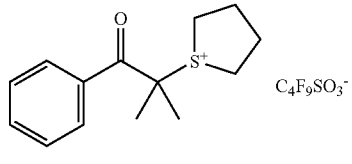 (z46)
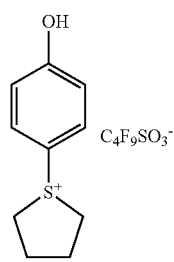 (z47)
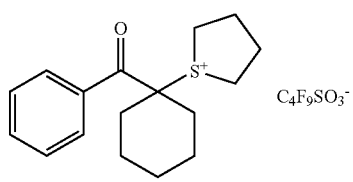 (z48)
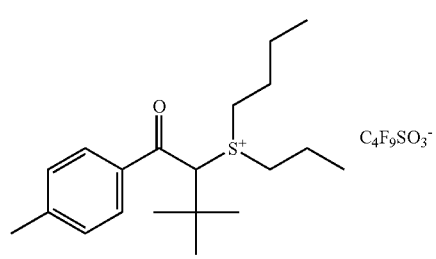 (z49)
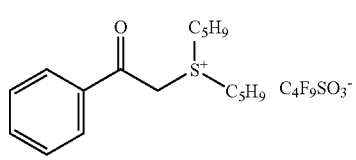 (z50)
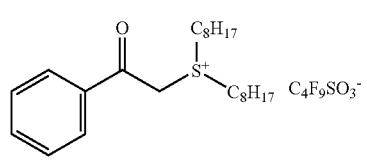 (z51)
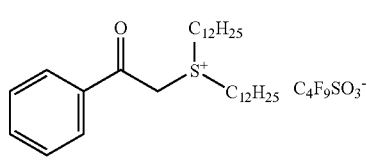 (z52)

-continued
(z53) 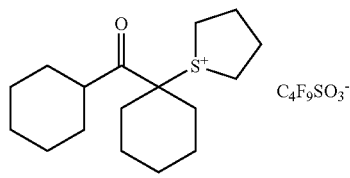
(z54) 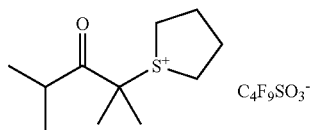
(z55) 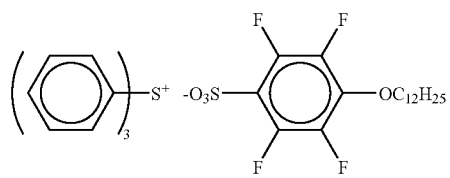
(z56) 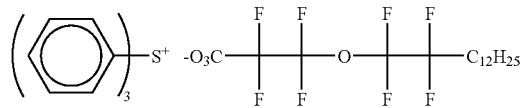
(z57) 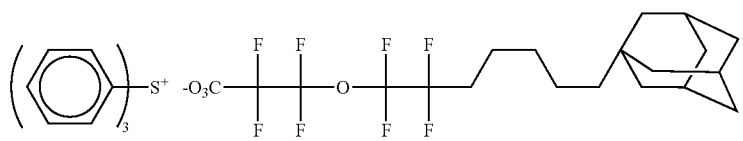
(z58) 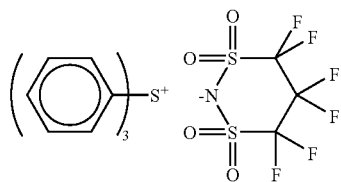
(z59) 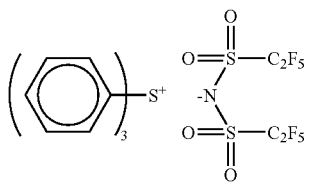
(z60) 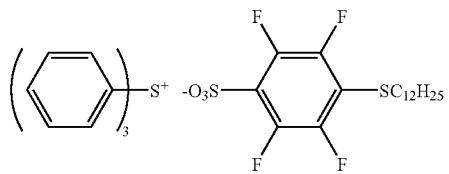
(z61) 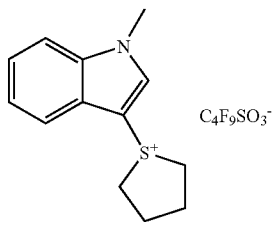
(z62) 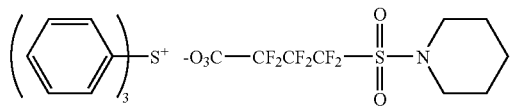
(z63) 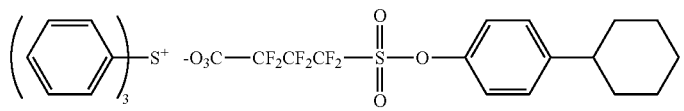
(z64) 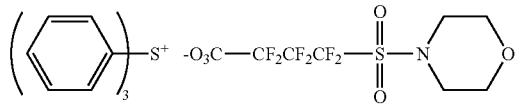
(z65) 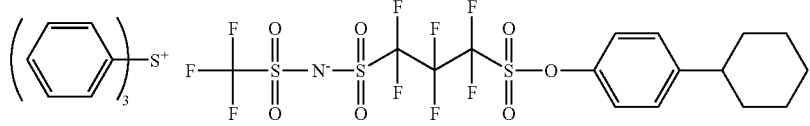

-continued

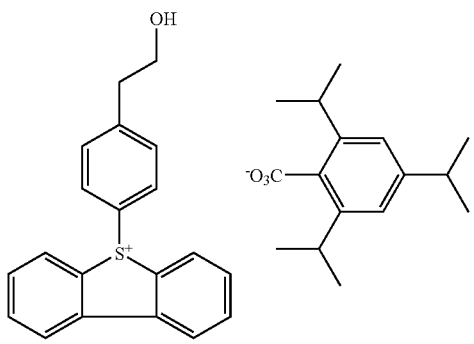 (z66)

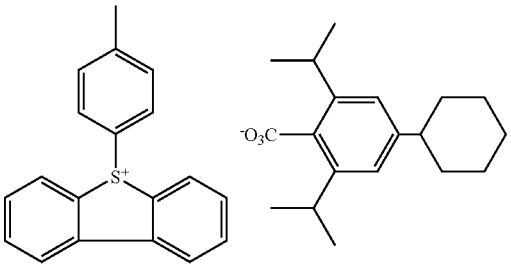 (z67)

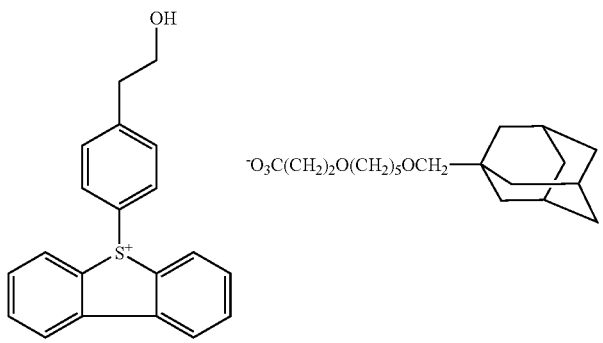 (z68)

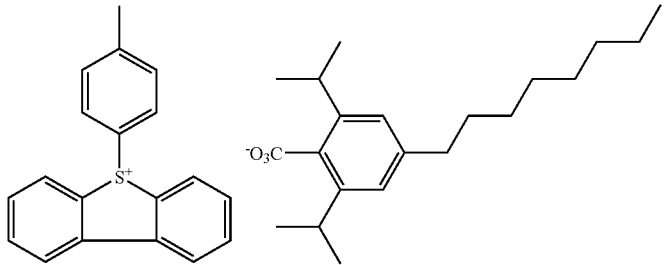 (z69)

The acid generator can also be used by one kind alone or two or more in combination.

The proportion of the acid generator is preferably 50 mass % or less to the compound represented by formula (I), and more preferably 30 mass % or less.

[3] Resin (B) Capable of Decomposing by the Action of an Acid to Increase Solubility in an Alkali Developing Solution:

A resin capable of decomposing by the action of an acid to increase solubility in an alkali developing solution for use in a resist composition in the invention is a resin having a group capable of decomposing by the action of an acid to generate an alkali-soluble group ("an acid-decomposable group") on the main chain or side chain of the resin, or on both the main chain and side chain. Of these resins, a resin having an acid-decomposable group on the side chain is more preferred.

A preferred acid-decomposable group is a group obtained by substituting the hydrogen atom of an alkali-soluble group such as a —COOH group or an —OH group with a group capable of separation by the action of an acid.

A preferred acid-decomposable group in the invention is an acetal group or a tertiary ester group.

The parent resin in the case where the acid-decomposable group is bonded as the side chain is an alkali-soluble resin having an —OH group or a —COOH group on the side chain. For example, the later-described alkali-soluble resins can be exemplified.

The alkali dissolution rate of such alkali-soluble resins is preferably 170 Å/sec or more when measured with 0.261N tetramethylammoniun hydroxide (TMAH) at 23° C., and especially preferably 330 Å/sec or more.

From this point of view, particularly preferred alkali-soluble resins are o-, m-, p-poly(hydroxystyrene) and copolymers thereof, hydrogenated poly(hydroxystyrene), halogen- or alkyl-substituted poly(hydroxystyrene), a partially O-alkylated or O-acylated product of poly(hydroxystyrene), styrene-hydroxystyrene copolymers, α-methylstyrene-hydroxystyrene copolymers, alkali-soluble resins having a hydroxystyrene structural unit such as hydrogenated novolak resins, (meth)acrylic acid, and alkali-soluble resins containing a repeating unit having a carboxyl group such as norbornenecarboxylic acid.

As repeating units having a preferred acid-decomposable group, for example, t-butoxycarbonyloxystyrene, 1-alkoxyethoxystyrene, and (meth)acrylic acid tertiary alkyl ester are exemplified, and 2-alkyl-2-adamantyl (meth)acrylate and dialkyl-(1-adamantyl)methyl (meth)acrylate are more preferred.

Components (B) for use in the invention can be obtained, as disclosed in EP 254,853, JP-A-2-25850, JP-A-3-223860 and JP-A-4-251259, by reacting an alkali-soluble resin with the precursor of an acid-decomposable group, or copolymerizing an alkali-soluble resin monomer to which an acid-decomposable group is bonded with various monomers.

When the resist composition of the invention is irradiated with KrF excimer laser beams, electron beams, X-rays, or high energy rays of wavelength of 50 nm or lower (e.g., EUV), it is preferred for a resin of component (B) to contain a repeating unit having an aromatic group, in particular, it is preferred to be resin (B1) having a hydroxystyrene repeating unit, more preferably a copolymer of hydroxystyrene/hydroxystyrene protected with an acid-decomposable group, or hydroxystyrene/(meth)acrylic acid tertiary alkyl ester.

The specific examples of resin (B1) are shown below, but the invention is not restricted thereto.

(R-1)
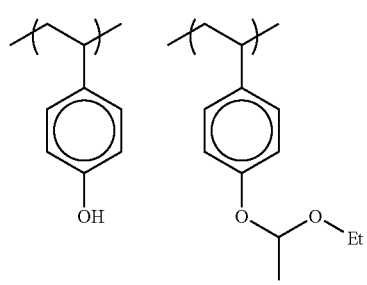

(R-2)
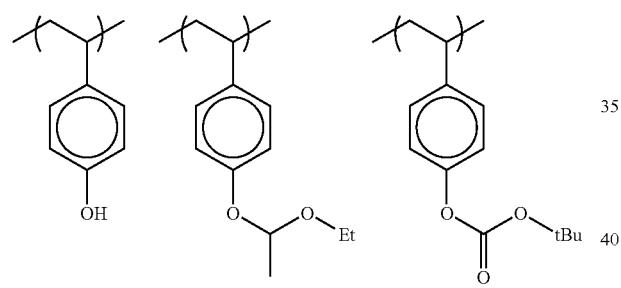

(R-3)
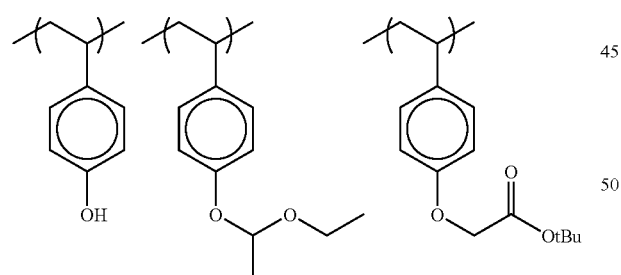

(R-4)
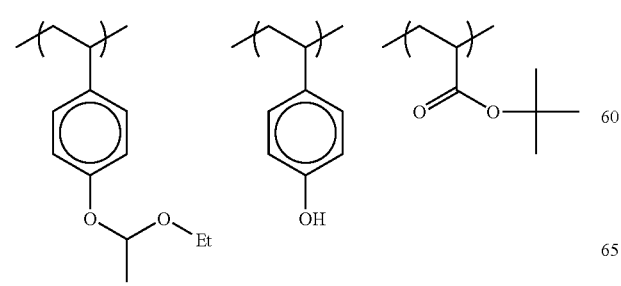

(R-5)
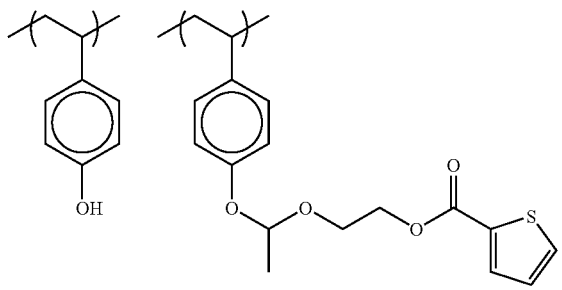

(R-6)
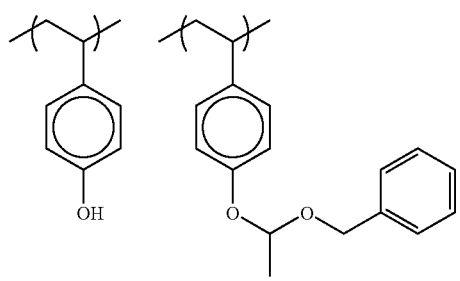

(R-7)

(R-8)
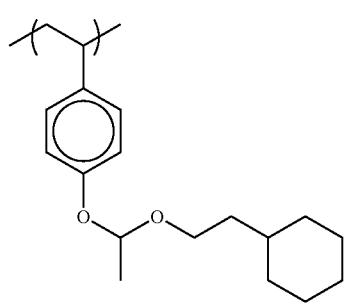

(R-9)
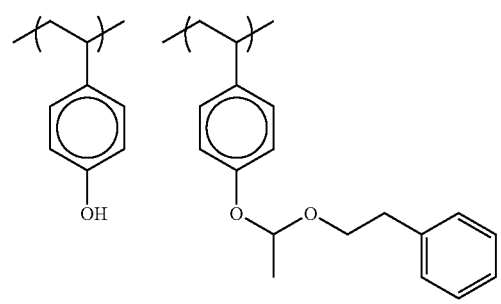
(R-10)
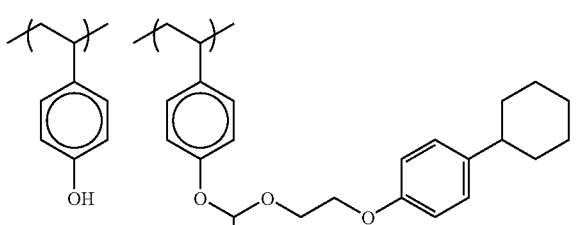
(R-11)
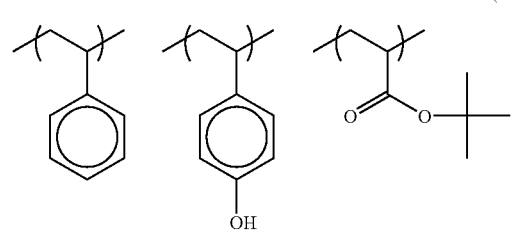
(R-12)
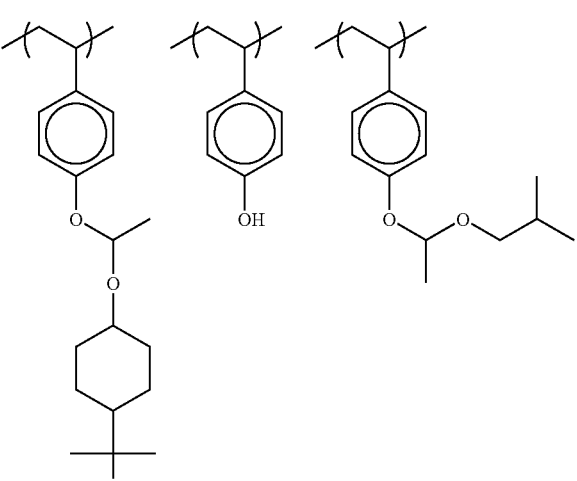
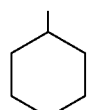
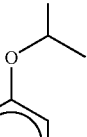
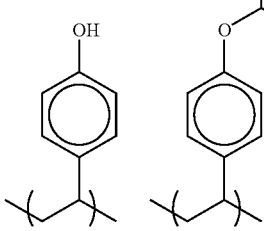
(R-13)
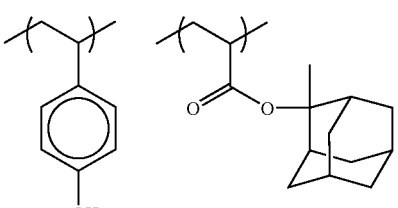
(R-14)
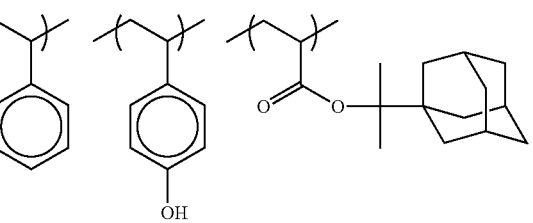
(R-15)
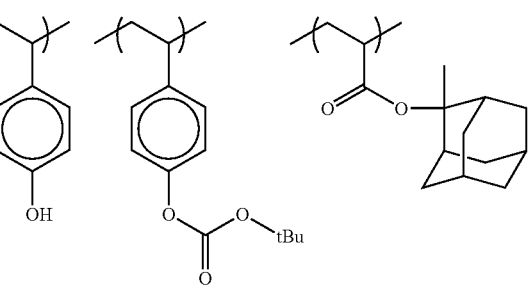
(R-16)
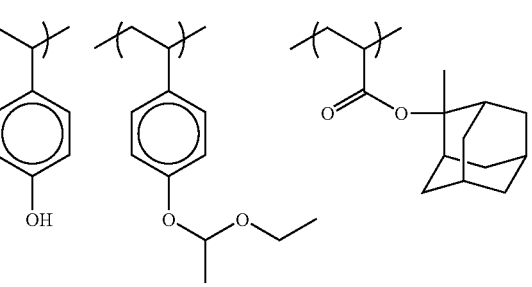

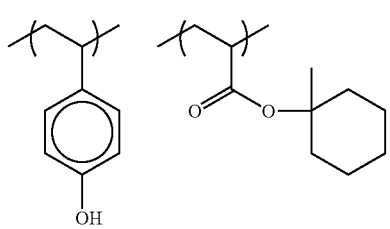

(R-17)

In the above specific examples, tBu represents a t-butyl group.

The content of an acid-decomposable group is expressed by B/(B+S), taking the number of the acid-decomposable groups in a resin as "B", and the number of alkali-soluble groups not protected with groups separating by the action of an acid as "S". The content is preferably from 0.01 to 0.7, more preferably from 0.05 to 0.50, and still more preferably from 0.05 to 0.40.

As resin (B1) containing a hydroxystyrene repeating unit, resins containing a repeating unit represented by the following formula (B1-II) and a repeating unit represented by the following formula (B1-III) are especially preferred.

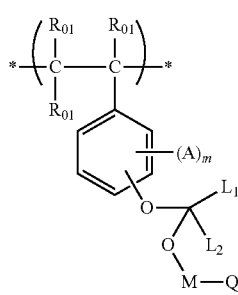

(B1-II)

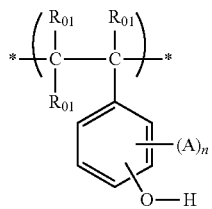

(B1-III)

In formulae (B1-II) and (B1-III), $R_{01}$ represents a hydrogen atom, an alkyl group, a cycloalkyl group, a halogen atom, a cyano group, or an alkoxycarbonyl group.

$L_1$ and $L_2$, which may be the same or different, each represents a hydrogen atom, an alkyl group, a cycloalkyl group, or an aralkyl group.

M represents a single bond or a divalent linking group.

Q represents an alkyl group, a cycloalkyl group, or an alicyclic group or an aromatic ring group that may contain a hetero atom.

At least two of Q, M and $L_1$ may be bonded to each other to form a 5- or 6-membered ring.

A represents a halogen atom, a cyano group, an acyl group, an alkyl group, an alkoxyl group, an acyloxy group, or an alkoxycarbonyl group.

Each of m and n independently represents an integer of from 1 to 4. It is preferable that m and n do not represent 0 at the same time.

Resin (B1) containing a hydroxystyrene repeating unit may be a resin having a repeating unit represented by formula (B1-II), a repeating unit represented by formula (B1-III), and a repeating unit represented by formula (B1-IV). In this case, both of m and n may be 0 at the same time.

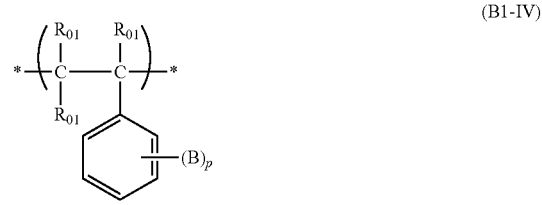

(B1-IV)

In formula (B1-IV), $R_{01}$ represents a hydrogen atom, an alkyl group, a cycloalkyl group, a halogen atom, a cyano group, or an alkoxycarbonyl group.

B represents a halogen atom, a cyano group, an acyl group, an alkyl group, an alkoxyl group, an acyloxy group, or an alkoxycarbonyl group.

p represents an integer of from 0 to 5.

The substituent of the benzene ring in the repeating unit represented by formula (B1-II) is a group capable of decomposing by the action of an acid to generate a hydroxyl group (an alkali-soluble group) (an acid-decomposable group), which is decomposed by the action of an acid to generate a hydroxystyrene unit, and makes the resin capable of increasing the solubility in an alkali developing solution.

$R_{01}$ represents a hydrogen atom, an alkyl group, a cycloalkyl group, a halogen atom, a cyano group, or an alkoxycarbonyl group, and carbon atom number is preferably 20 or less.

The alkyl group or the cycloalkyl group represented by $R_{01}$ preferably has 20 or less carbon atom, e.g., a methyl group, an ethyl group, a propyl group, an isopropyl group, an n-butyl group, an isobutyl group, a t-butyl group, a pentyl group, a cyclo-pentyl group, a hexyl group, a cyclohexyl group, an octyl group, and a dodecyl group are exemplified. These groups may each have a substituent, e.g., an alkoxyl group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as a pyrrolidone residue are exemplified as the substituents, and these groups preferably have 8 or less carbon atoms. A $CF_3$ group, an alkoxycarbonylmethyl group, an alkylcarbonyloxymethyl group, a hydroxymethyl group, and an alkoxymethyl group are more preferred.

As the halogen atom represented by $R_{01}$, a fluorine atom, a chlorine atom, a bromine atom and an iodine atom are exemplified, and a fluorine atom is preferred.

As the alkyl group contained in the alkoxycarbonyl group represented by $R_{01}$, the same alkyl groups as those represented by $R_{01}$ are preferably exemplified.

The alkyl group represented by $L_1$ and $L_2$ is, e.g., an alkyl group having from 1 to 8 carbon atoms, and specifically a methyl group, an ethyl group, a propyl group, an n-butyl group, a sec-butyl group, a hexyl group, and an octyl group are preferably exemplified.

The cycloalkyl group represented by $L_1$ and $L_2$ is, e.g., a cycloalkyl group having from 3 to 15 carbon atoms, and specifically a cyclopentyl group, a cyclohexyl group, a norbornyl group, and an adamantyl group are preferably exemplified.

The aryl group represented by $L_1$ and $L_2$ is, e.g., an aryl group having from 6 to 15 carbon atoms, and specifically a phenyl group, a tolyl group, a naphthyl group, and an anthryl group are preferably exemplified.

The aralkyl group represented by $L_1$ and $L_2$ is, e.g., an aralkyl group having from 6 to 20 carbon atoms, and a benzyl group and a phenethyl group are exemplified.

The divalent linking group represented by M is, e.g., an alkylene group, a cycloalkylene group, an alkenylene group, an arylene group, —OCO—, —COO—, —CON($R_0$)—, and a linking group containing a plurality of these groups. $R_0$ represents a hydrogen atom or an alkyl group.

The alkyl group and the cycloalkyl group represented by Q are the same as the alkyl group and the cycloalkyl group represented by $L_1$ and $L_2$.

As the alicyclic group or the aromatic ring group that may contain a hetero atom represented by Q, the cycloalkyl group and the aryl group represented by $L_1$ and $L_2$ are exemplified, and they preferably have from 3 to 15 carbon atoms.

As the alicyclic group or the aromatic ring group containing a hetero atom, thiirane, tetrahydrothiophene, thiophene, furan, pyrrole, benzothiophene, benzofuran, benzopyrrole, triazine, imidazole, benzimidazole, triazole, thiadiazole, thiazole and pyrrolidone are exemplified. However, the alicyclic group or the aromatic ring group containing a hetero atom are not restricted to these compounds, so long as they have a structure generally called a heterocyclic ring (a ring formed by carbon atoms and hetero atoms, or a ring formed by hetero atoms).

As the 5- or 6-membered ring formed by at least two of Q, M and $L_1$, a case where at least two of Q, M and $L_1$ are bonded to each other to form, e.g., a propylene group or a butylene group, and a 5- or 6-membered ring containing an oxygen atom is formed is exemplified.

The group represented by -M-Q preferably has from 1 to 30 carbon atoms, and more preferably from 5 to 20 carbon atoms, and as the group represented by —OC($L_1$)($L_2$)O-M-Q, the following groups are exemplified.

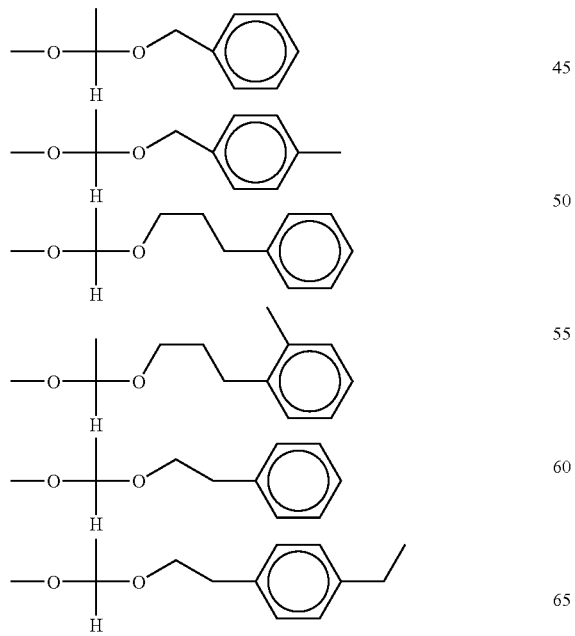

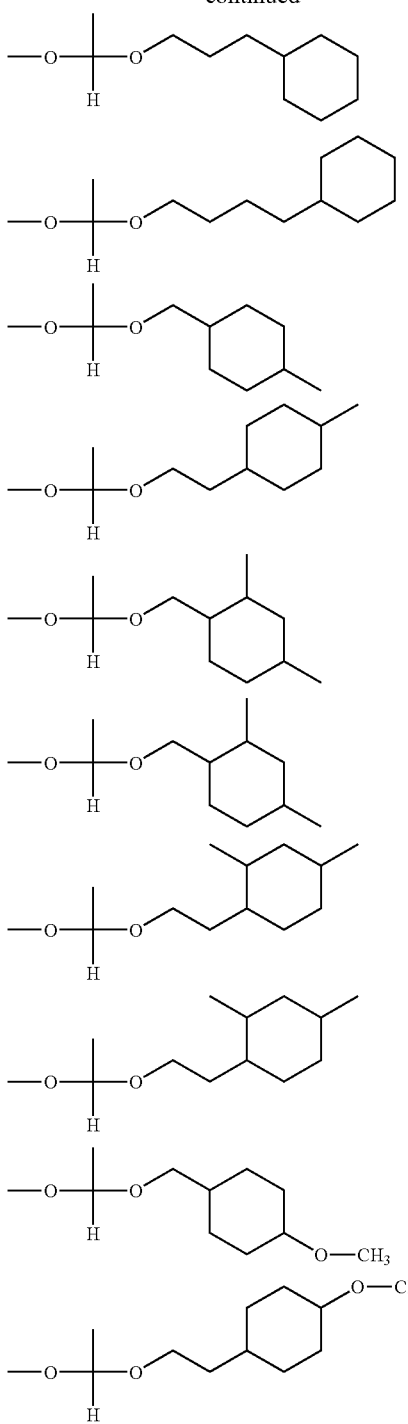

The acyl group represented by A is, e.g., an acyl group having from 2 to 8 carbon atoms, and specifically a formyl group, an acetyl group, a propanoyl group, a butanoyl group, a pivaloyl group, and a benzoyl group are preferably exemplified.

The alkyl group represented by A is, e.g., an alkyl group having from 1 to 8 carbon atoms, and specifically a methyl group, an ethyl group, a propyl group, an n-butyl group, a sec-butyl group, a hexyl group, and an octyl group can be preferably exemplified.

The alkoxyl group represented by A is, e.g., an alkoxyl group having from 1 to 8 carbon atoms, and a methoxy group, an ethoxy group, a propoxy group, a butoxy group, a pentyloxy group, a hexyloxy group, and a cyclohexyloxy group can be exemplified.

As the acyloxy group or an alkoxycarbonyl group represented by A, the groups corresponding to the above acyl group and alkoxyl group can be exemplified.

Of these groups, an alkoxyl group, an alkoxycarbonyl group and an acyloxy group are more preferred.

Each of the above groups may have a substituent, and as the examples of preferred substituents, a hydroxyl group, a carboxyl group, a halogen atom (e.g., a fluorine atom, a chlorine atom, a bromine atom and an iodine atom), an alkoxyl group (e.g., a methoxy group, an ethoxy group, a propoxy group, and a butoxy group) can be exemplified. In connection with the cyclic structure, an alkoxyl group (preferably having from 1 to 8 carbon atoms) can further be exemplified as a substituent.

Each of m and n independently represents an integer of from 0 to 4, preferably from 0 to 2, and more preferably 1.

The specific examples of the repeating units represented by formula (B1-II) are shown below, but the invention is not restricted thereto.

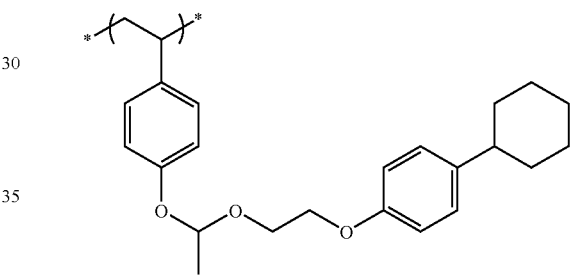

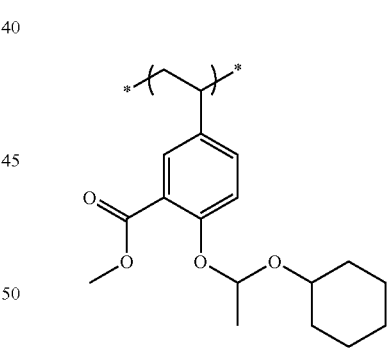

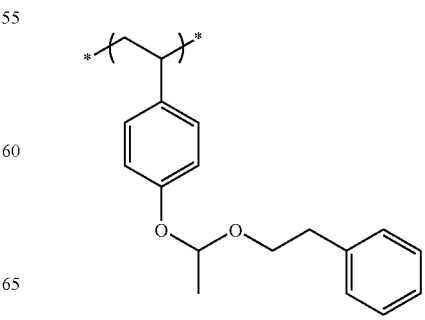

-continued
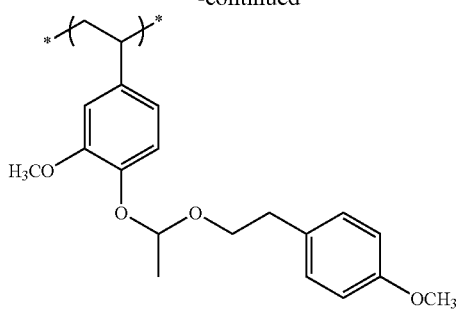
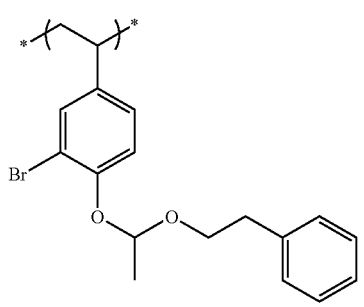
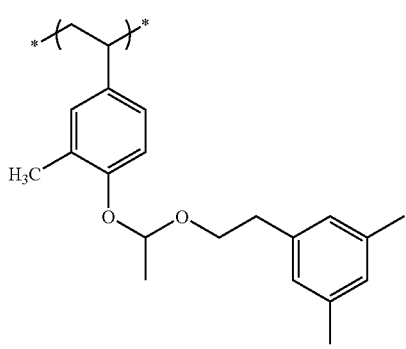
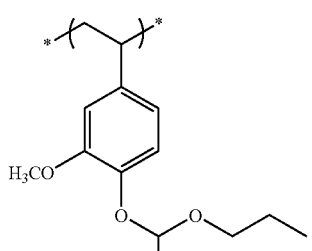
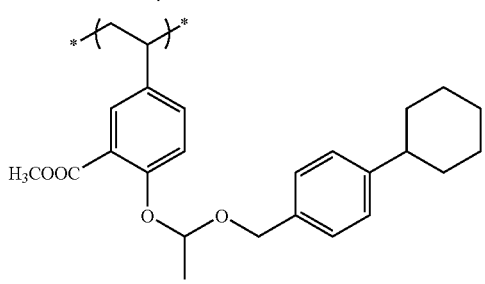
-continued
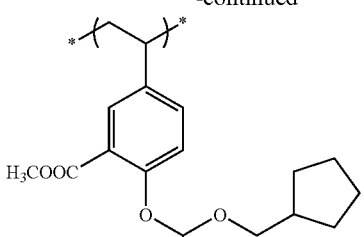
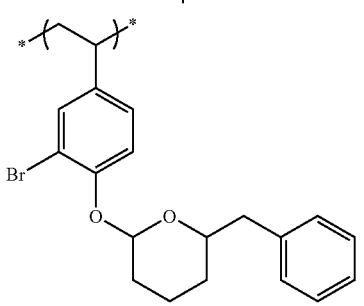
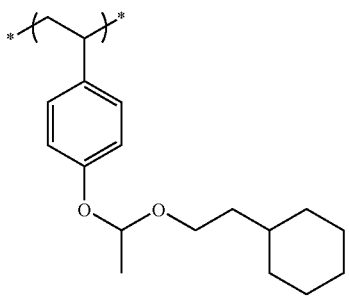
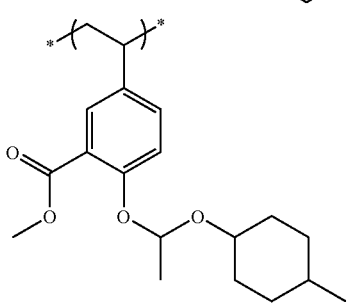
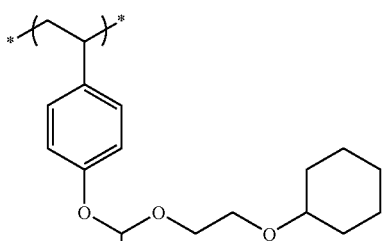
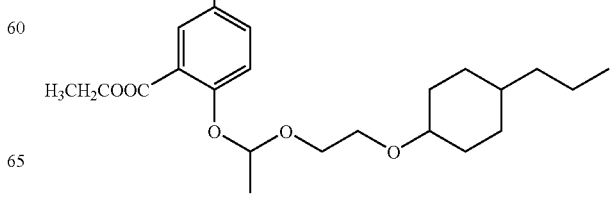

51
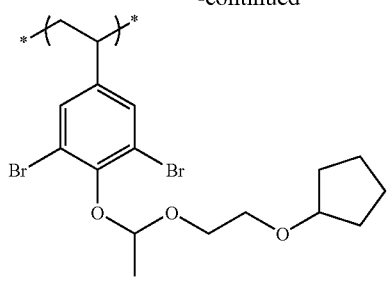
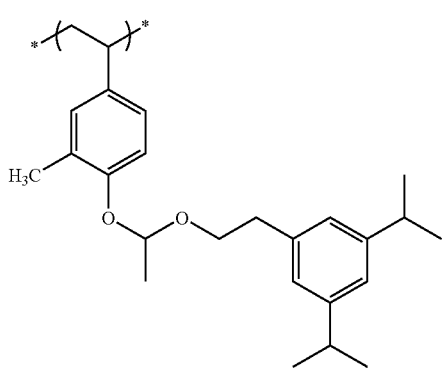
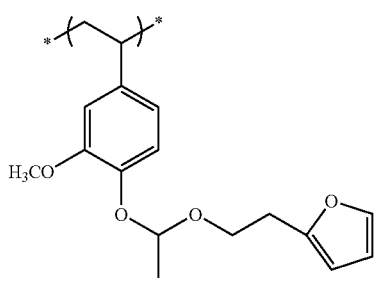
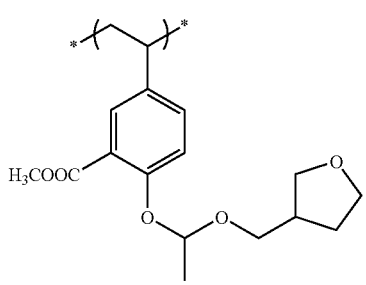
52
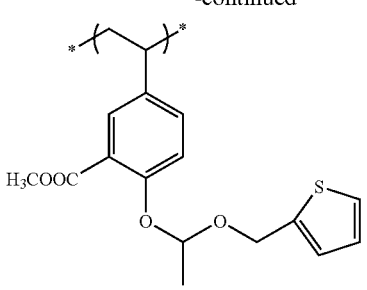
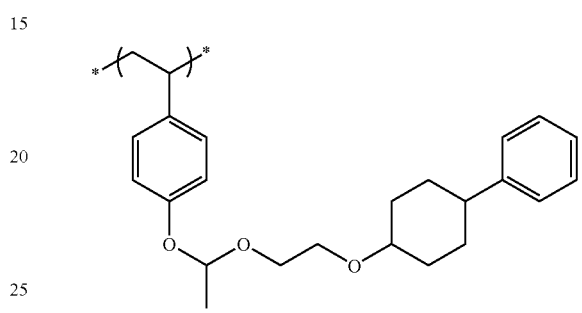
The specific examples of the repeating units represented by formula (B1-III) are shown below, but the invention is not restricted thereto.
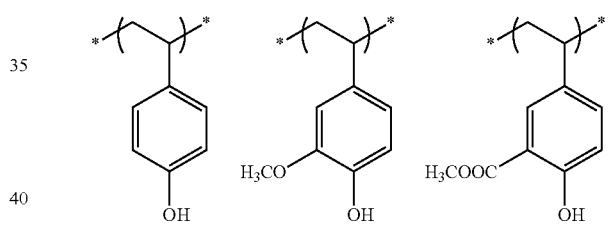
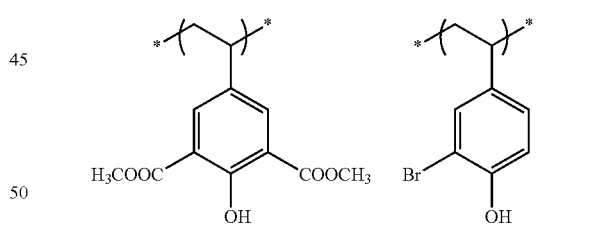
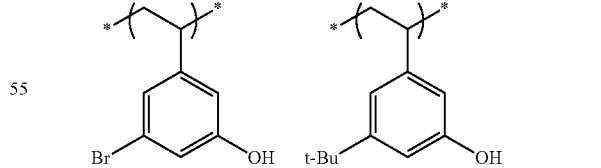
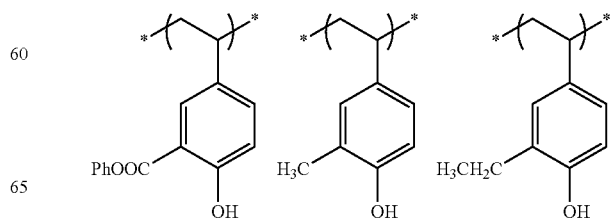

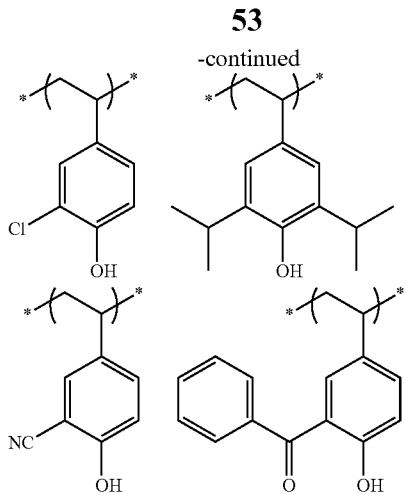

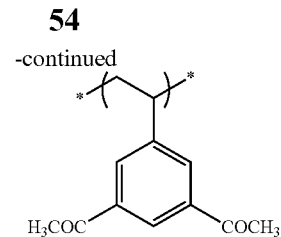

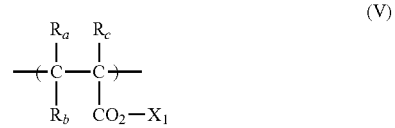

Resin (B) may have a repeating unit represented by the following formula (V).

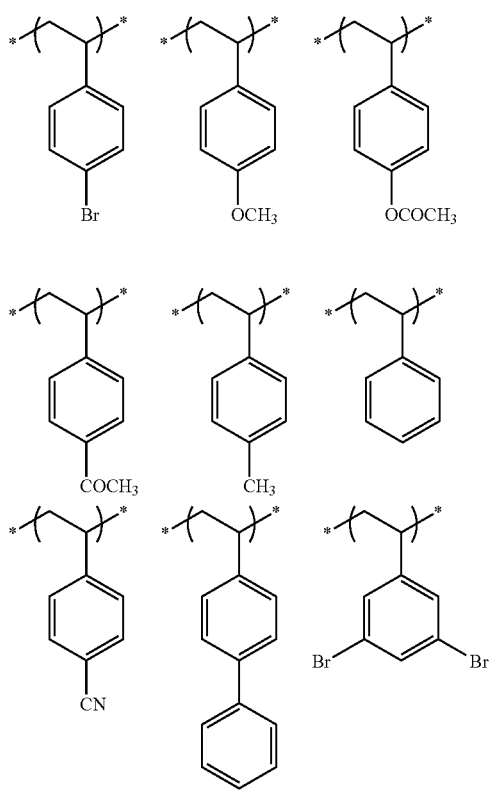

$R_{01}$ in formula (B1-IV) represents a hydrogen atom, an alkyl group, a cycloalkyl group, a halogen atom, a cyano group or an alkoxycarbonyl group, and preferably has 20 or less carbon atones. $R_{01}$ in formula (B1-IV) has the same meaning as $R_{01}$ in formula (B1-II) or (B1-III).

The acyl group, alkyl group, alkoxy group, acyloxy group or alkoxycarbonyl group represented by B in formula (B1-IV) has the same meaning as each group represented by A in formula (B1-II).

p represents an integer of from 1 to 5, preferably from 0 to 2, and more preferably 1.

The specific examples of the repeating units represented by formula (B1-IV) are shown below, but the invention is not restricted thereto.

In formula (V), each of $R_a$, $R_b$ and $R_c$ independently represents a hydrogen atom, a fluorine atom, a chlorine atom, a cyano group or an alkyl group.

$X_1$ represents a hydrogen atom or an organic group.

The alkyl group represented by $R_a$ to $R_c$ is preferably an alkyl group having from 1 to 5 carbon atoms, e.g., a methyl group, an ethyl group and a propyl group can be exemplified.

The organic group represented by $X_1$ preferably has from 1 to 40 carbon atoms, which may be an acid-decomposable group or a non-acid-decomposable group.

When $X_1$ is a non-acid-decomposable group, an alkyl group, a cycloalkyl group and an aryl group are exemplified as the non-acid-decomposable group. However, the alkyl group and the cycloalkyl group corresponding to the structures of the later-described formula (pI) to (pVI) are excluded. The alkyl group preferably has from 1 to 10 carbon atoms, and more preferably from 1 to 6 carbon atoms. The cycloalkyl group preferably has from 3 to 12 carbon atoms, and more preferably from 6 to 10 carbon atoms. The cycloalkyl group may be monocyclic or polycyclic. The aryl group preferably has from 6 to 10 carbon atoms. Each of these substituents may further have a substituent.

As the alkyl group in the non-acid-decomposable group, an alkyl group having from 1 to 4 carbon atoms, e.g., a methyl group, an ethyl group, a propyl group, an n-butyl group, and a sec-butyl group are preferred. As the cycloalkyl group, a cycloalkyl group having from 3 to 10 carbon atoms, e.g., a cyclopropyl group, a cyclobutyl group, a cyclohexyl group, and an adamantyl group are preferred. As the aryl group, an aryl group having from 6 to 14 carbon atoms, e.g., a phenyl group, a xylyl group, a toluoyl group, a cumenyl group, a naphthyl group, and an anthracenyl group are preferred.

As the organic group of the acid-decomposable groups represented by $X_1$, e.g., $-C(R_{11a})(R_{12a})(R_{13a})$, $-C(R_{14a})(R_{15a})(OR_{16a})$, and $-CO-OC(R_{11a})(R_{12a})(R_{13a})$ can be exemplified.

Each of $R_{11a}$ to $R_{13a}$ independently represents an alkyl group, a cycloalkyl group, an alkenyl group, an aralkyl group or an aryl group. Each of $R_{14a}$ and $R_{15a}$ independently represents a hydrogen atom or an alkyl group. $R_{16a}$ represents an alkyl group, a cycloalkyl group, an alkenyl group, an aralkyl group or an aryl group. Further, two of $R_{11a}$, $R_{12a}$ and $R_{13a}$, or two of $R_{14a}$, $R_{15a}$ and $R_{16a}$ may be bonded to each other to form a ring.

A group having an acid-decomposable group can also be introduced into $X_1$ by modification. $X_1$ to which an acid-decomposable group is introduced is, for example, as follows.

$-[C(R_{17a})(R_{18a})]_p-CO-OC(R_{11a})(R_{12a})(R_{13a})$, wherein each of $R_{17a}$ and $R_{18a}$ independently represents a hydrogen atom or an alkyl group; and p represents an integer of from 1 to 4.

The organic group represented by $X_1$ is preferably an acid-decomposable group having at least one cyclic structure selected from an alicyclic structure, an aromatic structure, and a bridged alicyclic structure, a structure containing an aromatic group (in particular, a phenyl group), or a structure containing an alicyclic or bridged alicyclic structure represented by any of the following formulae (pI) to (pVI).

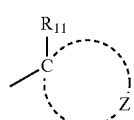 (pI)

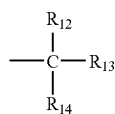 (pII)

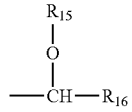 (pIII)

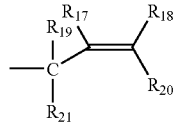 (pIV)

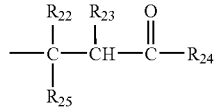 (pV)

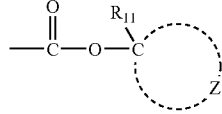 (pVI)

In formulae (pI) to (pVI), $R_{11}$ represents a methyl group, an ethyl group, an n-propyl group, an isopropyl group, an n-butyl group, an isobutyl group, or a sec-butyl group; and Z represents an atomic group necessary to form an alicyclic hydrocarbon group together with a carbon atom.

Each of $R_{12}$, $R_{13}$, $R_{14}$, $R_{15}$ and $R_{16}$ independently represents a straight chain or branched alkyl group having from 1 to 4 carbon atoms, or an alicyclic hydrocarbon group, provided that at least one of $R_{12}$ to $R_{14}$, or either $R_{15}$ or $R_{16}$ represents an alicyclic hydrocarbon group.

Each of $R_{17}$, $R_{18}$, $R_{19}$, $R_{20}$ and $R_{21}$ independently represents a hydrogen atom, a straight chain or branched alkyl group having from 1 to 4 carbon atoms, or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms, or an alicyclic hydrocarbon group.

Each of $R_{22}$, $R_{23}$, $R_{24}$ and $R_{25}$ independently represents a hydrogen atom, a straight chain or branched alkyl group having from 1 to 4 carbon atoms, or an alicyclic hydrocarbon group, provided that at least one of $R_{22}$ to $R_{25}$ represents an alicyclic hydrocarbon group, and $R_{23}$ and $R_{24}$ may be bonded to each other to form a ring.

In formulae (pI) to (pVI), the alkyl group represented by $R_{12}$ to $R_{25}$ is a straight chain or branched alkyl group having from 1 to 4 carbon atoms which may be substituted or unsubstituted, e.g., a methyl group, an ethyl group, an n-propyl group, an isopropyl group, an n-butyl group, an isobutyl group, a sec-butyl group, and a t-butyl group are exemplified.

As the examples of further substituents of the alkyl group, an alkoxyl group having from 1 to 4 carbon atoms, a halogen atom (a fluorine atom, a chlorine ion, a bromine ion, an iodine ion), an acyl group, an acyloxy group, a cyano group, a hydroxyl group, a carboxyl group, an alkoxycarbonyl group, and a nitro group can be exemplified.

The alicyclic hydrocarbon groups represented by $R_{11}$ to $R_{25}$ or the alicyclic hydrocarbon group formed by Z together with carbon atoms may be monocyclic or polycyclic. Specifically, groups having a monocyclic, bicyclic, tricyclic or tetracyclic structure having 5 or more carbon atoms can be exemplified. The number of carbon atoms of these alicyclic hydrocarbon groups is preferably from 6 to 30, and especially preferably from 7 to 25. These alicyclic hydrocarbon groups may have a substituent.

The examples of the structures of alicyclic moiety of the alicyclic hydrocarbon groups are shown below.

 (1)

 (2)

 (3)

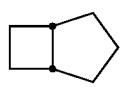 (4)

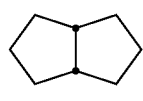 (5)

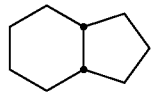 (6)

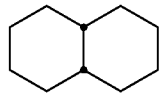 (7)

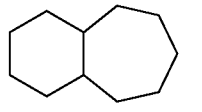 (8)

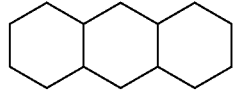 (9)

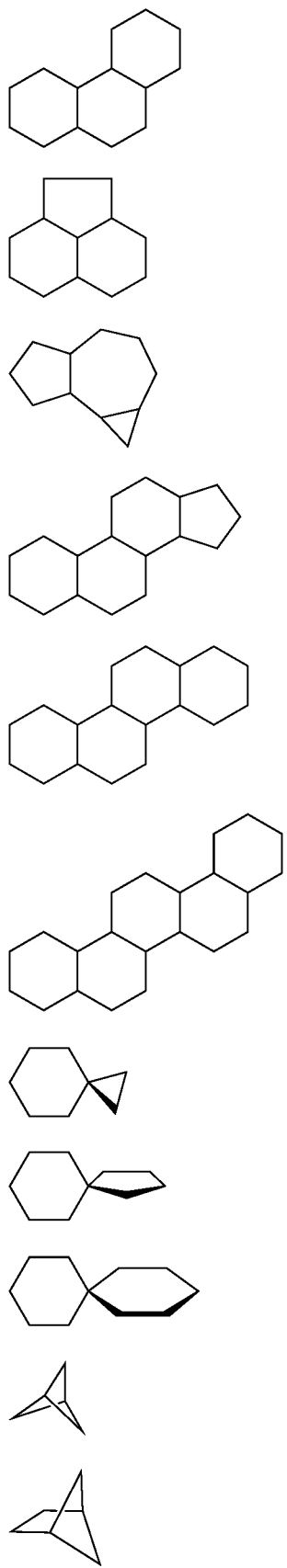
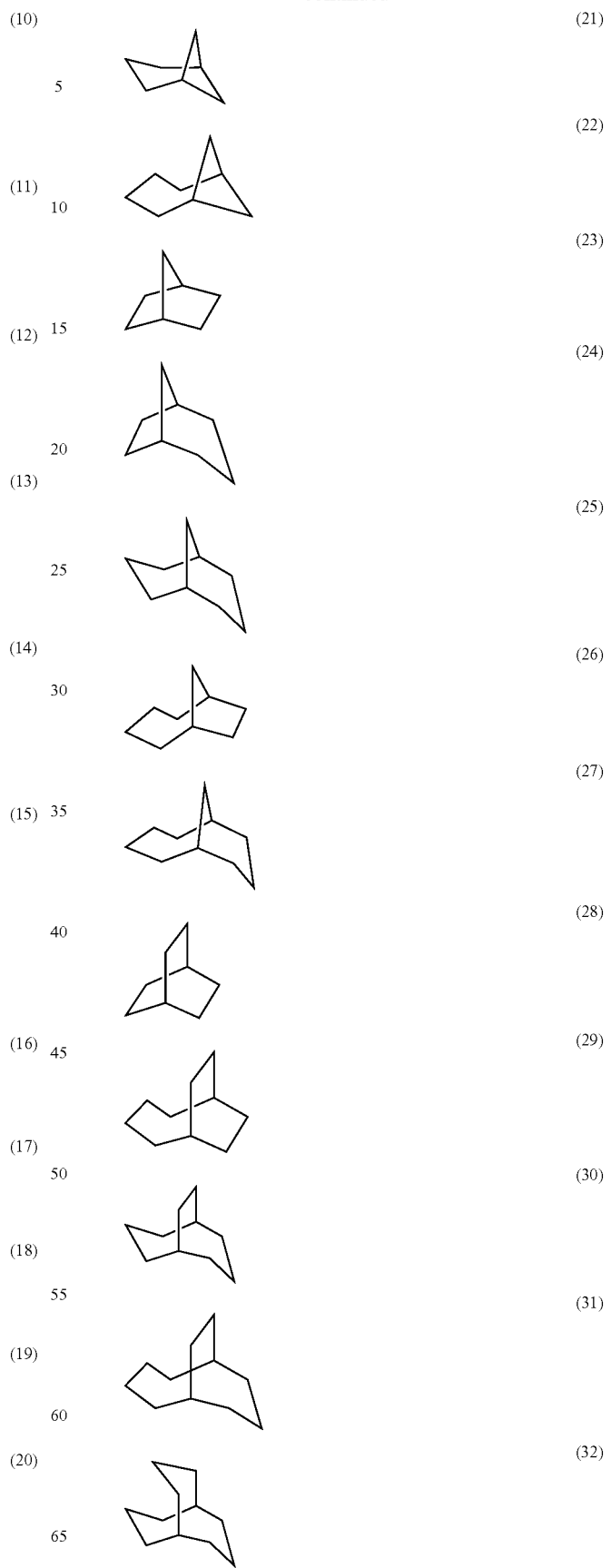

-continued

(33) 

(34) 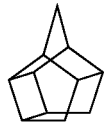

(35) 

(36) 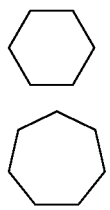

(37)

(38) 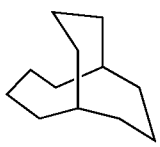

(39) 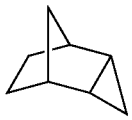

(40) 

(41) 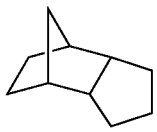

(42) 

(43) 

(44) 

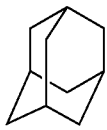

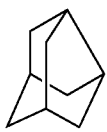

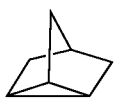

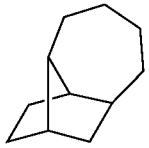

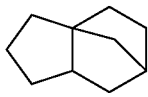

(45)

(46)

(47)

(48)

(49)

(50)

In the invention, the preferred of the above alicyclic moieties are an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group can be exemplified. More preferably, an adamantyl group, a decalin residue, a norbornyl group, a cedrol group, a cyclohexyl group, a cycloheptyl group, a cyclooctyl group, a cyclodecanyl group and a cyclododecanyl group are exemplified. As the substituents of the alicyclic hydrocarbon groups, e.g., an alkyl group, a halogen atom, a hydroxyl group, an alkoxyl group, a carboxyl group, and an alkoxycarbonyl group are exemplified. The alkyl group is preferably a lower alkyl group, e.g., a methyl group, an ethyl group, a propyl group, an isopropyl group, and a butyl group, and more preferably substituents selected from the group consisting of a methyl group, an ethyl group, a propyl group, and an isopropyl group are exemplified. As the alkoxyl group, an alkoxyl group having from 1 to 4 carbon atoms, e.g., a methoxy group, an ethoxy group, a propoxy group, and a butoxy group can be exemplified.

The alkyl group, alkoxyl group, and alkoxycarbonyl group may further have a substituent, and as the examples of the substituents, an alkoxyl group having from 1 to 4 carbon atoms (e.g., a methoxy group, an ethoxy group, and a butoxy group), a hydroxyl group, an oxo group, an alkylcarbonyl group (preferably having from 2 to 5 carbon atoms), an alkylcarbonyloxy group (preferably having from 2 to 5 carbon atoms), an alkoxycarbonyl group (preferably having from 2 to 5 carbon atoms), and a halogen atom (a chlorine atom, a bromine atom and an iodine atom) can be exemplified.

For maintaining good developing properties in an alkali developing solution, resin (B) may be copolymerized with appropriate other monomers so as to be capable of introducing an alkali-soluble group, such as a phenolic hydroxyl group, a carboxyl group, a sulfonic acid group, or a hexafluoroisopropanol group (—C(CF$_3$)$_2$OH), or may be copolymerized with hydrophobic other polymerizable monomers such as alkyl acrylate or alkyl methacrylate for the purpose of the improvement of film properties.

The content of the repeating unit represented by formula (B1-II) is preferably from 5 to 60 mol % in all the repeating units constituting the resin, more preferably from 10 to 50 mol %, and especially preferably from 10 to 40 mol %.

The content of the repeating unit represented by formula (B1-III) is preferably from 40 to 90 mol % in all the repeating units constituting the resin, more preferably from 45 to 80 mol %, and especially preferably from 50 to 75 mol %.

The content of the repeating unit represented by formula (B1-IV) is preferably from 5 to 50 mol % in all the repeating units constituting the resin, more preferably from 10 to 40 mol %, and especially preferably from 15 to 30 mmol %.

The content of the repeating unit represented by formula (V) is preferably from 0 to 30 mol % in all the repeating units constituting the resin, more preferably from 0 to 20 mol %, and especially preferably from 0 to 10 mol %.

The content of the repeating unit having an alkali-soluble group such as a hydroxyl group, a carboxyl group or a sulfonic acid group is preferably from 1 to 99 mol % in all the repeating units constituting the resin, more preferably from 3 to 95 mol %, and especially preferably from 5 to 90 mol %.

The content of the repeating unit having an acid-decomposable group is preferably from 3 to 95 mol % in all the repeating units constituting the resin, more preferably from 5 to 90 mol %, and especially preferably from 10 to 85 mmol %.

The resin can be synthesized according to conventionally known methods, such as methods of reacting an alkali-soluble resin with a precursor of an acid-decomposable group, or methods of copolymerization of a monomer having an acid-decomposable group with various monomers as disclosed in EP 254,853, JP-A-2-258500, JP-A-3-223860 and JP-A-4-251259.

The weight average molecular weight of resin (B1) is preferably 20,000 or less as the polystyrene equivalent by the GPC method, more preferably in the range of from 1,000 to 8,000, and especially preferably from 2,000 to 4,000.

Molecular weight polydispersity (Mw/Mn) of resin (B1) is preferably from 1.0 to 3.0, more preferably from 1.05 to 2.0, and still more preferably from 1.1 to 1.7.

Resin (B1) may be used in combination of two or more kinds.

The specific examples of resin (B1) are shown below, but the invention is not restricted thereto,

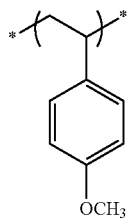

(1)

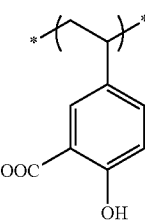

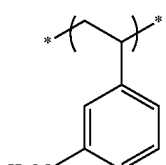

(2)

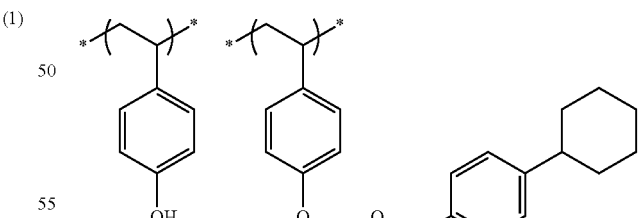

(3)

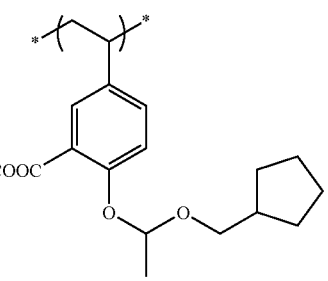

(4)

-continued

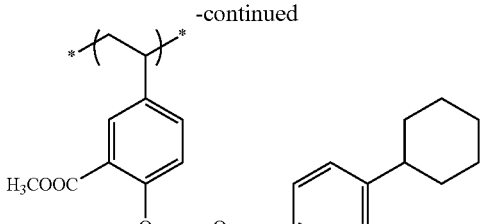

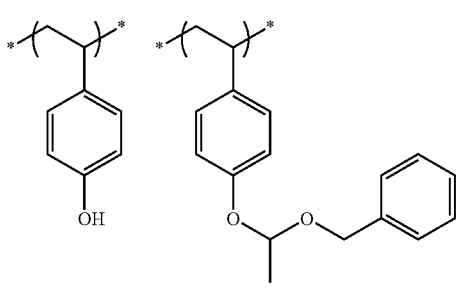
(5)

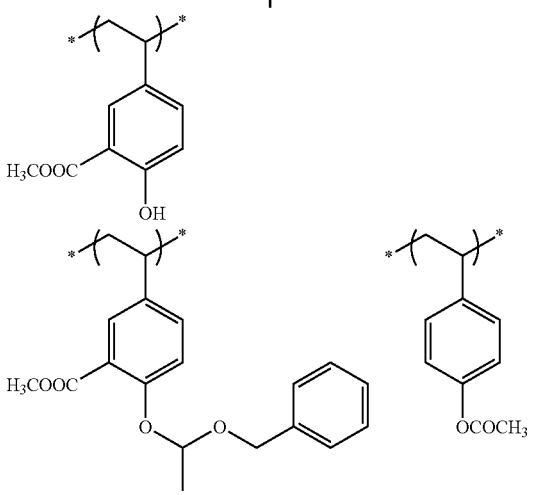

When the resist composition in the invention is irradiated with ArF excimer laser beams, it is preferred that the resin of component (B) is resin (B2) having a monocyclic or polycyclic alicyclic hydrocarbon structure and capable of decomposing by the action of an acid to thereby increase the solubility in an alkali developing solution.

As resin (B2) having a monocyclic or polycyclic alicyclic hydrocarbon structure and capable of decomposing by the action of an acid to thereby increase the solubility in an alkali developing solution (hereinafter also referred to as "an alicyclic hydrocarbon acid-decomposable resin"), a resin containing at least one repeating unit selected from the group consisting of a repeating unit having a partial structure containing alicyclic hydrocarbon represented by any of the following formulae (pI) to (pV), and a repeating unit represented by the following formula (II-AB) is preferred.

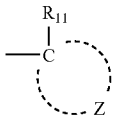
(pI)

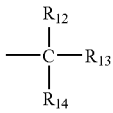
(pII)

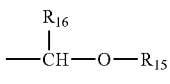
(pIII)

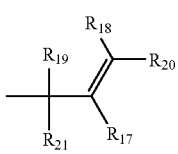
(pIV)

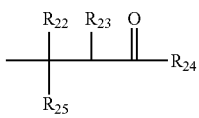
(pV)

In formulae (pI) to (pV), $R_{11}$ represents a methyl group, an ethyl group, an n-propyl group, an isopropyl group, an n-butyl group, an isobutyl group, or a sec-butyl group; and Z represents an atomic group necessary to form a cycloalkyl group together with a carbon atom.

Each of $R_{12}$, $R_{13}$, $R_{14}$, $R_{15}$ and $R_{16}$ independently represents a straight chain or branched alkyl group having from 1 to 4 carbon atoms, or a cycloalkyl group, provided that at least one of $R_{12}$ to $R_{14}$, or either $R_{15}$ or $R_{16}$ represents a cycloalkyl group.

Each of $R_{17}$, $R_{18}$, $R_{19}$, $R_{20}$ and $R_{21}$ independently represents a hydrogen atom, a straight chain or branched alkyl group having from 1 to 4 carbon atoms, or a cycloalkyl group, provided that at least one of $R_{17}$ to $R_{21}$ represents a cycloalkyl group, and either $R_{19}$ or $R_{21}$ represents a straight chain or branched alkyl group having from 1 to 4 carbon atoms, or a cycloalkyl group.

Each of $R_{22}$, $R_{23}$, $R_{24}$ and $R_{25}$ independently represents a hydrogen atom, a straight chain or branched alkyl group having from 1 to 4 carbon atoms, or a cycloalkyl group, provided that at least one of $R_{22}$ to $R_{25}$ represents a cycloalkyl group, and $R_{23}$ and $R_{24}$ may be bonded to each other to form a ring.

(II-AB)

In formula (II-AB), each of $R_{11}'$ and $R_{12}'$ independently represents a hydrogen atom, a cyano group, a halogen atom, or an alkyl group.

Z' contains bonded two carbon atoms (C—C) and represents an atomic group to form an alicyclic structure.

Formula (II-AB) is more preferably represented by the following formula (II-AB1) or (II-AB2).

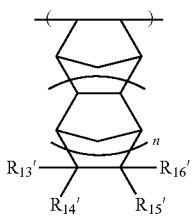
(II-AB1)

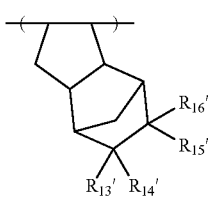
(II-AB2)

In formulae (II-AB1) and (II-AB2), each of $R_{13}'$, $R_{14}'$, $R_{15}'$ and $R_{16}'$ independently represents a hydrogen atom, a halogen atom, a cyano group, a hydroxyl group, —COOH, —COOR$_5$, a group decomposable by the action of an acid, —C(=O)—X-A'-R$_{17}'$, an alkyl group, or a cycloalkyl group. At least two of $R_{13}'$ to $R_{16}'$ may be bonded to form a ring.

$R_5$ represents an alkyl group, a cycloalkyl group, or a group having a lactone structure.

X represents an oxygen atom, a sulfur atom, —NH—, —NHSO$_2$ or —NHSO$_2$NH—.

A' represents a single bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$, or a group having a lactone structure.

$R_6$ represents an alkyl group or a cycloalkyl group.

n represents 0 or 1.

The alkyl group represented by $R_{12}$ to $R_{25}$ in formulae (pI) to (pV) is preferably a straight chain or branched alkyl group having from 1 to 4 carbon atoms, e.g., a methyl group, an ethyl group, a propyl group, an n-butyl group, a sec-butyl group, and a t-butyl group are exemplified.

The cycloalkyl groups represented by $R_{11}$ to $R_{25}$ or the cycloalkyl group formed by Z and carbon atoms may be monocyclic or polycyclic. Specifically, groups having a monocyclic, bicyclic, tricyclic or tetracyclic structure having 5 or more carbon atoms can be exemplified. The number of carbon atoms of the groups is preferably from 6 to 30, and particularly preferably from 7 to 25. These cycloalkyl groups may have a substituent.

As preferred cycloalkyl groups, an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group can be exemplified. More preferred cycloalkyl groups are an adamantyl group, a norbornyl group, a cyclohexyl group, a cyclopentyl group, a tetracyclododecanyl group, and a tricyclodecanyl group.

These alkyl groups and cycloalkyl groups may have further substituents. As further substituents of these alkyl groups and cycloalkyl groups, an alkyl group (having from 1 to 4 carbon atoms), a halogen atom, a hydroxyl group, an alkoxy group (having from 1 to 4 carbon atoms), a carboxyl group, and an alkoxycarbonyl group (having from 2 to 6 carbon atoms) can be exemplified. These alkyl group, alkoxy group and alkoxycarbonyl group may further have a substituent. As the substituents that the alkyl group, alkoxy group and alkoxycarbonyl group may further have, a hydroxyl group, a halogen atom and an alkoxy group can be exemplified.

The structures represented by formulae (pI) to (pV) in the resin can be used for the protection of alkali-soluble groups. As the alkali-soluble groups, various groups well known in this technical field can be exemplified.

Specifically, the structures in which the hydrogen atoms of carboxylic acid group, a sulfonic acid group, a phenol group and a thiol group are substituted with the structures represented by formulae (pI) to (pV) are exemplified, and preferably the structures in which the hydrogen atoms of carboxylic acid group and a sulfonic acid group are substituted with the structures represented by formulae (PI) to (pV) are exemplified.

As the repeating unit having the alkali-soluble group protected with the structure represented by any of the above formulae (pI) to (pV), a repeating unit represented by the following formula (pA) is preferred.

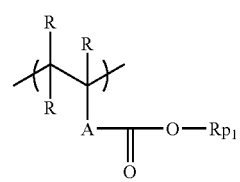
(pA)

In formula (pA), R represents a hydrogen atom, a halogen atom, or a straight chain or branched alkyl group having from 1 to 4 carbon atoms, and a plurality of R's may be the same with or different from each other.

A represents a single group or the combination of two or more groups selected from the group consisting of a single bond, an alkylene group, an ether group, a thioether group, a carbonyl group, an ester group, an amido group, a sulfonamido group, a urethane group, and a ureylene group. A single bond is preferred.

$R_{p1}$ represents a group represented by any of formulae (pI) to (pV).

The repeating unit represented by (pA) is most preferably a repeating unit by 2-alkyl-2-adamantyl (meth)acrylate or dialkyl(1-adamantyl)methyl (meth)acrylate.

The specific examples of the repeating units represented by formula (pA) are shown below, but the invention is not restricted thereto.

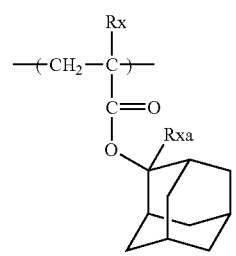
1

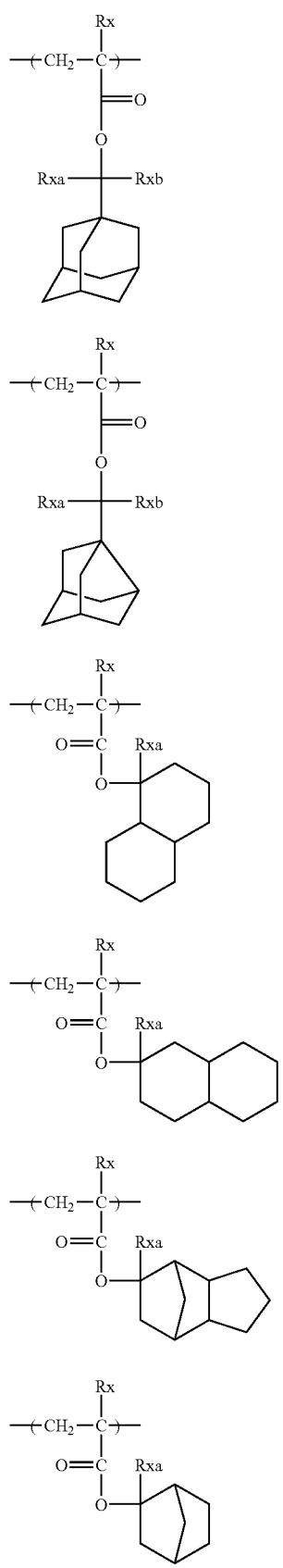
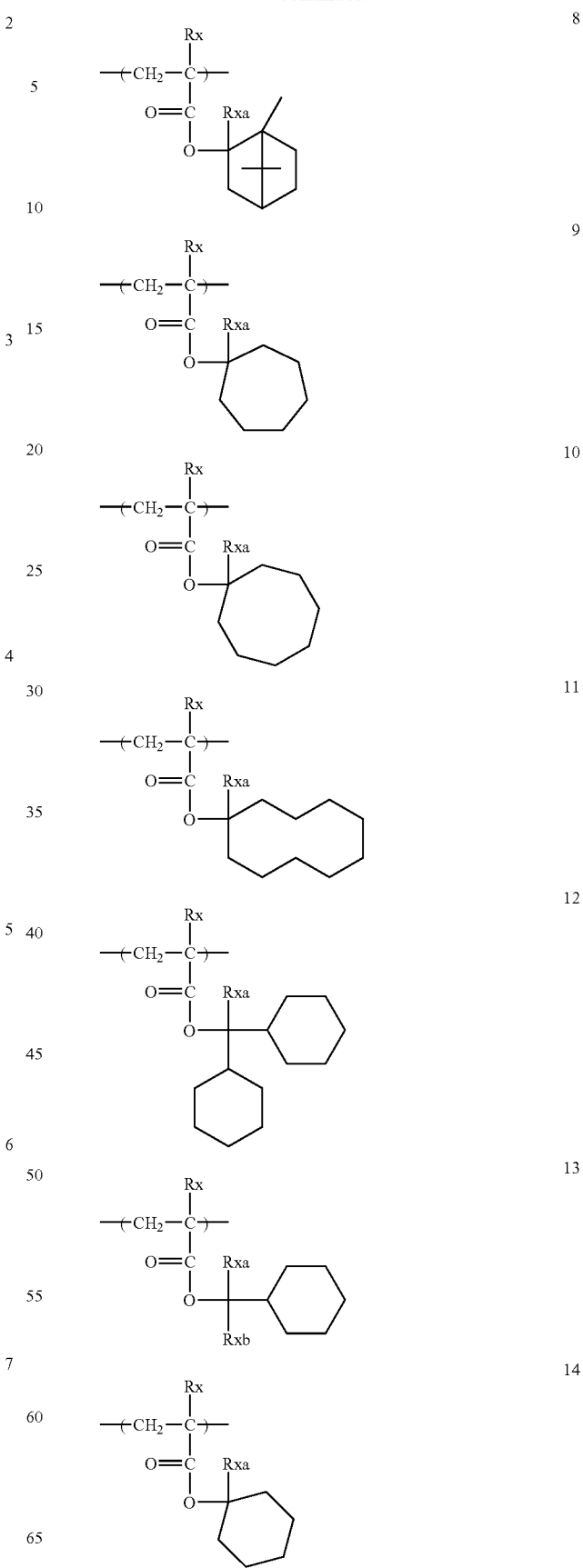

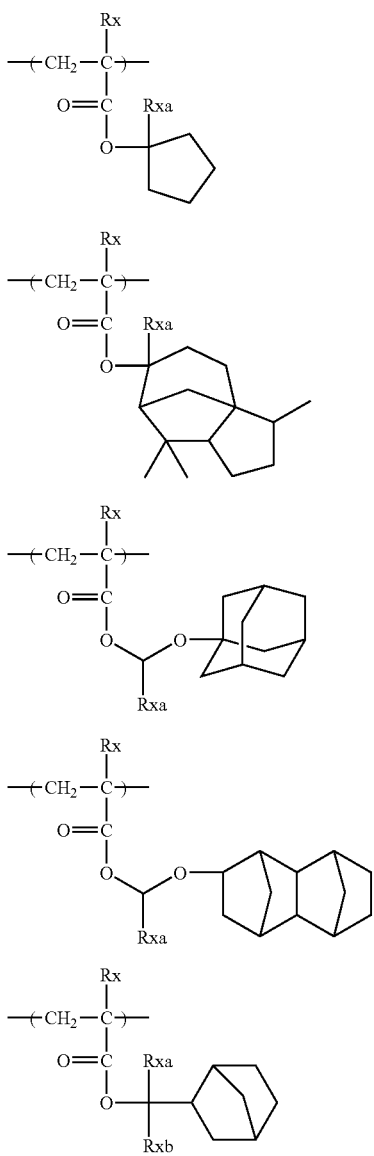

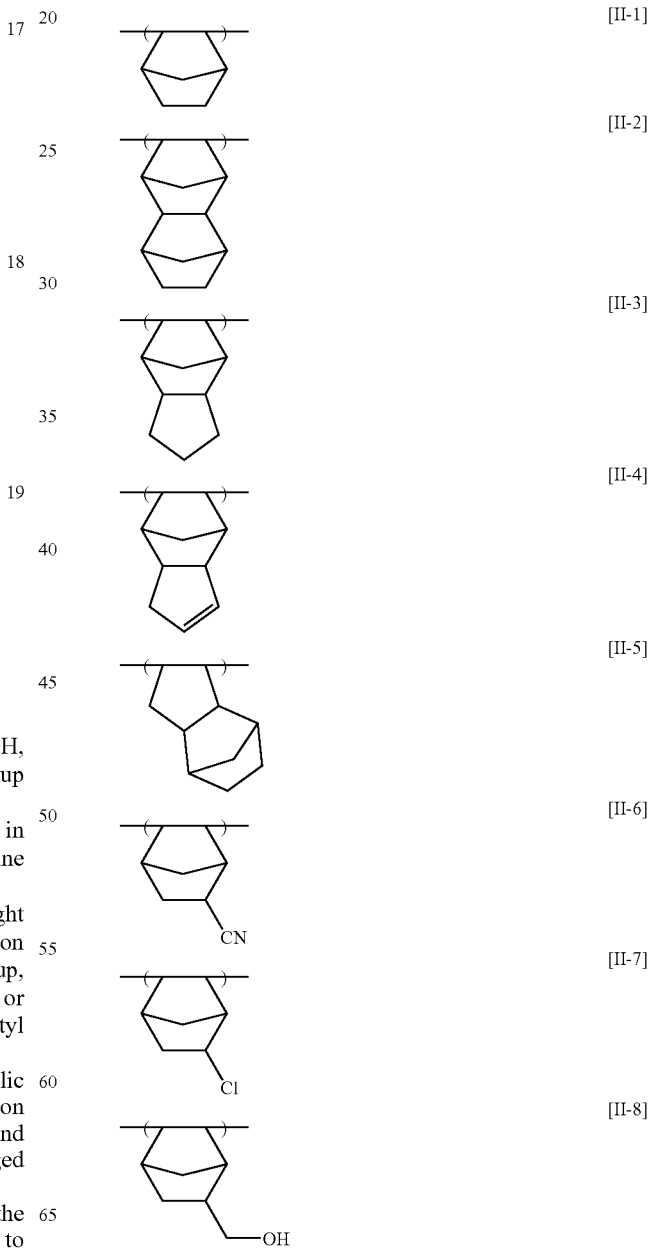

In the formulae, Rx represents H, CH$_3$, CF$_3$, or CH$_2$OH, each of Rxa and Rxb independently represents an alkyl group having from 1 to 4 carbon atoms.

As the halogen atoms represented by $R_{11}{'}$ and $R_{12}{'}$ in formula (II-AB), a chlorine atom, a bromine atom, a fluorine atom and an iodine atom are exemplified.

As the alkyl groups represented by $R_{11}{'}$ and $R_{12}{'}$, straight chain or branched alkyl groups having from 1 to 10 carbon atoms are preferred, and, e.g., a methyl group, an ethyl group, an n-propyl group, an isopropyl group, a straight chain or branched butyl group, pentyl group, hexyl group, and heptyl group are exemplified.

The atomic group represented by Z' to form an alicyclic structure is an atomic group to form an alicyclic hydrocarbon repeating unit in the resin, which may have a substituent, and an atomic group to form a repeating unit having a bridged alicyclic hydrocarbon structure is especially preferred.

As the skeleton of the alicyclic hydrocarbon formed, the same groups as the cycloalkyl groups represented by $R_{12}$ to $R_{25}$ in formulae (pI) to (pV) are exemplified.

The skeleton of the alicyclic hydrocarbon may have a substituent, and as the substituents, the groups represented by $R_{13}{'}$ to $R_{16}{'}$ in formula (II-AB1) or (1-AB2) can be exemplified.

In resin (B2), a group capable of decomposing by the action of an acid can be contained in at least one repeating unit of a repeating unit having a partial structure containing alicyclic hydrocarbon represented by any of formulae (pI) to (pV), a repeating unit represented by formula (II-AB), and a repeating unit of the later-described copolymer component.

Various substituents of $R_{13}{'}$ to $R_{16}{'}$ in formula (II-AB1) or (II-AB2) can also be used as the substituents of the atomic group $Z_1$ for forming an alicyclic hydrocarbon structure or a bridged alicyclic hydrocarbon structure in formula (II-AB).

The specific examples of the repeating units represented by formula (II-AB1) or (II-AB2) are shown below, but the invention is not restricted thereto.

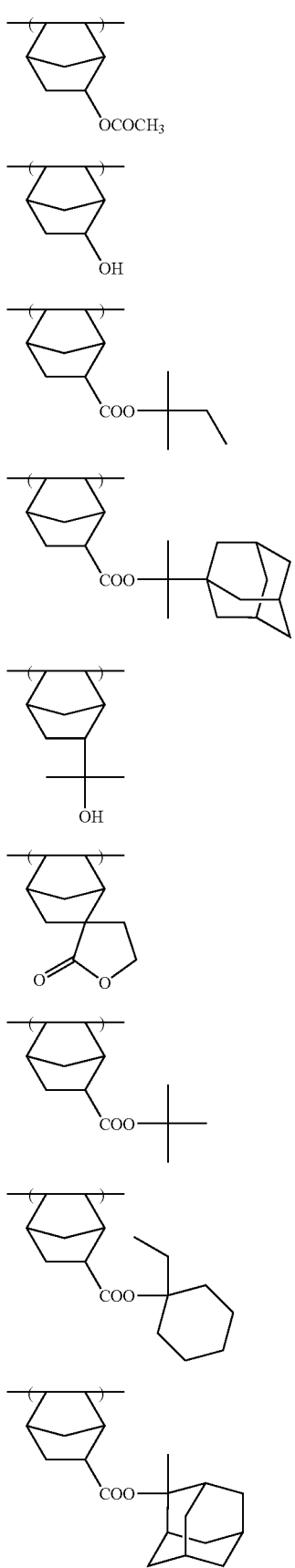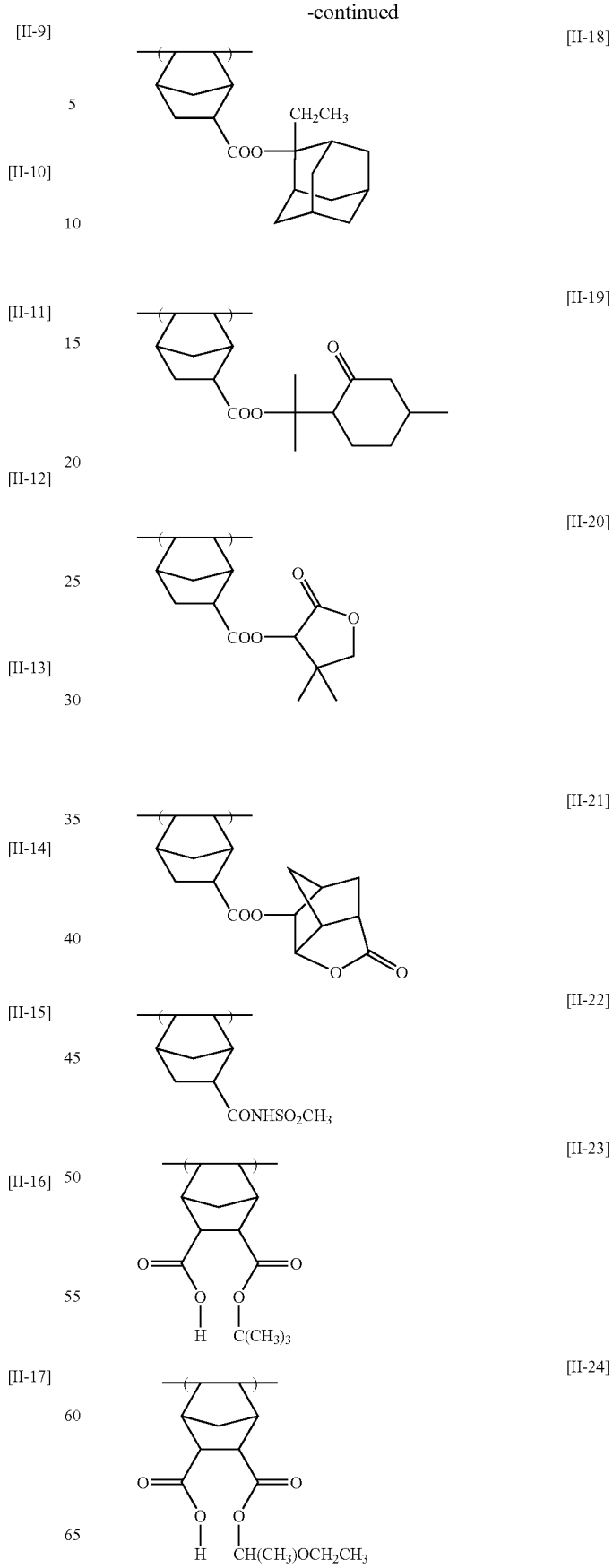

[II-25] 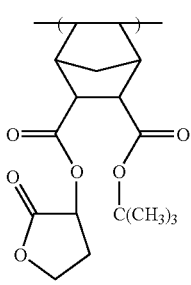

[II-26] 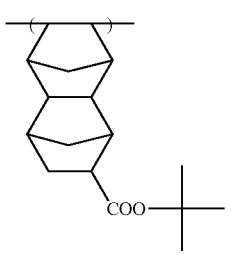

[II-27] 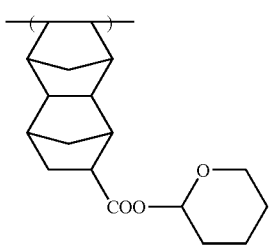

[II-28] 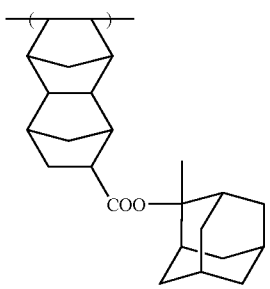

[II-29] 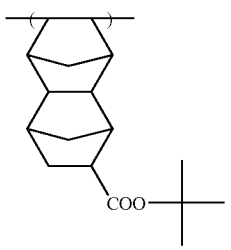

[II-30] 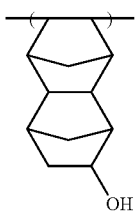

[II-31] 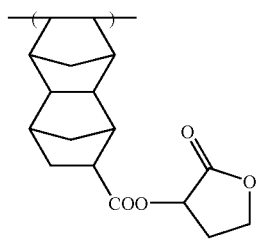

[II-32] 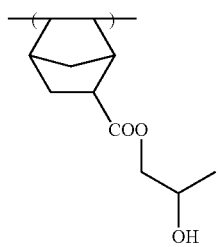

It is preferred for resin (B2) to contain a repeating unit having a lactone group. As the lactone group, any group having a lactone structure can be used, but preferably groups having a 5- to 7-membered ring lactone structure, e.g., 5- to 7-membered ring lactone structures condensed with other ring structures in the form of forming a bicyclo structure or a spiro structure are preferred. It is more preferred for the alicyclic hydrocarbon-based acid-decomposable resin in the invention to contain a repeating unit having a group having a lactone structure represented by any of the following formulae (LC1-1) to (LC1-16). A group having a lactone structure may be directly bonded to the main chain of the repeating unit. Preferred lactone structures are (LC1-1), (LC1-4) (LC1-5), (LC1-6), (LC1-13) and (LC1-14). By the use of a specific lactone structure, line edge roughness and development defect are bettered.

LC1-1
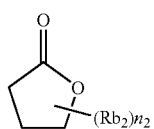

LC1-2
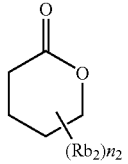

LC1-3
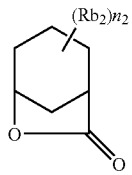

LC1-4 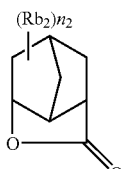

LC1-5 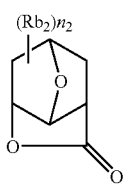

LC1-6 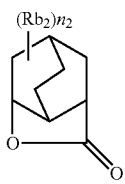

LC1-7 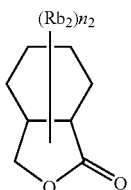

LC1-8 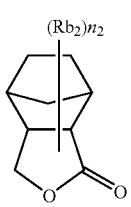

LC1-9 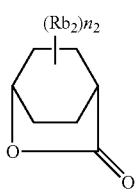

LC1-10 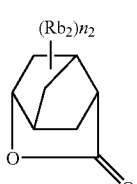

LC1-11 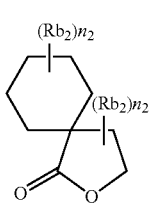

LC1-12 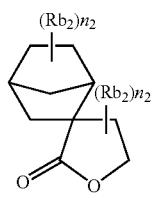

LC1-13 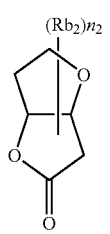

LC1-14 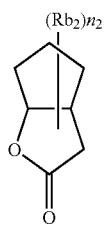

LC1-15 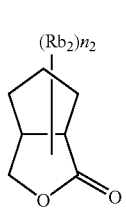

LC1-16 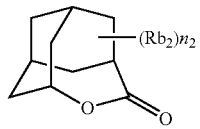

The lactone structure moiety may have or may not have a substituent ($Rb_2$). As preferred substituent ($Rb_2$), an alkyl group having from 1 to 8 carbon atoms, a cycloalkyl group having from 3 to 7 carbon atoms, an alkoxyl group having from 1 to 8 carbon atoms, an alkoxycarbonyl group having from 1 to 8 carbon atoms, a carboxyl group, a halogen atom, a hydroxyl group, a cyano group, and an acid-decomposable group are exemplified. $n_2$ represents an integer of from 0 to 4. When $n_2$ is an integer of 2 or more, a plurality of $Rb_2$ may be the same with or different from each other, and a plurality of $Rb_2$ may be bonded to each other to form a ring.

As the repeating units having a group having a lactone structure represented by any of formulae (LC1-1) to (LC1-16), a repeating unit represented by formula (II-AB1) or (II-AB2) in which at least one of $R_{13}'$ to $R_{16}'$ is a group having a lactone structure represented by any of formulae (LC1-1) to (LC1-16) (for example, $R_5$ of —$COOR_5$ is a group represented by any of formulae (LC1-1) to (LC1-16)), or a repeating unit represented by the following formula (AI) can be exemplified.

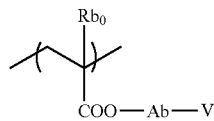

(AI)

In formula (AI), $Rb_0$ represents a hydrogen atom, a halogen atom, or an alkyl group having from 1 to 4 carbon atoms.

As the alkyl group represented by $Rb_0$, e.g., a methyl group, an ethyl group, a propyl group, an n-butyl group, a sec-butyl group, and a t-butyl group can be exemplified. The alkyl group represented by $Rb_0$ may have a substituent. As the preferred substituents that the alkyl group represented by $Rb_0$ may have, e.g., a hydroxyl group and a halogen atom are exemplified. As the halogen atom represented by $Rb_0$, a fluorine atom, a chlorine atom, a bromine atom and an iodine atom can be exemplified. $Rb_0$ is preferably a hydrogen atom, a methyl group, a hydroxymethyl group or a trifluoromethyl group, and more preferably a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxyl group, or a divalent linking group combining these groups. Ab preferably represents a single bond or a linking group represented by $-Ab_1-CO_2-$.

$Ab_1$ represents a straight chain or branched alkylene group, or a monocyclic or polycyclic cycloalkylene group, and preferably a methylene group, an ethylene group, a cyclohexyl residue, an adamantyl residue, or a norbornyl residue.

V represents a group represented by any of formulae (LC1-1) to (LC1-16).

Repeating units having a lactone structure generally have optical isomers, and any optical isomer may be used. One kind of optical isomer may be used alone, or a plurality of optical isomers may be used as mixture. When one kind of optical isomer is mainly used, the optical purity (ee) of the optical isomer is preferably 90 or more, and more preferably 95 or more.

The specific examples of the repeating units having a group having a lactone structure are shown below, but the invention is not limited thereto.

(In the formulae, Rx represents H, $CH_3$, $CH_2OH$ or $CF_3$.)

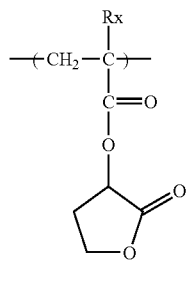
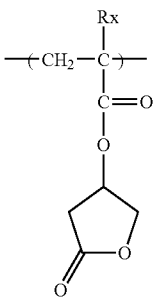

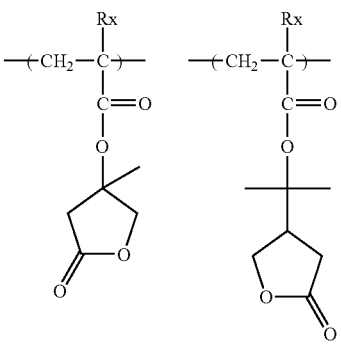

-continued

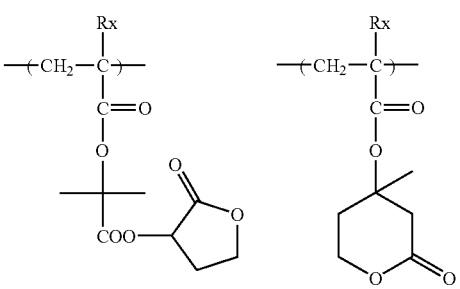

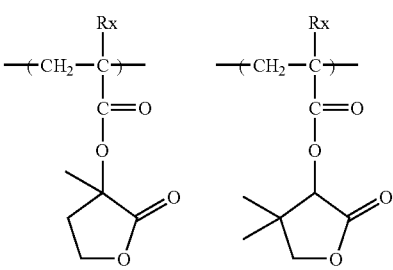

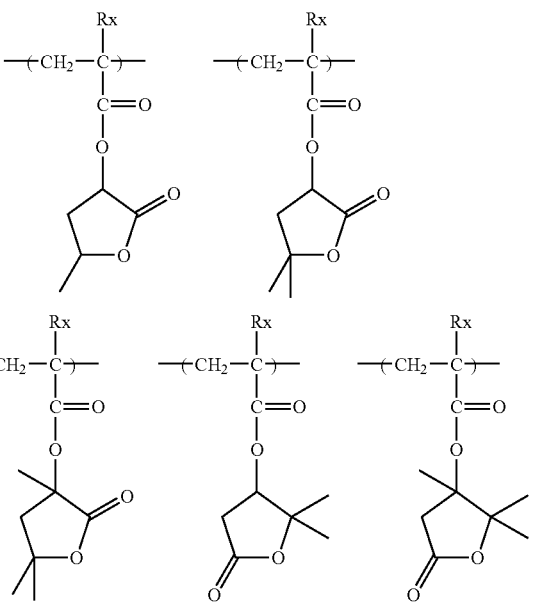

79
-continued
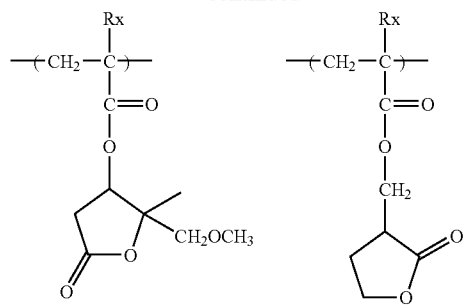
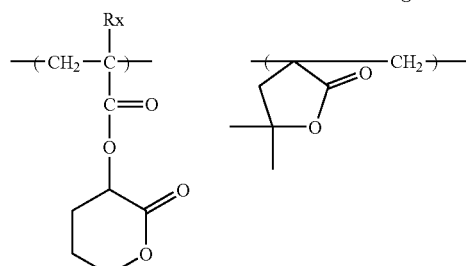
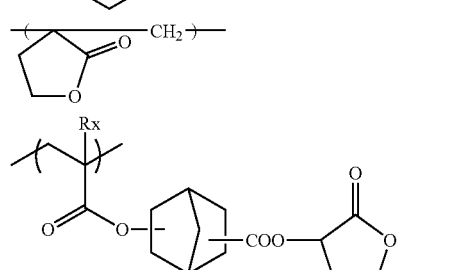
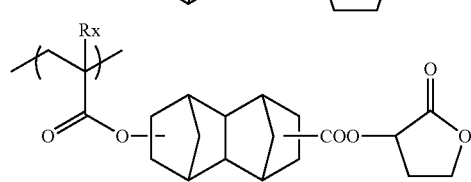
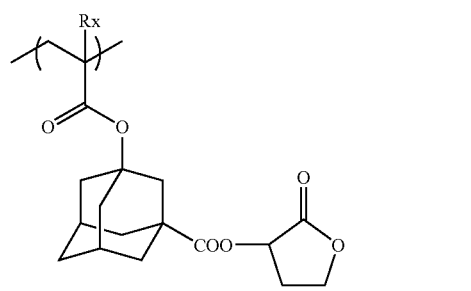
(In the formulae, Rx represents H, CH$_3$, CH$_2$OH or CF$_3$.)
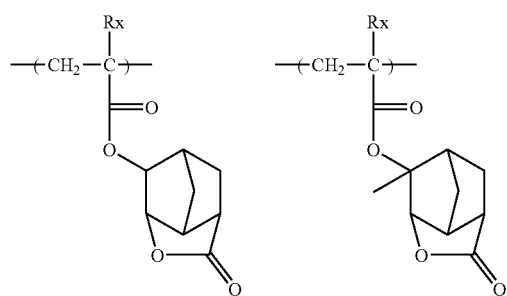
80
-continued
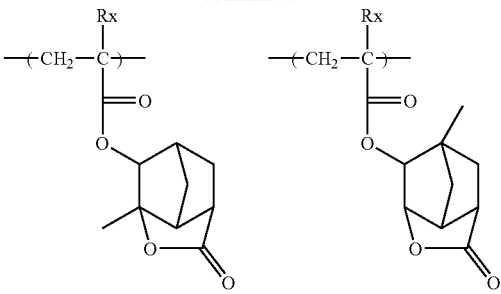
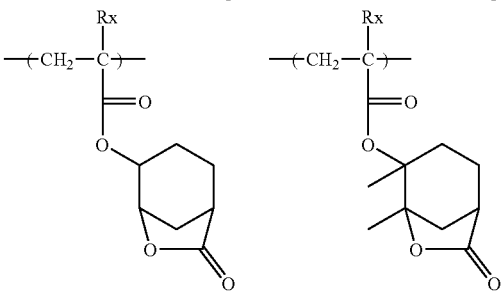
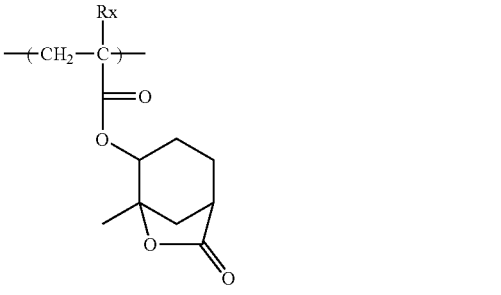
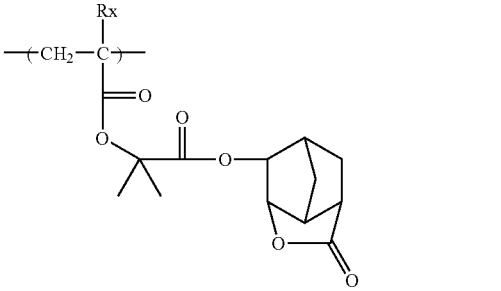
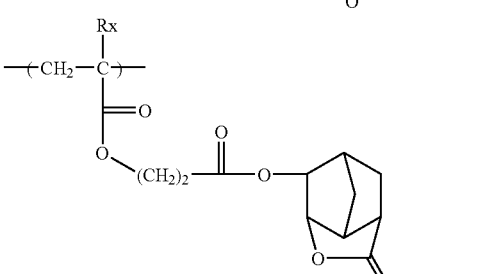
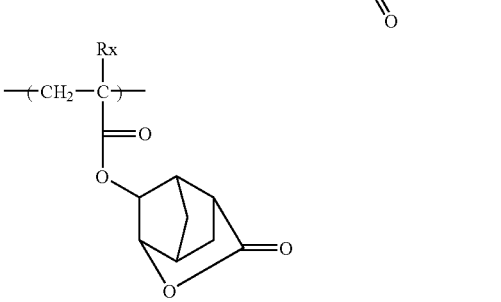

81
-continued
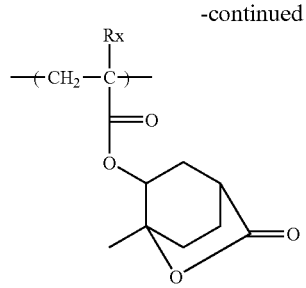
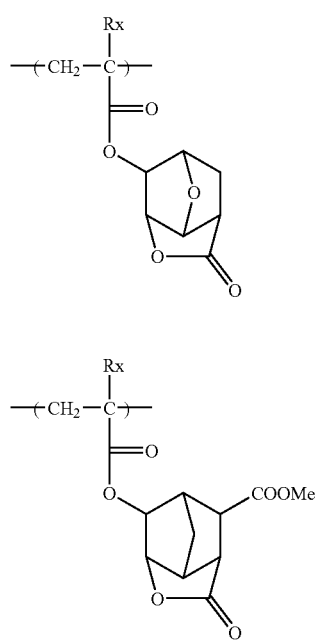
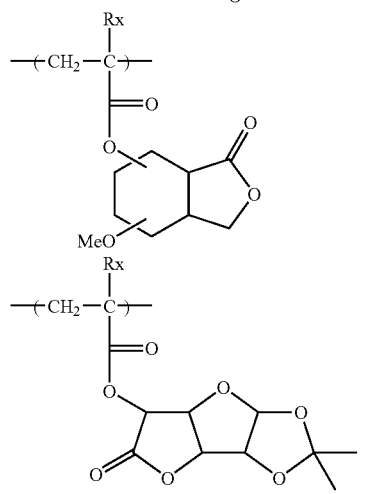
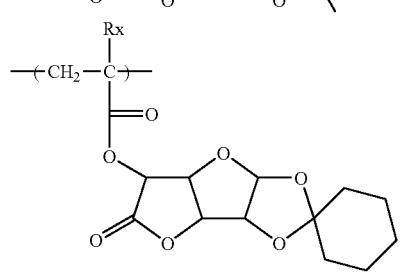
82
-continued
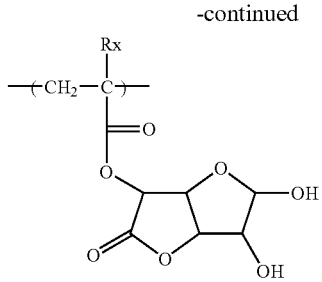
(In the formulae, Rx represents H, CH$_3$, CH$_2$OH or CF$_3$.)
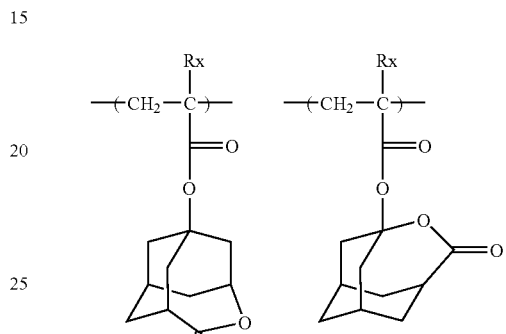
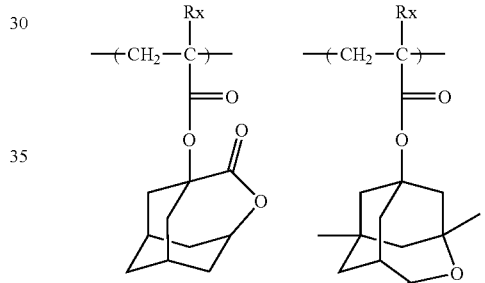
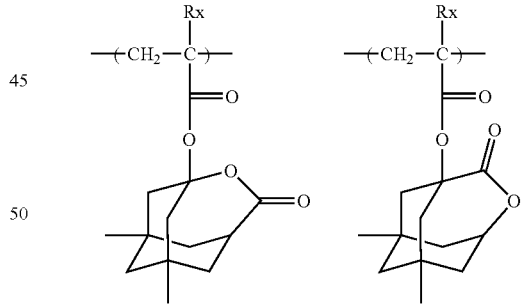
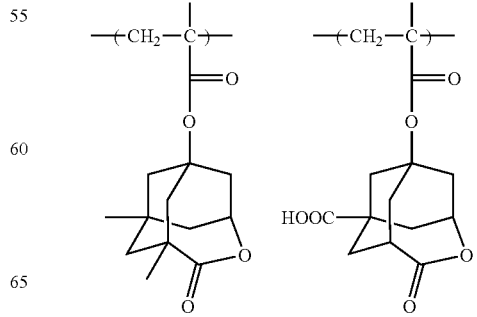

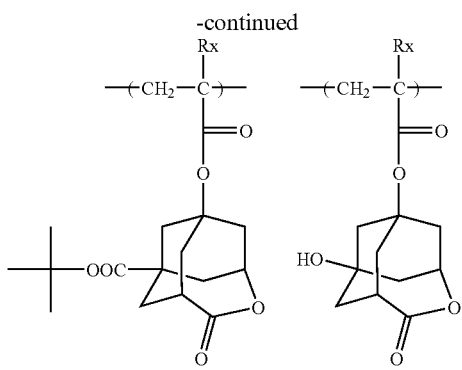

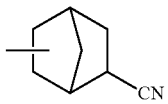

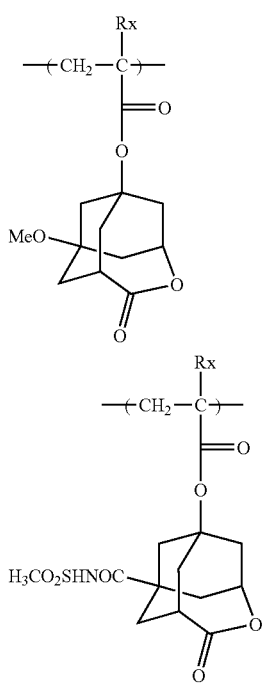

In formula (VIIa), each of $R_{2c}$, $R_{3c}$ and $R_{4c}$ independently represents a hydrogen atom, a hydroxyl group, or a cyano group, provided that at least any one of $R_{2c}$, $R_{3c}$ and $R_{4c}$ represents a hydroxyl group or a cyano group. Preferably one or two of $R_{2c}$, $R_{3c}$ and $R_{4c}$ represent a hydroxyl group and the remainder represents a hydrogen atom. More preferably two of $R_{2c}$, $R_{3c}$, and $R_{4c}$ represent a hydroxyl group and the remainder represents a hydrogen atom.

The group represented by formula (VIIa) is preferably dihydroxy or monohydroxy, and more preferably dihydroxy.

As the repeating unit having the group represented by formula (VIIa) or (VIIb), a repeating unit represented by formula (II-AB1) or (II-AB2) in which at least one of $R_{13}'$ to $R_{16}'$ is a group having the structure represented by formula (VIIa) or (VIIb) (for example, $R_5$ of —$COOR_5$ is a group represented by formula (VIIa) or (VIIb)), or a repeating unit represented by the following formula (AIIa) or (AIIb) can be exemplified.

(AIIa)

(AIIb)

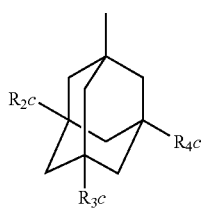

It is preferred for resin (B2) to have a repeating unit having an alicyclic hydrocarbon structure substituted with a polar group, by which adhesion with a substrate and affinity with a developing solution are improved. As the polar group, a hydroxyl group and a cyano group are preferred.

The hydroxyl group as the polar group forms an alcoholic hydroxyl group.

As the alicyclic hydrocarbon structure substituted with a polar group, a structure represented by the following formula (VIIa) or (VIIb) is exemplified.

In formulae (AIIa) and (AIIb), $R_{1c}$ represents a hydrogen atom, a methyl group, a trifluoromethyl group, or a hydroxymethyl group.

$R_{2c}$, $R_{3c}$ and $R_{4c}$ each has the same meaning as $R_{2c}$, $R_{3c}$ and $R_{4c}$ in formula (VIIa).

The specific examples of the repeating units having an alicyclic hydrocarbon structure substituted with a polar group represented by formulae (AIIa) or (AIIb) are shown below, but the invention is not restricted thereto.

(VIIa)

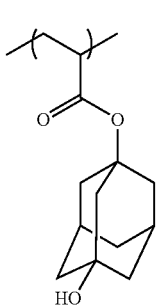
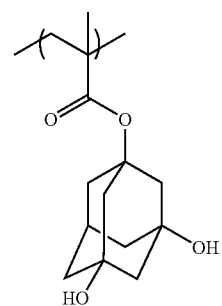

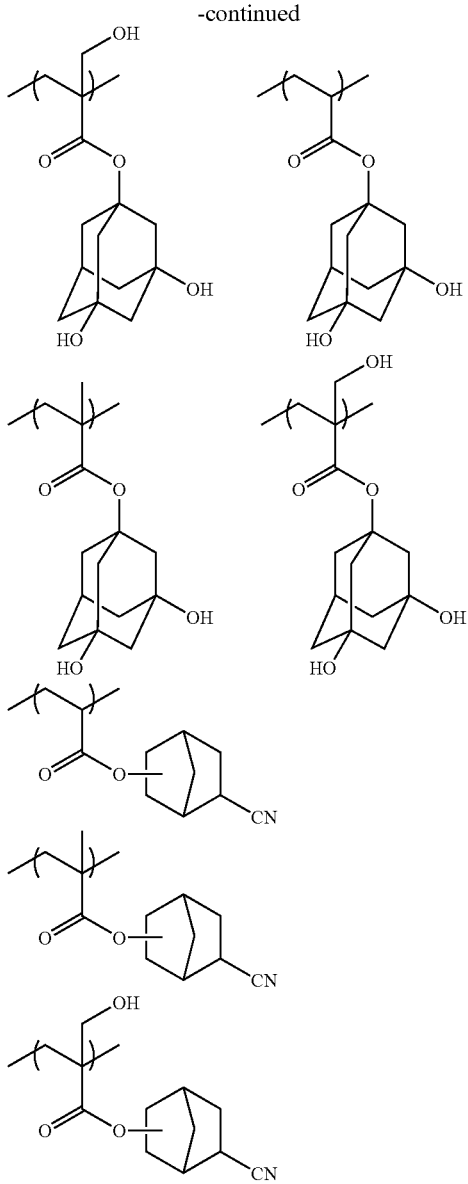

Resin (B2) may have a repeating unit represented by the following formula (VIII).

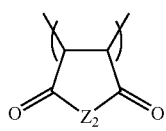

In formula (VIII), $Z_2$ represents —O— or —N($R_{41}$)—. $R_{41}$ represents a hydrogen atom, a hydroxyl group, an alkyl group, or —OSO$_2$—$R_{42}$. $R_{42}$ represents an alkyl group, a cycloalkyl group, or a camphor residue. The alkyl group represented by $R_{41}$ and $R_{42}$ may be substituted with a halogen atom (preferably a fluorine atom) and the like.

As the specific examples of the repeating units represented by formula (VIII), the following compounds are exemplified, but the invention is not restricted thereto.

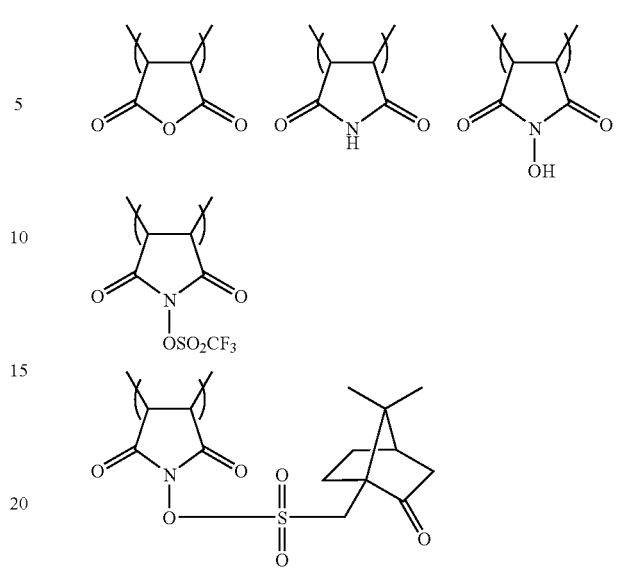

It is preferred for resin (B2) to have a repeating unit having an alkali-soluble group, and it is more preferred to have a repeating unit having a carboxyl group, by which the resolution in the use for contact hole is enhanced. As the repeating units having a carboxyl group, both a repeating unit having a carboxyl group directly bonded to the main chain of a resin such as a repeating unit by acrylic acid or methacrylic acid, and a repeating unit having a carboxyl group bonded to the main chain of a resin via a linking group are preferred, and the linking group may have a monocyclic or polycyclic hydrocarbon structure. The repeating unit by acrylic acid or methacrylic acid is most preferred.

Resin (B2) may have a repeating unit having one to three groups represented by the following formula (F1), by which line edge roughness property is improved.

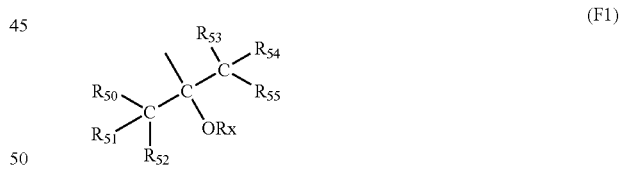

In formula (F1), each of $R_{50}$ to $R_{55}$ independently represents a hydrogen atom, a fluorine atom, or an alkyl group, provided that at least one of $R_{50}$ to $R_{55}$ represents a fluorine atom, or an alkyl group in which at least one hydrogen atom is substituted with a fluorine atom.

Rx represents a hydrogen atom or an organic group (preferably an acid-decomposable protective group, an alkyl group, a cycloalkyl group, an acyl group, or an alkoxycarbonyl group).

The alkyl group represented by $R_{50}$ to $R_{55}$ may be substituted with a halogen atom, e.g., a fluorine atom, or a cyano group, and preferably an alkyl group having from 1 to 3 carbon atoms, e.g., a methyl group and a trifluoromethyl group can be exemplified.

It is preferred that all of $R_{50}$ to $R_{55}$ represent a fluorine atom.

As the organic group represented by Rx, an acid-decomposable protective group, and an alkyl group, a cycloalkyl group, an acyl group, an alkylcarbonyl group, an alkoxycarbonyl group, an alkoxycarbonylmethyl group, an alkoxymethyl group, and a 1-alkoxyethyl group, each of which may have a substituent, are preferred.

The repeating unit having the group represented by formula (F1) is preferably a repeating unit represented by the following formula (F2).

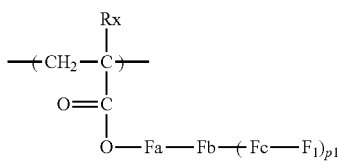

In formula (F2), Rx represents a hydrogen atom, a halogen atom, or an alkyl group having from 1 to 4 carbon atoms. As preferred substituents that the alkyl group represented by Rx may have, a hydroxyl group and a halogen atom are exemplified.

Fa represents a single bond or a straight chain or branched alkylene group, and preferably a single bond.

Fb represents a monocyclic or polycyclic hydrocarbon group.

Fc represents a single bond or a straight chain or branched alkylene group, and preferably a single bond or a methylene group.

$F_1$ represents a group represented by formula (F1).

$P_1$ represents from 1 to 3.

As the cyclic hydrocarbon group represented by Fb, a cyclopentyl group, a cyclohexyl group, or a norbornyl group is preferred.

The specific examples of the repeating units having the structure represented by formula (F1) are shown below.

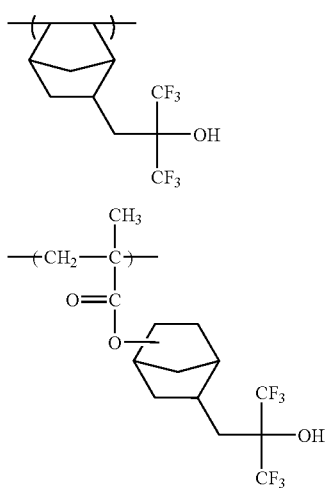

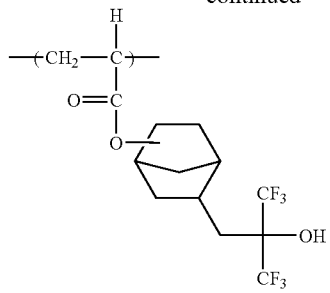

The resin (B) according to the invention may further have a repeating unit which has an alicyclic hydrocarbon structure but shows no acid-decomposability. Thus, the elution of low-molecular components from a resist film into an immersion liquid can be prevented during immersion exposure. Examples of such a repeating unit include repeating units including 1-adamantyl (meth)acrylate, tricyclodecanyl (meth)acrylate, cyclohexyl (meth)acrylate and so on.

Examples of the repeating units having alicyclic hydrocarbon structures and not showing acid decomposability include repeating units containing neither a hydroxy group nor a cyano group, and are preferably repeating units represented by the following formula (IX).

In the formula (IX), $R_5$ represents a hydrocarbon group having at least one cyclic structure and containing neither a hydroxyl group nor a cyano group.

Ra represents a hydrogen atom, an alkyl group or —$CH_2$—O—$Ra_2$. Herein, $Ra_2$ represents a hydrogen atom, an alkyl group or an acyl group. Ra is preferably a hydrogen atom, a methyl group, a hydroxymethyl group or a trifluoromethyl group, and more preferably a hydrogen atom or a methyl group.

The cyclic structure contained in $R_5$ may be a monocyclic hydrocarbon group or a polycyclic hydrocarbon group. Examples of the monocyclic hydrocarbon group include 3-12C cycloalkyl groups such as a cyclopentyl group, a cyclohexyl group, a cycloheptyl group and a cyclooctyl group, and 3-12C cycloalkenyl groups such as a cyclohexenyl group. Of these monocyclic hydrocarbon groups, 3-7C monocyclic hydrocarbon groups, especially a cyclopentyl group and a cyclohexyl group, are preferred over the others.

The polycyclic hydrocarbon group may be an assembled-ring hydrocarbon group or a bridged-ring hydrocarbon group. Examples of the assembled-ring hydrocarbon group include a bicyclohexyl group and a perhydronaphthalenyl group. Examples of the bridged hydrocarbon ring include bicyclic hydrocarbon rings such as a pinane ring, a bornane ring, a norpinane ring, a norbornane ring and bicyclooctane rings (e.g., a bicyclo[2.2.2]octane ring, a bicyclo[3.2.1]octane ring), tricyclic hydrocarbon rings such as a homobredane ring, an adamantane ring, a tricyclo[5.2.1.0$^{2,6}$]decane ring and a tricyclo[4.3.1.1$^{2,5}$]undecane ring, and tetracyclic hydrocarbon rings such as a tetracyclo[4.4.0.1$^{2,5}$.1$^{7,10}$]dodecane ring and a perhydro-1,4-methano-5,8-methanonaphthalene ring. And additional examples of the bridged hydrocarbon ring include condensed hydrocarbon rings formed by fusing together two or more of 5- to 8-membered cycloalkane rings such as perhydronaphthalene (decaline), perhydroanthracene, perhydrophenanthrene, perhydroacenaphthene, perhydrofluorene, perhydroindene and perhydrophenalene rings.

Examples of a bridged-ring hydrocarbon group suitable as the cyclic structure of $R_5$ include a norbornyl group, an adamantyl group, a bicyclooctanyl group and a tricyclo[5.2.1.0$^{2,6}$]decanyl group. Of these groups, a norbornyl group and an adamantyl group are preferred over the others.

Each of the alicyclic hydrocarbon groups recited above may have a substituent. Examples of a substituent suitable for those groups each include a halogen atom, an alkyl group, a hydroxyl group protected by a protective group, and an amino group protected by a protective group. Suitable examples of the halogen atom include bromine, chlorine and fluorine atoms. Suitable examples of the alkyl group include methyl, ethyl, butyl and t-butyl groups. These alkyl groups each may further have a substituent. Examples of the substituent include a halogen atom, an alkyl group, a hydroxyl group protected by a protective group and an amino group protected by a protective group.

Examples of such protective groups include an alkyl group, a cycloalkyl group, an aralkyl group, a substituted methyl group, a substituted ethyl group, an acyl group, an alkoxycarbonyl group and an aralkyloxycarbonyl group. Suitable examples of the alkyl group include 1-4C alkyl groups, those of the substituted methyl group include methoxymethyl, methoxythiomethyl, benzyloxymethyl, t-butoxymethyl and 2-methoxyethoxymethyl groups, those of the substituted ethyl group include 1-ethoxyethyl and 1-methyl-1-methoxyethyl groups, those of the acyl group include 1-6C aliphatic acyl groups such as formyl, acetyl, propionyl, butyryl, isobutyryl, valeryl and pivaloyl groups, and those of the alkoxycarbonyl group include 1-4C alkoxycarbonyl groups.

The proportion of repeating units represented by the formula (IX), which have neither a hydroxyl group nor a cyano group is preferably from 0 to 40 mole %, far preferably from 0 to 20 mole %, with respect to the total repeating units of the alicyclic hydrocarbon-containing acid-decomposable resin.

Examples of a repeating unit represented by the formula (IX) are illustrated below, but these examples should not be construed as limiting the scope of the invention.

In the following structural formulae, Ra represents H, CH$_3$, CH$_2$OH or CF$_3$.

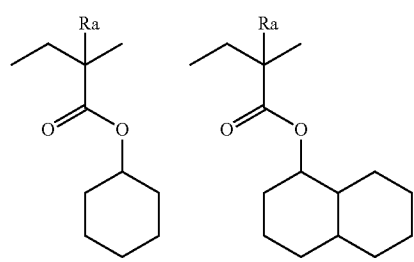

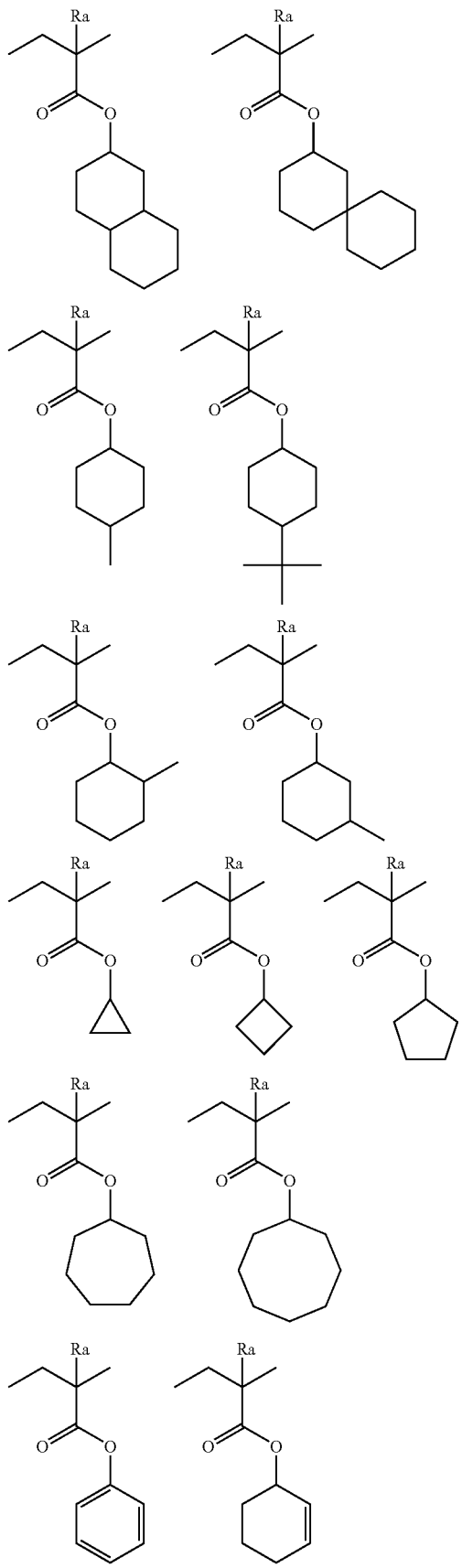

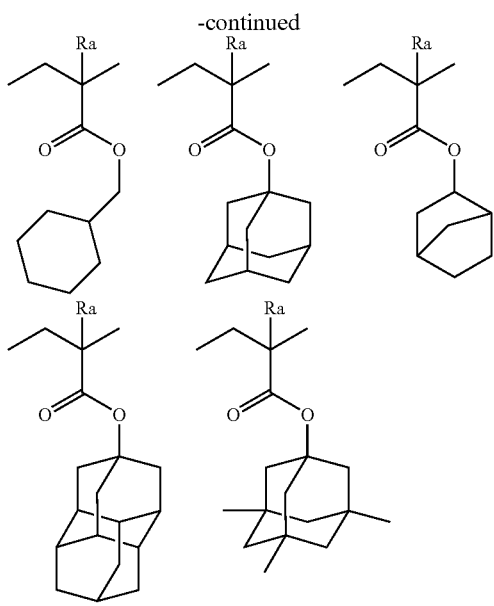

Resin (B2) can contain various kinds of repeating structural units besides the above repeating structural units, for the purpose of the adjustments of dry etching resistance, aptitude for standard developing solutions, adhesion to a substrate, resist profile, and general requisite characteristics of resists, e.g., resolution, heat resistance and sensitivity.

As these repeating structural units, the repeating structural units corresponding to monomers shown below can be exemplified, but the invention is not restricted thereto.

By containing such various repeating structural units, fine adjustment of performances required of resin (B2), in particular the following performances, becomes possible, that is,
(1) Solubility in a coating solvent,
(2) A film-forming property (a glass transition point),
(3) Alkali developability,
(4) Decrease of layer thickness (hydrophobic-hydrophilic property, selection of an alkali-soluble group),
(5) Adhesion of an unexposed part to a substrate, and
(6) Dry etching resistance.

The examples of such monomers include compounds having one addition polymerizable unsaturated bond selected from acrylic acid esters, methacrylic acid esters, acrylamides, methacrylamides, alkyl compounds, vinyl ethers, and vinyl esters.

In addition to the aforementioned compounds, addition polymerizable unsaturated compounds copolymerizable with the monomers corresponding to the above various repeating structural units may be used for copolymerization.

In resin (B2), the molar ratio of the content of each repeating structural unit is arbitrarily set to adjust dry etching resistance and aptitude for standard developing solutions, adhesion to a substrate, and resist profile, in addition, general requisite characteristics of a resist, e.g., resolution, heat resistance and sensitivity.

As preferred embodiments of resin (B2), the following resins are exemplified.
(1) A resin containing a repeating unit having a partial structure containing the alicyclic hydrocarbon represented by any of formulae (pI) to (pV) (a side chain type), preferably a resin having a (meth)acrylate repeating unit having the structure of any of formulae (pI) to pV);
(2) A resin having a repeating unit represented by formula (II-AB) (a main chain type); however, the following is further exemplified as embodiment (2):
(3) A resin having a repeating unit represented by formula (II-AB), a maleic anhydride derivative and a (meth)acrylate structure (a hybrid type).

In resin (B2), the content of a repeating unit having an acid-decomposable group is preferably from 10 to 60 mmol % in all the repeating structural units, more preferably from 20 to 50 mol %, and still more preferably from 25 to 40 mol %.

In resin (B2), the content of a repeating unit having a partial structure containing the alicyclic hydrocarbon represented by any of formulae (pI) to (pV) is preferably from 25 to 70 mol % in all the repeating structural units, more preferably from 35 to 65 mol %, and still more preferably from 40 to 60 mol %.

In resin (B2), the content of the repeating unit represented by formula (II-AB) is preferably from 10 to 60 mol % in all the repeating structural units, more preferably from 15 to 55 mol %, and still more preferably from 20 to 50 mol %.

In resin (B2), the content of a repeating unit having a lactone group is preferably from 10 to 70 mol % in all the repeating structural units, more preferably from 20 to 60 mol %, and still more preferably from 25 to 60 mol %.

In resin (52), the content of a repeating unit having an alicyclic hydrocarbon structure substituted with a polar group is preferably from 1 to 40 mol % in all the repeating structural units, more preferably from 5 to 30 mol %, and still more preferably from 5 to 20 mol %.

The content of the repeating structural units on the basis of the monomers of further copolymerization components in the resin can also be optionally set according to the desired resist performances, and the content is generally preferably 99 mol % or less to the total mol number of the repeating structural units having a partial structure containing the alicyclic hydrocarbon represented by any of formulae (pI) to (pV) and the repeating units represented by formula (II-AB), more preferably 90 mol % or less, and still more preferably 80 mol % or less.

When the composition in the invention is for ArF exposure, it is preferred that the resin does not have an aromatic group from the aspect of the transparency to ArF rays.

Resin (B2) is preferably such that all the repeating units consist of (meth)acrylate repeating units. In this case, any of the following cases can be used, that is, a case where all the repeating units Consist of methacrylate, a case where all the repeating units consist of acrylate, and a case where the repeating units consist of mixture of methacrylate and acrylate, but it is preferred that acrylate repeating units account for 50 mmol % or less of all the repeating units.

More preferred resins are terpolymers comprising from 25 to 50 mol % of repeating units having a partial structure containing the alicyclic hydrocarbon represented by any of formulae (pI) to (pV), from 25 to 50 mol % of repeating units having a lactone structure, and from 5 to 30 mol % of repeating units having an alicyclic hydrocarbon structure substituted with a polar group, and tetrapolymers further containing from 5 to 20 mol % of repeating units having a carboxyl group or the structure represented by formula (F1).

Resin (B2) can be synthesized according to ordinary methods (e.g., radical polymerization). For instance, as ordinary methods, a batch polymerization method of dissolving a monomer and an initiator in a solvent and heating the solution to perform polymerization, and a dropping polymerization method of adding a solution of a monomer and an initiator to a heated solvent over 1 to 10 hours by dropping are exemplified, and dropping polymerization is preferred. As reaction solvents, ethers, e.g., tetrahydrofuran, 1,4-dioxane, and diisopropyl ether, ketones, e.g., methyl ethyl ketone and methyl isobutyl ketone, an ester solvent, e.g., ethyl acetate, amide solvents, e.g., dimethylformamide and dimethyacetamide, and the later-described solvents capable of dissolving the composition of the invention, e.g., propylene glycol monomethyl ether acetate, propylene glycol monomethyl ether, and cyclohexanone are exemplified. It is more preferred to use the same solvent in polymerization as the solvent used in the resist composition in the invention, by which the generation of particles during preservation can be restrained.

It is preferred to perform polymerization reaction in the atmosphere of inert gas such as nitrogen or argon. Polymerization is initiated with commercially available radical polymerization initiators (e.g., azo initiators, peroxide and the like). As radical polymerization initiators, azo initiators are preferred, and azo initiators having an ester group, a cyano group, or a carboxyl group are preferred. As preferred initiators, azobisisobutyronitrile, azobisdimethylvaleronitrile, and dimethyl-2,2'-azibis(2-methylpropionate) are exemplified. Initiators are added additionally or dividedly, if desired, and after termination of the reaction, the reaction product is put into a solvent and an aiming polymer is recovered as powder or a solid state. The reaction concentration is from 5 to 50 mass %, and preferably from 10 to 30 mass %. The reaction temperature is generally from 10 to 150° C., preferably from 30 to 120° C., and more preferably from 50 to 100° C.

In the resist composition in the invention, the proportion of the resin of component (B) of the invention in the entire composition is preferably from 40 to 99.9 mass % in the total solids content, more preferably from 50 to 99 mass %, and still more preferably from 80 to 96 mass %.

[4] Resin (C) Soluble in an Alkali Developing Solution:

The composition in the invention may contain a resin soluble in an alkali developing solution (hereinafter referred to as "component (C)" or "an alkali-soluble resin").

The alkali dissolution rate of the alkali-soluble resin is preferably 20 Å/sec or more when measured with 0.261N tetramethylammonium hydroxide (TMAH) at 23° C., and especially preferably 200 Å/sec or more.

As alkali-soluble resins for use in the invention, e.g., novolak resins, hydrogenated novolak resins, acetone-pyrogallol resins, o-polyhydroxystyrene, m-polyhydroxystyrene, p-polyhydroxystyrene, hydrogenated polyhydroxystyrene, halogen- or alkyl-substituted polyhydroxystyrene, hydroxystyrene-N-substituted malemide copolymers, o/p- and m/p-hydroxystyrene copolymers, partially O-alkylated products of the hydroxyl group of polyhydroxystyrene (e.g., from 5 to 30 mol % O-methylated, O-(1-methoxy)ethylated, O-(1-ethoxy)ethylated, O-2-tetrahydropyranylated, and O-(t-butoxycarbonyl)methylated products), and partially O-acylated products (e.g., from 5 to 30 mol % o-acetylated, and O-(t-butoxy)carbonylated products), styrene-maleic acid anhydride copolymers, styrene-hydroxystyrene copolymers, α-methylstyrene-hydroxystyrene copolymers, carboxyl group-containing methacrylic resins and derivatives thereof, and polyvinyl alcohol derivatives can be exemplified, but the invention is not restricted to these resins.

Particularly preferred alkali-soluble resins are novolak resins, o-polyhydroxystyrene, m-polyhydroxystyrene, p-polyhydroxystyrene, copolymers of these resins, alkyl-substituted polyhydroxystyrene, partially O-alkylated or O-acylated products of polyhydroxystyrene, styrene-hydroxystyrene copolymers, and α-methylstyrene-hydroxystyrene copolymers.

The novolak resins can be obtained by addition condensation to aldehydes with the prescribed monomers as main components in the presence of an acid catalyst.

The weight average molecular weight of alkali-soluble resins is generally 2,000 or more, preferably from 5,000 to 200,000, and more preferably from 5,000 to 100,000.

Here, the weight average molecular weight is defined as the polystyrene equivalent by gel permeation chromatography.

Alkali-soluble resins (C) in the invention may be used in combination of two kinds or more.

The use amount of alkali-soluble resins is from 40 to 97 mass % based on all the solids content of the resist composition, and preferably from 60 to 90 mass %.

[5] Dissolution-inhibiting Compound (D) Capable of Decomposing by the Action of an Acid to Increase Solubility in an Alkali Developing Solution Having a Molecular Weight of 3,000 or Less:

The composition in the invention may contain a dissolution inhibiting compound capable of decomposing by the action of an acid to increase solubility in an alkali developing solution having a molecular weight of 3,000 or less (hereinafter referred to as "component (D)" or "a dissolution inhibiting compound").

As dissolution inhibiting compound (D) capable of decomposing by the action of an acid to thereby increase the solubility in an alkali developing solution having a molecular weight of 3,000 or less, alicyclic or aliphatic compounds containing an acid-decomposable group, such as cholic acid derivatives containing an acid-decomposable group described in *Proceeding of SPIE*, 2724, 355 (1996) are preferred so as not to reduce the transmittance of lights of 220 nm or less. As the acid-decomposable groups and alicyclic structures, the same as those described in the alicyclic hydrocarbon-based acid-decomposable resin are exemplified.

When the resist composition of the invention is exposed with a KrF excimer laser or irradiated with electron beams, a phenolic compound having a structure that the phenolic hydroxyl group is substituted with an acid-decomposable group is preferably used. As the phenolic compounds, compounds having from 1 to 9 phenolic skeletons are preferred, and those having from 2 to 6 are more preferred.

The molecular weight of the dissolution-inhibiting compound in the invention is generally 3,000 or less, preferably from 300 to 3,000, and more preferably from 500 to 2,500.

The addition amount of the dissolution-inhibiting compound is preferably from 3 to 50 mass % based on the solid content of the resist composition, and more preferably from 5 to 40 mass %.

The specific examples of the dissolution-inhibiting compounds are shown below, but the invention is not restricted thereto.

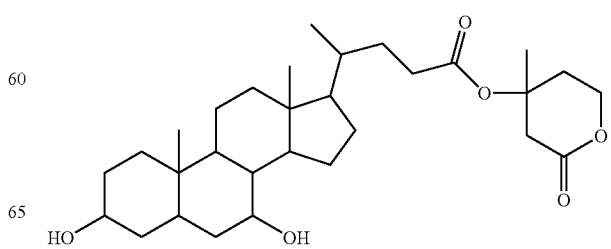

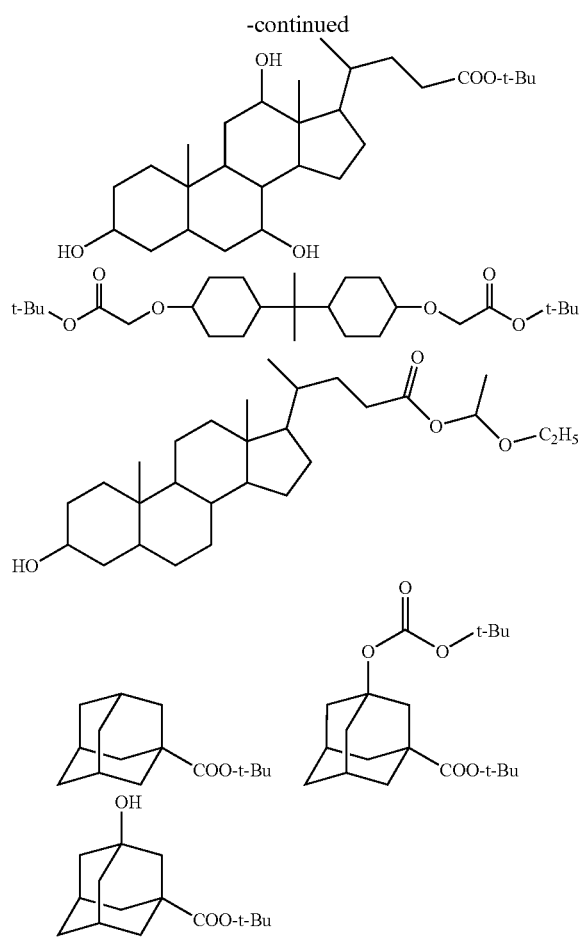

[7] Basic Compound (F)

For decreasing the fluctuation of performances during the period of time from exposure to heating, it is preferred for the resist composition of the invention to contain a basic compound.

As the preferred structures of basic compounds, the structures represented by any of the following formulae (A) to (E) can be exemplified.

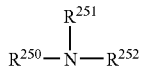  (A)

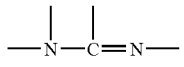  (B)

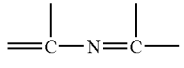  (C)

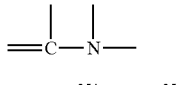  (D)

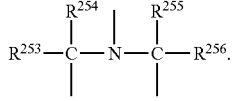  (E)

In formula (A), each of $R^{250}$, $R^{251}$ and $R^{252}$ independently represents a hydrogen atom, an alkyl group (preferably having from 1 to 20 carbon atoms), a cycloalkyl group (preferably having from 3 to 20 carbon atoms), or an aryl group (preferably having from 6 to 20 carbon atoms), and $R_{250}$ and $R_{251}$ may be bonded to each other to form a ring.

These groups may have a substituent, and as the alkyl group and cycloalkyl group having a substituent, an aminoalkyl group having from 1 to 20 carbon atoms or an aminocycloalkyl group having from 3 to 20 carbon atoms, a hydroxyalkyl group having from 1 to 20 carbon atoms or a hydroxycycloalkyl group having from 3 to 20 carbon atoms are preferred.

These groups may contain an oxygen atom, a sulfur atom or a nitrogen atom in the alkyl chain.

In formula (E), each of $R^{253}$, $R^{254}$, $R^{255}$ and $R^{256}$ independently represents an alkyl group (preferably having from 1 to 6 carbon atoms), or a cycloalkyl group (preferably having from 3 to 6 carbon atoms).

As preferred basic compounds, guanidine, aminopyrrolidine, pyrazole, pyrazoline, piperazine, aminomorpholine, aminoalkylmorpholine, and piperidine can be exemplified, and these compounds may have a substituent. As further preferred compounds, compounds having an imidazole structure, a diazabicyclo structure, an onium hydroxide structure, an onium carboxylate structure, a trialkylamine structure, an aniline structure, a pyridine structure, alkylamine derivatives having at least one of a hydroxyl group and an ether bond, and aniline derivatives having at least one of a hydroxyl group and an ether bond can be exemplified.

As the compounds having an imidazole structure, imidazole, 2,4,5-triphenyl-imidazole, and benzimidazole can be exemplified. As the compounds having a diazabicyclo structure, 1,4-diazabicyclo[2.2.2]octane, 1,5-diazabicyclo[4.3.0]nona-5-ene, and 1,8-diazabicyclo[5.4.0]undeca-7-ene can be exemplified. As the compounds having an onium hydroxide structure, triarylsulfonium hydroxide, phenacylsulfonium hydroxide, sulfonium hydroxide having a 2-oxoalkyl group, specifically triphenyl-sulfonium hydroxide, tris(t-butyl-phenyl)sulfonium hydroxide, bis(t-butylphenyl)-iodonium hydroxide, phenacylthiophenium hydroxide, and 2-oxopropylthiophenium hydroxide can be exemplified. The compounds having an onium carboxylate structure are compounds having an onium hydroxide structure in which the anionic part is carboxylated, e.g., acetate, adamantane-1-carboxylate, and perfluoroalkyl carboxylate are exemplified. As the compounds having a trialkylamine structure, tri(n-butyl)amine and tri(n-octyl)amine can be exemplified. As the aniline compounds, 2,6-diisopropylaniline and N,N-dimethylaniline can be exemplified. As the alkylamine derivatives having at least one of a hydroxyl group and an ether bond, ethanolamine, diethanolamine, triethanolamine, and tris(methoxyethoxyethyl)amine can be exemplified. As the aniline derivatives having at least one of a hydroxyl group and an ether bond, N,N-bis(hydroxyethyl)aniline can be exemplified.

Further, at least one kind of nitrogen-containing compound selected from an amine compound having a phenoxy group, an ammonium salt compound having a phenoxy group, an amine compound having a sulfonate group, and an ammonium salt compound having a sulfonate group can be exemplified.

As the amine compound, primary, secondary and tertiary amine compounds can be used, and an amine compound such that at least one alkyl group is bonded to the nitrogen atom is preferred. The amine compound is more preferably a tertiary amine compound. As the amine compound, a cycloalkyl group (preferably having from 3 to 20 carbon atoms) or an aryl group (preferably having from 6 to 12 carbon atoms) may be bonded to the nitrogen atom besides an alkyl group so long as at least one alkyl group (preferably having from 1 to 20 carbon atoms) is bonded to the nitrogen atom.

Further, it is preferred that the amine compound has an oxygen atom in the alkyl chain and an oxyalkylene group is formed. The number of the oxyalkylene group is one or more in the molecule, preferably from 3 to 9, and more preferably from 4 to 6. Of the oxyalkylene groups, an oxyethylene group ($-CH_2CH_2O-$) or an oxypropylene group ($-CH(CH_3)CH_2O-$ or $-CH_2CH_2CH_2O-$) is preferred, and an oxyethylene group is more preferred.

As the ammonium salt compound, primary, secondary, tertiary and quaternary ammonium salt compounds can be used, and an ammonium salt compound such that at least one alkyl group is bonded to the nitrogen atom is preferred. As the ammonium salt compound, a cycloalkyl group (preferably having from 3 to 20 carbon atoms) or an aryl group (preferably having from 6 to 12 carbon atoms) may be bonded to the nitrogen atom besides an alkyl group so long as at least one alkyl group (preferably having from 1 to 20 carbon atoms) is bonded to the nitrogen atom.

Further, it is preferred that the ammonium salt compound has an oxygen atom in the alkyl chain and an oxyalkylene group is formed. The number of the oxyalkylene group is one or more in the molecule, preferably from 3 to 9, and more preferably from 4 to 6. Of the oxyalkylene groups, an oxyethylene group ($-CH_2CH_2O-$) or an oxypropylene group ($-CH(CH_3)CH_2O-$ or $-CH_2CH_2CH_2O-$) is preferred, and an oxyethylene group is more preferred. As the anion of the ammonium salt compound, a halogen atom, sulfonate, borate, phosphate, etc., are exemplified, and a halogen atom and sulfonate are especially preferred. As the halogen atom, chloride, bromide and iodide are especially preferred, and organic sulfonate having from 1 to 20 carbon atoms is especially preferred as the sulfonate. As the organic sulfonate, alkylsulfonate having from 1 to 20 carbon atoms and arylsulfonate are exemplified. The alkyl group of the alkylsulfonate may have a substituent, e.g., fluorine, chlorine, bromine, an alkoxyl group, an acyl group and an aryl group are exemplified. As the alkylsulfonate, specifically methanesulfonate, ethanesulfonate, butanesulfonate, hexanesulfonate, octanesulfonate, benzylsulfonate, trifluoromethanesulfonate, pentafluoroethanesulfonate, and nonafluorobutanesulfonate are exemplified. As the aryl group of the arylsulfonate, a benzene ring, a naphthalene ring, and an anthracene ring are exemplified. The benzene ring, naphthalene ring and anthracene ring may have a substituent, and as the substituents, a straight chain or branched alkyl group having from 1 to 6 carbon atoms and a cycloalkyl group having from 3 to 6 carbon atoms are preferred. As the straight chain or branched alkyl group and the cycloalkyl group, specifically methyl, ethyl, n-propyl, isopropyl, n-butyl, i-butyl, t-butyl, n-hexyl and cyclohexyl are exemplified. As other substituents, an alkoxyl group having from 1 to 6 carbon atoms, a halogen atom, a cyano group, a nitro group, an acyl group and an acyloxy group are exemplified.

The amine compound having a phenoxy group and the ammonium salt compound having a phenoxy group are those each having a phenoxy group at terminals on the opposite side to the nitrogen atom of the alkyl group of the amine compound and the ammonium salt compound. The phenoxy group may have a substituent. As the substituent of the phenoxy group, e.g., an alkyl group, an alkoxyl group, a halogen atom, a cyano group, a nitro group, a carboxyl group, a carboxylate group, a sulfonate group, an aryl group, an aralkyl group, an acyloxy group and an aryloxy group are exemplified. The substituent may be substituted anywhere from 2- to 6-positions. The number of the substituent may be any in the range of from 1 to 5.

It is preferred to have at least one oxyalkylene group between the phenoxy group and the nitrogen atom. The number of the oxyalkylene group is one or more in the molecule, preferably from 3 to 9, and more preferably from 4 to 6. Of the oxyalkylene groups, an oxyethylene group ($-CH_2CH_2O-$) or an oxypropylene group ($-CH(CH_3)CH_2O-$ or $-CH_2CH_2CH_2O-$) is preferred, and an oxyethylene group is more preferred.

In the amine compound having a sulfonate group and the ammonium salt compound having a sulfonate group, the sulfonate group may be any of alkylsulfonate, cycloalkylsulfonate and arylsulfonate. It is preferred that in the case of alkylsulfonate, the alkyl group has from 1 to 20 carbon atoms, in the case of cycloalkylsulfonate, the cycloalkyl group has from 3 to 20 carbon atoms, and in the case of arylsulfonate, the aryl group has from 6 to 12 carbon atoms. The alkylsulfonate, cycloalkylsulfonate and arylsulfonate may have a substituent, and, e.g., a halogen atom, a cyano group, a nitro group, a carboxyl group, a carboxylate group and a sulfonate group are preferred as the substituents.

It is preferred to have at least one oxyalkylene group between the sulfonate group and the nitrogen atom. The number of the oxyalkylene group is one or more in the molecule, preferably from 3 to 9, and more preferably from 4 to 6. Of the oxyalkylene groups, an oxyethylene group ($-CH_2CH_2O-$) or an oxypropylene group ($-CH(CH_3)CH_2O-$ or $-CH_2CH_2CH_2O-$) is preferred, and an oxyethylene group is more preferred.

The amine compound having a phenoxy group can be obtained by reacting primary or secondary amine having a phenoxy group and haloalkyl ether by heating, adding an aqueous solution of strong base such as sodium hydroxide) potassium hydroxide or tetraalkylammonium, and extracting with an organic solvent such as ethyl acetate or chloroform. Alternatively, the amine compound having a phenoxy group can be obtained by reacting primary or secondary amine and haloalkyl ether having a phenoxy group at the terminal by heating, adding an aqueous solution of strong base such as sodium hydroxide, potassium hydroxide or tetraalkylammonium, and extracting with an organic solvent such as ethyl acetate or chloroform.

These basic compounds are used by one kind alone, or two or more in combination. However, when the use amount of component (B) is 0.05 mass % or more, the basic compound may be used or may not be used. When the basic compound is used, the use amount is generally from 0.001 to 10 mass % based on the solids content of the resist composition, and preferably from 0.01 to 5 mass %. For obtaining sufficient addition effect, the addition amount is preferably 0.001 mass % or more, and in the point of sensitivity and developing properties of an unexposed part, the amount is preferably 10 mass % or less.

[8] Fluorine and/or Silicon Surfactant (G):

It is preferred for the resist composition of the invention to further contain either one, or two or more of fluorine and/or silicon surfactants (a fluorine surfactant and a silicon surfactant, a surfactant containing both a fluorine atom and a silicon atom).

By containing the fluorine and/or silicon surfactant, it becomes possible for the resist composition in the invention to provide a resist pattern excellent in sensitivity and resolution, and low in defects in adhesion and development in using an exposure light source of 250 nm or lower, in particular, 220 mm or lower.

These fluorine and/or silicon surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. Commercially available surfactants shown below can also be used as they are.

As commercially available fluorine or silicon surfactants usable in the invention, e.g., Eftop EF301 and EF303 (manufactured by Shin-Akita Kasei Co., Ltd.), Fluorad FC 430 and 431 (manufactured by Sumitomo 3M Limited), Megafac F171, F173, F176, F189, and R08 (manufactured by Dainippon Ink and Chemicals Inc.), Sarfron S-382, SC 101, 102, 103, 104, 105 and 106 (manufactured by ASAHI GLASS CO., LTD.), Troy Sol S-366 (manufactured by Troy Chemical Co., Ltd.) are exemplified. In addition, polysiloxane polymer KP-341 (manufactured by Shin-Etsu Chemical Co., Ltd.) can also be used as a silicon surfactant.

In addition to these known surfactants as exemplified above, surfactants using polymers having fluoro-aliphatic groups derived from fluoro-aliphatic compounds manufactured by a telomerization method (also called a telomer method) or an oligomerization method (also called an oligomer method) can be used. The fluoro-aliphatic compounds can be synthesized by the method disclosed in JP-A-2002-90991.

As the polymers having fluoro-aliphatic groups, copolymers of monomers having fluoro-aliphatic groups and (poly(oxyalkylene)) acrylate and/or (poly(oxyalkylene)) methacrylate are preferred, and they may be distributed at random or block copolymerized. As the poly(oxyalkylene) groups, a poly(oxyethylene) group, a poly(oxypropylene) group, and a poly(oxybutylene) group are exemplified. Further, the polymers may be units having alkylenes different in chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly(oxyalkylene) acrylate (or methacrylate) may be not only bipolymers but also terpolymers or higher polymers obtained by copolymerization of monomers having different two or more kinds of fluoro-aliphatic groups and different two or more kinds of poly(oxyalkylene) acrylates (or methacrylates) at the same time.

For example, as commercially available surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (or methacrylate), and (poly(oxypropylene)) acrylate (or methacrylate), copolymers of acrylate (or methacrylate) having a $C_8F_{17}$ group and (poly(oxyalkylene)) acrylate (or methacrylate), and copolymers of acrylate (or methacrylate) having a $C_8F_{17}$ group, (poly(oxyethylene)) acrylate (or methacrylate), and poly(oxypropylene) acrylate (or methacrylate) are exemplified.

The addition amount of fluorine and/or silicon surfactant is preferably from 0.0001 to 2 mass % based on all the amount of the resist composition (excluding solvents), and more preferably from 0.001 to 1 mass %.

[9] Organic Solvent (H):

The above components of the resist composition of the invention are dissolved in a prescribed organic solvent.

As the organic solvents usable in the invention, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran are exemplified.

(Ia) Ketone Solvents:

Solvents containing at least a ketone structure are preferably used in the invention.

As the solvents containing a ketone structure, chain-like ketone solvents and cyclic ketone solvents are exemplified, and compounds having from 5 to 8 carbon atoms are preferred for capable of obtaining good coating property.

As the chain-like ketone solvents, e.g., 2-heptanone, methyl ethyl ketone, methyl isobutyl ketone, etc., are exemplified, and 2-heptanone is preferred.

As the cyclic ketone solvents, e.g., cyclopentanone, 3-methyl-2-cyclopentanone, cyclohexanone, 2-methylcyclohexanone, 2,6-dimethylcyclohexanone, cycloheptanone, cyclooctanone, and isophorone are exemplified, and cyclohexanone and cycloheptanone are preferred.

It is preferred that the solvents having a ketone structure are used alone, or as mixed solvents with other solvents. As the solvents to be mixed (combined use solvents), propylene glycol monoalkyl ether carboxylate, alkyl lactate, propylene glycol monoalkyl ether, alkyl alkoxypropionate, and lactone compounds can be exemplified.

As the propylene glycol monoallyl ether carboxylate, e.g., propylene glycol monomethyl ether acetate, propylene glycol monomethyl ether propionate, and propylene glycol monoethyl ether acetate can be exemplified.

As the alkyl lactate, e.g., methyl lactate and ethyl lactate can be exemplified.

As the propylene glycol monoalkyl ether, e.g., propylene glycol monomethyl ether and propylene glycol monoethyl ether can be exemplified.

As the alkyl alkoxypropionate, e.g., methyl methoxypropionate, ethyl methoxypropionate, methyl ethoxypropionate and ethyl ethoxypropionate can be exemplified.

As the lactone compounds, e.g., γ-butyrolactone can be exemplified.

As preferred combined use solvent, propylene glycol monoalkyl ether carboxylate, alkyl lactate and propylene glycol monoalkyl ether can be exemplified, and as more preferred combined use solvent, propylene glycol monomethyl ether acetate can be exemplified.

By the use of mixed solvents of ketone solvents and combined use solvents, substrate adhesion, developability and DOF are improved.

The ratio of the ketone solvent and the combined use solvent (mass ratio) is preferably from 10/90 to 95/5, more preferably from 20/80 to 80/20, and still more preferably from 30/70 to 70/30.

In view of heightening uniform film thickness and resistance to development defect, high boiling point solvents having a boiling point of 200° C. or higher, such as ethylene carbonate and propylene carbonate may be mixed.

The addition amount of these high boiling point solvents is generally from 0.1 to 15 mass % in all the solvents, preferably from 0.5 to 10 mass %, and more preferably from 1 to 5 mass %.

From the viewpoint of the improvement of resolution, it is preferred that the resist composition in the invention is used in film thickness of from 30 to 250 nm, and more preferably from 30 to 100 nm. Such a desired thickness can be realized by setting the concentration of solids content in the resist composition in a proper range and giving appropriate viscosity to thereby improve the coating property and film forming property.

In the invention, a resist composition is prepared in concentration of solids content of generally from 1 to 25 mass %, preferably from 1.5 to 22 mass %, and more preferably from 2 to 10 mass % with a solvent by one kind alone, preferably two or more kinds in combination.

[10] Other Additives (I):

If necessary, dyes, plasticizers, surfactants other than the surfactants of component (G), photosensitizers, and compounds for expediting the dissolution of composition in a developing solution may be further added to the resist composition in the present invention.

Compounds for expediting dissolution in a developing solution that can be used in the invention are low molecular weight compounds having a molecular weight of 1,000 or less and having two or more phenolic OH groups or one or more carboxyl groups. When carboxyl groups are contained, alicyclic or aliphatic compounds are preferred.

The preferred addition amount of these dissolution accelerating compounds is preferably from 2 to 50 mass % based on the resin of component (B) or the resin of component (C), and more preferably from 5 to 30 mass %. The amount is preferably 50 mass % or less in the point of restraint of development residue and prevention of pattern deformation in development.

These phenolic compounds having a molecular weight of 1,000 or less can be easily synthesized with referring to the methods disclosed, e.g., in JP-A-4-122938, JP-A-2-28531, U.S. Pat. No. 4,916,210, and EP 219,294.

As the specific examples of the alicyclic or aliphatic compounds having a carboxyl group, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, and cyclohexane-dicarboxylic acid are exemplified, but the invention is not restricted to these compounds.

In the invention, surfactants other than fluorine and/or silicon surfactants (G) can also be used. Specifically, nonionic surfactants, such as polyoxyethylene alkyl ethers, polyoxyethylene alkylallyl ethers, polyoxyethylene-polyoxypropylene block copolymers, sorbitan aliphatic esters, and polyoxyethylene sorbitan aliphatic esters can be exemplified.

These surfactants may be used by one kind alone, or some kinds of surfactants can be used in combination.

[11] Pattern Forming Method (J):

The resist composition in the invention is used by dissolving each of the above components in a prescribed organic solvent, preferably dissolving in the mixed solvent as described above, and coating the solution on a prescribed support as follows.

For example, the resist composition is coated on a substrate such as the one used in the manufacture of precision integrated circuit element (e.g., silicon/silicon dioxide coating) by an appropriate coating method with a spinner or a coater, and dried, to thereby form a resist film. Incidentally, it is also possible to coat a known antireflection film.

The resist film is irradiated with actinic ray or radiation through a prescribed mask, preferably subjected to baking (heating), and then development. Thus, a good pattern can be obtained.

At the time of irradiation with actinic ray or radiation, exposure (immersion exposure) may be performed by filling a liquid having higher refractive index than that of air between a resist film and a lens, by which resolution can be raised.

As actinic rays or radiation, infrared rays, visible rays, ultraviolet rays, far ultraviolet rays, X-rays and electron beams can be exemplified, and preferably far ultraviolet rays of wavelengths of 250 nm or less, and more preferably 220 nm or less. Specifically, a KrF excimer laser (248 nm), an ArF excimer laser (193 nm), an $F_2$ excimer laser (157 nm), X-rays and electron beams are exemplified, and ArF excimer lasers, EUV, and electron beams are preferred.

(Immersion Exposure)

When the resist composition in the invention is subjected to immersion exposure, it is preferred that the resist composition is used in a thickness of from 30 to 250 nm in view of the improvement of resolution, and more preferably a thickness of from 30 to 100 nm. Such a desired thickness can be realized by setting the concentration of solids content in the resist composition in a proper range and giving appropriate viscosity to thereby improve the coating property and film forming property.

The concentration of all the solids content in the resist composition is generally from 1 to 25 mass %, more preferably from 1.5 to 22 mass %, and still more preferably from 2 to 10 mass %.

When the resist composition in the invention is subjected to immersion exposure, the resist composition is used by dissolving each of the above components in a prescribed organic solvent, preferably in a mixed solvent as described above, and coating the solution on a prescribed support as follows.

That is, the resist composition is coated on a substrate such as the one used in the production of precision integrated circuit elements (e.g., silicon/silicon dioxide coating) by an appropriate coating method with a spinner or a coater in an arbitrary thickness (generally from 30 to 500 nm). After coating, if necessary, a resist film is washed with the immersion liquid. The washing time is generally from 5 seconds to 5 minutes.

Subsequently, the coated resist composition is dried by spin or bake to form a resist film (hereinafter also referred to as a resist film), and the resist film formed is subjected to exposure (immersion exposure) for pattern formation through a mask via an immersion liquid. For example, exposure is performed in the state of filling an immersion liquid between a resist film and an optical lens. The exposure dose can be optionally set, but is generally from 1 to 100 mJ/cm$^2$. After exposure, if necessary, the resist film is washed with the immersion liquid. The washing time is generally from 5 seconds to 5 minutes. After that, the resist film is preferably subjected to spin or/and bake, development and rinsing, whereby a good pattern can be obtained. It is preferred to perform bake, and the temperature of bake is generally from 30 to 300° C. The time from exposure to bake process is preferably shorter from the viewpoint of PED.

The exposure rays here are far ultraviolet rays of wavelengths of preferably 250 nm or less, and more preferably 220 nm or less. Specifically, a KrF excimer laser (248 nm), an ArF excimer laser (193 nm), an $F_2$ excimer laser (157 nm), and X-rays are exemplified.

Incidentally, the variation of performances of a resist at the time when subjected to immersion exposure is thought to be resulting from the contact of a resist surface with an immersion liquid.

An immersion liquid for use in immersion exposure is described below.

An immersion liquid for use in immersion exposure preferably has a temperature coefficient of refractive index as small as possible so as to be transparent to the exposure wavelength and to hold the distortion of an optical image reflected on the resist at the minimum. In particular, when the exposure light source is an ArF excimer laser (wavelength: 193 nm), it is preferred to use water as the immersion liquid for easiness of availability and capable of handling easily, in addition to the above points.

It is also possible to use a medium having a refractive index of 1.5 or more for capable of improving the refractive index. The medium may be an aqueous solution or an organic solvent.

When water is used as the immersion liquid, to reduce the surface tension of water and to increase the surface activity, a trace amount of additive (a liquid) that does not dissolve the resist layer on a wafer and has a negligible influence on the optical coating of the underside of a lens element may be added. As such additives, aliphatic alcohols having a refractive index almost equal to the refractive index of water are preferred, specifically methyl alcohol, ethyl alcohol and isopropyl alcohol are exemplified. By adding an alcohol having a refractive index almost equal to that of water, even if the alcohol component in water is evaporated and the concentration of the content is changed, the refractive index variation of the liquid as a whole can be made extremely small. On the other hand, when impurities opaque to the light of 193 nm or substances largely different from water in a refractive index are mixed, these substances bring about the distortion of an optical image reflected on the resist. Accordingly the water to be used is preferably distilled water. Further, pure water filtered through an ion exchange filter may be used.

The electric resistance of water is preferably 18.3 MΩ·cm or higher, and TOC (total organic material concentration) is preferably 20 ppb or lower, and it is preferred that water has been subjected to deaeration treatment.

It is possible to heighten lithographic performance by increasing the refractive index of an immersion liquid. From such a point of view, additives capable of increasing the refractive index may be added to water, or heavy water ($D_2O$) may be used in place of water.

A film hardly soluble in an immersion liquid (hereinafter also referred to as "topcoat") may be provided between a resist film by the resist composition of the invention and an immersion liquid so as not to bring the resist film into direct contact with the immersion liquid. The necessary functions required of the topcoat are the aptitude for coating on the upper layer of a resist, the transparency to radiation, in particular the transparency to the ray of 193 nm, and the insolubility in an immersion liquid. It is preferred that the topcoat is not mixed with a resist and can be coated uniformly on a resist upper layer.

From the viewpoint of the transparency to 193 nm, a polymer not containing an aromatic group is preferred as the topcoat. Specifically, hydrocarbon polymers, acrylic acid ester polymers, polymethacrylic acid, polyacrylic acid, polyvinyl ether, silicon-containing polymers, and fluorine-containing polymers are exemplified.

When the topcoat is peeled off, a developing solution may be used, or a remover may be used separately. As the remover, a solvent low in penetration into a resist is preferred. In view of capable of performing a peeling process at the same time with the development process of a resist, it is preferred that the topcoat can be peeled off by an alkali developing solution. From the viewpoint of performing peeling with an alkali developing solution, the topcoat is preferably acidic, but from the viewpoint of non-intermixture with the resist, it may be neutral or alkaline.

Resolution increases when there is no difference in the refractive indexes between the topcoat and the immersion liquid. When an exposure light source is an ArF excimer laser (wavelength: 193 nm), it is preferred to use water as the immersion liquid, so that it is preferred that the refractive index of the topcoat for ArF immersion exposure is nearer the refractive index of water (1.44). Further, from the viewpoint of the transparency and refractive index, the thickness of the topcoat is preferably thinner.

When an immersion liquid is an organic solvent, the topcoat is preferably water-soluble.

In a development process, an alkali developing solution is used as follows. As the alkali developing solution of a resist composition, alkaline aqueous solutions of inorganic alkalis, e.g., sodium hydroxide, potassium hydroxide, sodium carbonate, sodium silicate, sodium metasilicate, aqueous ammonia, etc., primary amines, e.g., ethylamine, n-propylamine, etc., secondary amines, e.g., diethylamine, di-n-butyl-amine, etc., tertiary amines, e.g., triethylamine, methyldiethylamine, etc., alcohol amines, e.g., dimethylethanolamine, triethanolamine, etc., quaternary ammonium salts, e.g., tetramethylammonium hydroxide, tetraethylammonium hydroxide, etc., and cyclic amines, e.g., pyrrole, piperidine, etc., can be used.

An appropriate amount of alcohols and surfactants may be added to these alkali developing solutions.

The alkali concentration of an alkali developing solution is generally from 0.1 to 20 mass %.

The pH of an alkali developing solution is generally from 10.0 to 15.0.

EXAMPLE

The invention will be described with reference to examples, but the invention is not restricted thereto.

<Compound (A)>

(1) Synthesis of Dibenzothiophene-S-oxide

Dibenzothiophene (20.0 g) is suspended in 80.0 ml of trifluoroacetic acid at room temperature. Into the suspension is slowly dropped 12.4 ml of 30% aqueous hydrogen peroxide while cooling with ice so as to maintain the reaction temperature around 60° C. After completion of dropping, the reaction solution is stirred at room temperature for 30 minutes. After the reaction, the reaction solution is added to 1,000 ml of water to precipitate crystals. The crystals are recovered by filtration and washed with water. The obtained crystals are recrystallized with acetonitrile to obtain 19.2 g of dibenzothiophene-S-oxide.

$^1$H-NMR (400 MHz, CDCl$_3$) δ 7.51 (t, 2H), 7.59 (t, 2H), 7.81 (d, 2H), 8.00 (d, 2H)

While cooling with ice, 10.0 g of dibenzothiophene-S-oxide synthesized in the above step (1) is added to 30 g of diphosphorus pentoxide/methanesulfonic acid (9/1), and further 10 ml of 2-phenylethyl acetate is added thereto. The reaction solution is stirred at room temperature for 6 hours, and then poured into ice water. The obtained aqueous solution is filtered, and 23 g of potassium iodide is added. Crystals precipitated are recovered by filtration to obtain 11.1 g of 5-[(4-(2-acetoxyethyl)-phenyl]dibenzothiophenium iodide. The obtained 11.1 g of 5-[4-(2-acetoxyethyl)-phenyl]dibenzothiophenium iodide is dissolved in 200 ml of methanol, 10.7 g of a 20% aqueous solution of tetramethylammonium hydroxide is added to the solution, followed by stirring at room temperature for 2 hours. Subsequently, 100 ml of ion exchange water and 100 ml of chloroform are added to the solution to extract a chloroform layer. After the solvent is distilled off under reduced pressure, the reaction product is washed with ethyl acetate to obtain 8.5 g of the aiming 5-[4-(2-hydroxyethyl)phenyl]dibenzothiophenium iodide.

(2) Synthesis of (A-23)

Synthesis is carried out according to the following reaction scheme.

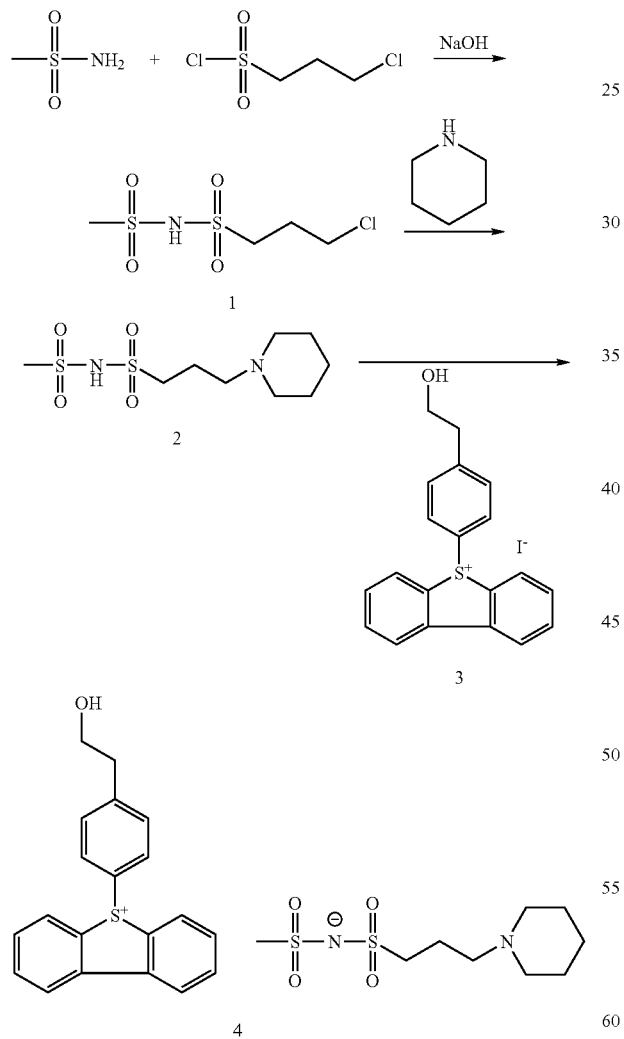

Sodium hydroxide (4.21 g) is dissolved in 50 ml of water, and 5 g of methanesulfonamide is dissolved in the above solution. To the solution is added 9.31 g of chloropropanesulfonyl chloride with ice cooling by dropping, and the reaction mixture is reacted at room temperature for 4 hours. Concentrated hydrochloric acid is added to the reaction solution to make the solution acidic, extraction is performed with ethyl acetate, and an organic phase is washed with water, dried, and concentrated to obtain 8.9 g of compound 1. To the obtained compound 1 (3 g) is added 12 g of piperidine and reacted at 70° C. for 5 hours. The reaction solution is concentrated to obtain compound 2. Water (50 ml) and 2 g of sodium hydroxide are added to the above reaction solution. Compound 3 (4.45 g), 30 ml of methanol and 20 ml of water are added to the above solution and the mixture is stirred at room temperature for 30 minutes. The reaction solution is subjected to extraction with chloroform three times, and a chloroform phase is washed with water and concentrated to obtain a crude product of compound 4. After 100 ml of ethyl acetate is added to the above compound, stirred at 50° C. for 10 minutes, cooled with ice, and operation of eliminating ethyl acetate is repeated two times to obtain 2.8 g of compound 4.

$^1$H-NMR (CDCl$_3$) δ 1.35 (bs, 2H), δ 1.47 (m, 4H), δ 1.93 (m, 2H), δ 2.30 (m, 4H), δ 2.85 (t, 2H), δ 3.13 (m, 2H), δ 3.81 (t, 2H), δ 7.44 (d, 2H), δ 7.64 (m, 4H), δ 7.86 (t, 2H), δ 8.17 (d, 2H), δ 8.27 (d, 2H)<

<Compound (B)>

The structures, molecular weights and polydispersities of compound (B) used in Examples are shown below.

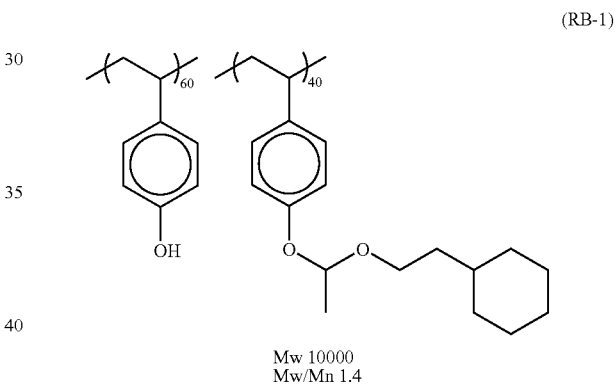

(RB-1)

Mw 10000
Mw/Mn 1.4

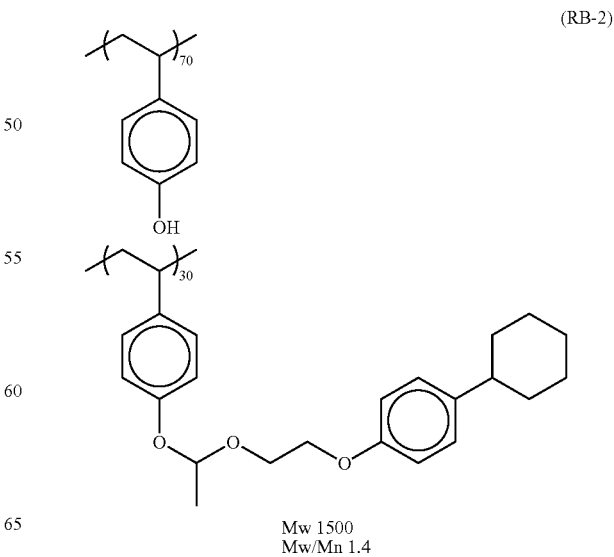

(RB-2)

Mw 1500
Mw/Mn 1.4

-continued
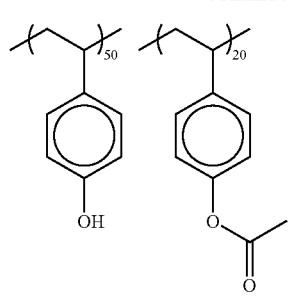
(RB-3)
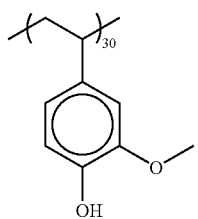
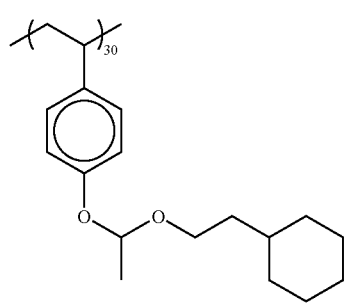
Mw 2000
Mw/Mn 1.4
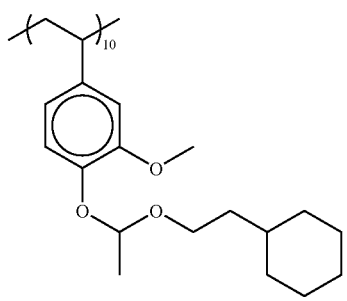
Mw 8000
Mw/Mn 1.4
(RB-4)
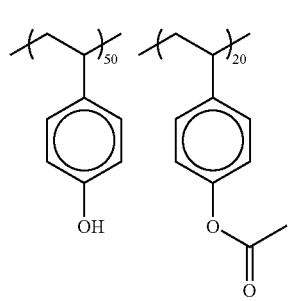
(RB-6)
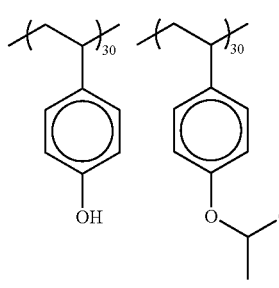
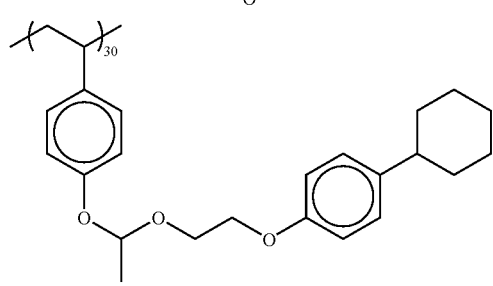
Mw 15000
Mw/Mn 1.4
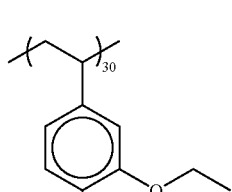
(RB-5)
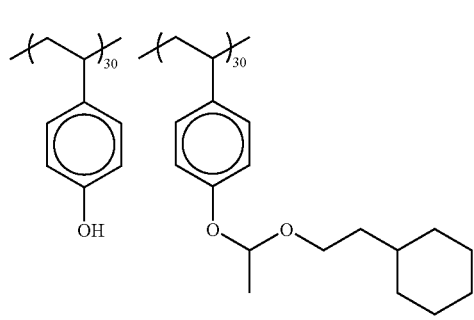
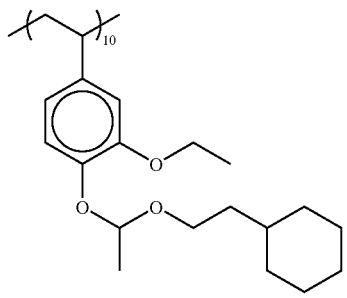
Mw 15000
Mw/Mn 1.4

(RB-7)
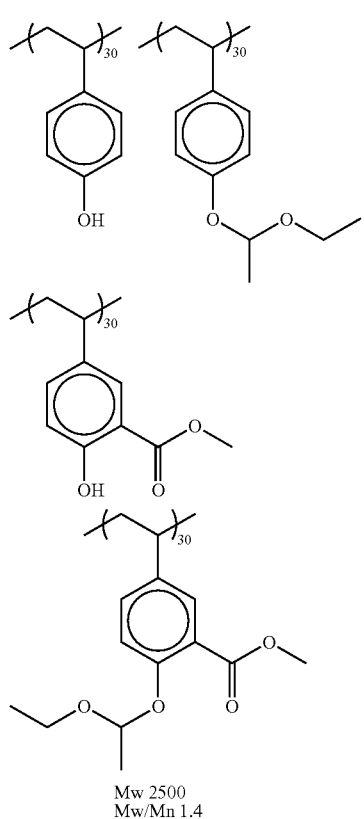
Mw 2500
Mw/Mn 1.4
(RB-8)
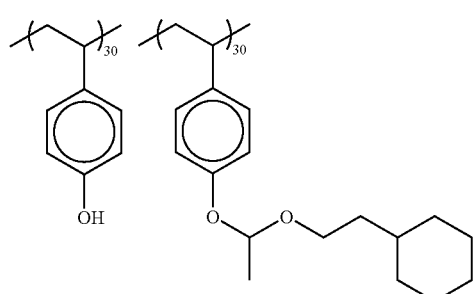
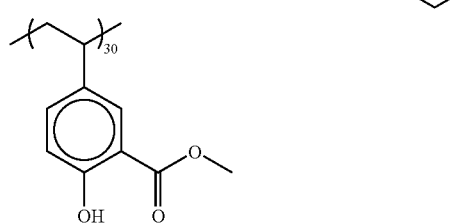
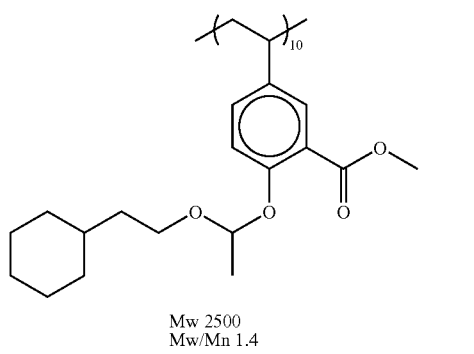
Mw 2500
Mw/Mn 1.4
(RB-9)
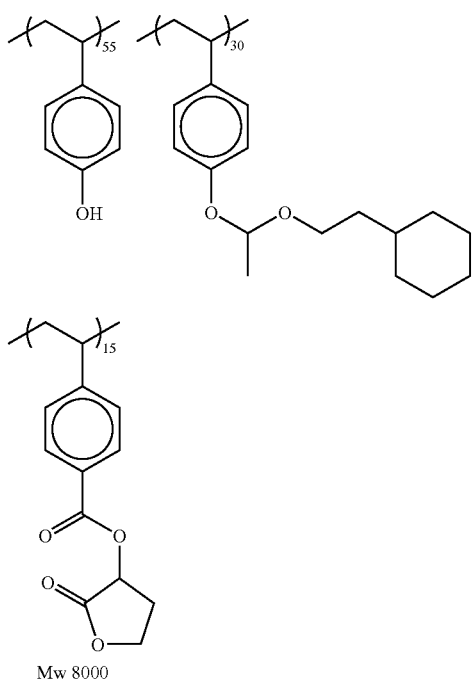
Mw 8000
Mw/Mn 1.4
(RB-10)
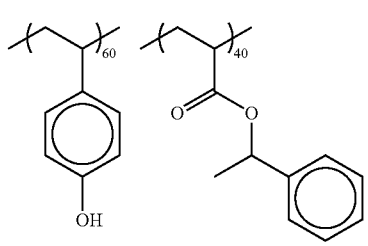
Mw 8000
Mw/Mn 1.4
(RB-11)
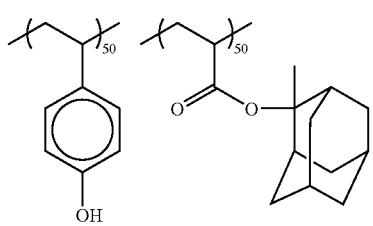
Mw 1500
Mw/Mn 1.4
(RB-12)
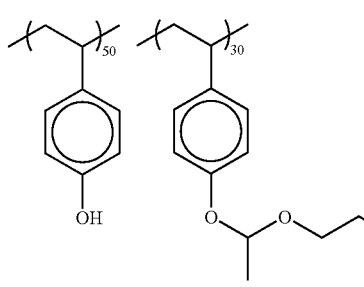

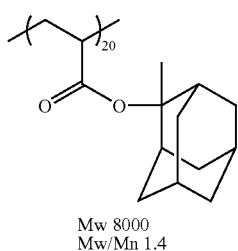
Mw 8000
Mw/Mn 1.4
(RB-13)
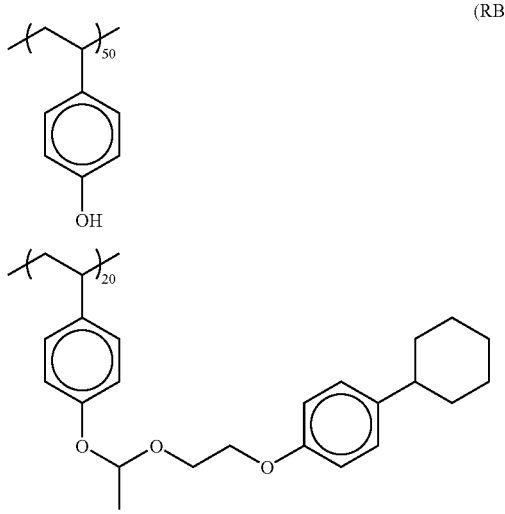
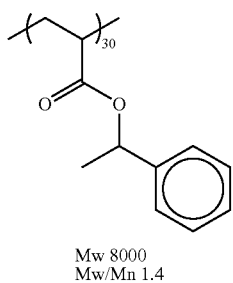
Mw 8000
Mw/Mn 1.4
(RB-14)
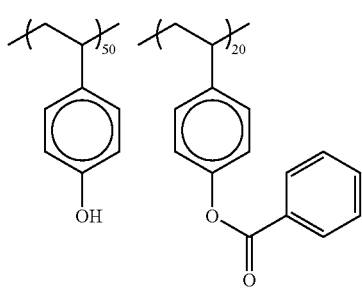
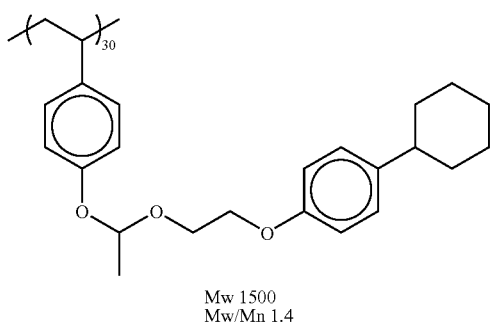
Mw 1500
Mw/Mn 1.4
(RB-15)
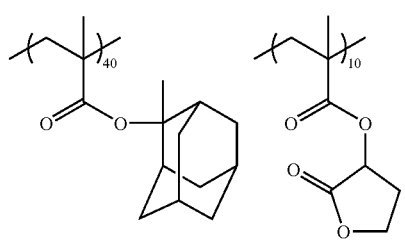
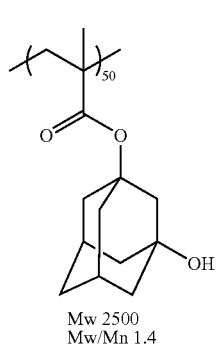
Mw 2500
Mw/Mn 1.4
(RB-16)
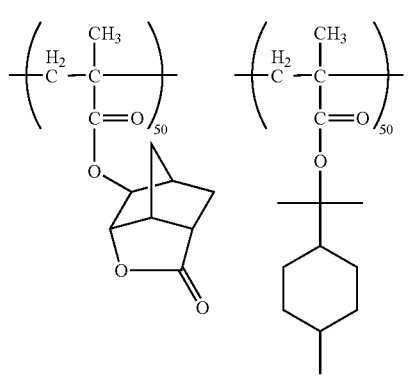
Mw 8000
Mw/Mn 1.4
(RB-17)
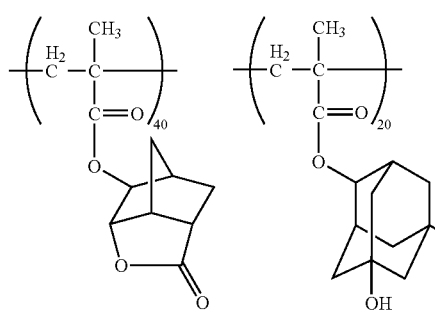

-continued

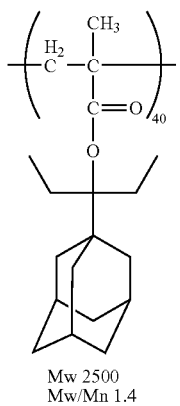

Mw 2500
Mw/Mn 1.4

(RB-18)

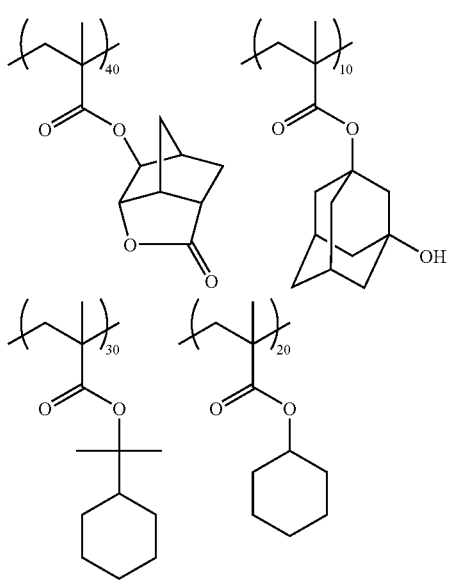

Mw 2500
Mw/Mn 1.4

Example 1

Preparation of a Resist Composition

| | |
|---|---:|
| Compound B (RB-1) | 1.255 g |
| Compound A (A-28) | 0.02 g |
| Acid generator (zl) | 0.0759 g |
| Surfactant (W-4) | 0.002 g |

The above components are dissolved in the solvents shown in Table 1 below to prepare a solution of the concentration of solids content of 6.5 mass %. The obtained solution is filtered through a polytetrafluoroethylene filter having a pore size of 0.1 μm to prepare a resist solution.

Examples 2 to 25 and Comparative Examples 1 to 3

The resist solutions in other examples and comparative examples are also prepared in the same manner as above with the components shown in Tables 1 to 3.

<Manufacture of a Pattern and Evaluation>

The positive resist solution prepared above is uniformly coated on a silicon wafer having been subjected to hexamethyldisilazane treatment by a spin coater, and dried by heating at 120° C. for 90 seconds to form a positive resist film having a thickness of 0.15 μm. The resist film is irradiated with electron beam by an electron beam imaging apparatus (HL750, accelerating voltage: 50 KeV, manufactured by Hitachi Ltd.). After irradiation, the resist film is baked at 110° C. for 90 seconds, and then immersed for 60 seconds with a 2.38 mass % tetramethylammonium hydroxide (TMAH) aqueous solution, followed by washing with water for 30 seconds and drying. The obtained pattern is evaluated according to the following methods.

[Sensitivity]

The profile of the obtained pattern is observed with a scanning electron microscope (S4800, manufactured by Hitachi, Ltd.). The minimum irradiation energy for resolving 150 nm line (line/space=1/1) is taken as sensitivity.

[Resolution]

In the irradiation dose showing the above sensitivity, line size (line/space=1/1) where isolated resolution is observed is taken as limiting resolution size, even if falling down is observed at a part of the pattern, and this is defined as resolution.

[Line Edge Roughness (LER)]

In regard to 50 μm in the machine direction of the line pattern of 150 nm in the irradiation dose showing the above sensitivity, the distance from the intrinsic base line of the edge is measured at arbitrary 30 points with a scanning electron microscope (S-9220, manufactured by Hitachi, Ltd.), and the standard deviation is found, from which 3σ was computed. The smaller the value, the better is the performance.

[Exposure Latitude (EL)]

Taking the exposure dose required to reproduce the mask pattern of line and space of line width 150 nm as the optimal exposure amount, the breadth of exposure dose tolerating 150 nm±15 nm of a pattern size when exposure amount is varied is found. The obtained value is divided by the optimal exposure amount and the exposure latitude is shown in percentage. The greater the value, the smaller is the fluctuation of performance by the variation of exposure amount, and exposure latitude is good.

[Dimension Before Falling Down]

In the irradiation dose showing the above sensitivity, a pattern size (line/space=1/1) where falling down of the pattern is not seen at all and isolated resolution is observed is defined as dimension before falling down, and this is taken as the criterion of restraint of falling down. The smaller the value, the better is the performance.

[Outgas]

The minimum irradiation energy for resolving 150 nm line (line/space=1/1) is evaluated by the variation coefficient of the film thickness at the time of irradiation by areal exposure.

Outgas=[(film thickness before exposure)−(film thickness after exposure)]/(film thickness before exposure)×100

The smaller the value, the better is the performance.

TABLE 1

| Ex. | Resin (1.255 g) | Acid Generator (0.0759 g) | Compound Represented by Formula (1) (0.02 g) | Basic Compound (g) | Surfactant (0.002 g) | Solvent (mass ratio) | Sensitivity ($\mu C/cm^2$) | Resolution (nm) | LER (nm) | EL (%) | Dimension before Falling down (nm) | Outgas (%) |
|---|---|---|---|---|---|---|---|---|---|---|---|---|
| 1 | RB-1 | z1 | A-28 | Absent | W-4 | S-1/S-2 (8/2) | 10 | 75 | 6.1 | 15 | 87.5 | 5 |
| 2 | RB-2 | z4 | A-8 | Absent | W-4 | S-1/S-2 (8/2) | 15 | 87.5 | 6.1 | 15 | 87.5 | 5 |
| 3 | RB-2 | z66 | A-23 | Absent | W-4 | S-1/S-2 (8/2) | 15 | 87.5 | 6.1 | 15 | 87.5 | 3 |
| 4 | RB-3 | z66 | A-8 | Absent | W-3 | S-1/S-3 (6/4) | 10 | 62.5 | 6.2 | 15 | 75 | 2.8 |
| 5 | RB-3 | z66 | A-23 | Absent | W-3 | S-1/S-4 (8/2) | 10 | 62.5 | 6.3 | 18 | 75 | 2.4 |
| 6 | RB-4 | z2 | A-23 | Absent | W-3 | S-1/S-4 (8/2) | 10 | 62.5 | 6.3 | 15 | 75 | 5 |
| 7 | RB-4 | z2 | A-2 | Absent | W-3 | S-1/S-4 (8/2) | 10 | 62.5 | 6.3 | 15 | 75 | 5 |
| 8 | RB-5 | z34 | A-28 | Absent | W-3 | S-1/S-4 (8/2) | 10 | 62.5 | 6.4 | 15 | 75 | 5 |
| 9 | RB-6 | z66 | A-9 (0.01 g) | N-3 (0.002 g) | W-3 | S-1/S-4 (8/2) | 11 | 62.5 | 6.2 | 18 | 75 | 3 |
| 10 | RB-7 | z68 | A-8 | Absent | W-4 | S-1/S-2 (8/2) | 10 | 62.5 | 6.4 | 15 | 75 | 2.8 |
| 11 | RB-8 | z66 | A-8 | Absent | W-3 | S-1/S-3 (6/4) | 10 | 75 | 6.4 | 15 | 87.5 | 2.4 |
| 12 | RB-8 | z66 | A-23 | Absent | W-3 | S-1/S-3 (6/4) | 10 | 75 | 6.4 | 15 | 87.5 | 2.4 |
| 13 | RB-9 | z5 | A-1 | Absent | W-3 | S-1/S-4 (8/2) | 10 | 62.5 | 6.4 | 15 | 75 | 5 |
| 14 | RB-10 | z17 | A-1 | Absent | W-4 | S-1/S-2 (8/2) | 10 | 75 | 6.4 | 15 | 75 | 5 |
| 15 | RB-11 | z61 | A-2 | Absent | W-3 | S-1/S-3 (6/4) | 10 | 75 | 6.4 | 17 | 75 | 5 |

TABLE 2

| Ex. | Resin (1.255 g) | Acid Generator 1 (0.0759 g) | Compound Represented by Formula (I) (0.02 g) | Basic Compound (g) | Surfactant (0.002 g) | Solvent (mass ratio) | Sensitivity ($\mu C/cm^2$) | Resolution (nm) | LER (nm) | EL (%) | Dimension before Falling Down (nm) | Outgas (%) |
|---|---|---|---|---|---|---|---|---|---|---|---|---|
| 16 | RB-11 | z61 | A-20 | Absent | W-3 | S-1/S-3 (6/4) | 10 | 75 | 6.4 | 15 | 75 | 5 |
| 17 | RB-12 | z50 | A-22 | Absent | W-3 | S-1/S-4 (8/2) | 11 | 75 | 6.4 | 15 | 87.5 | 5 |
| 18 | RB-13 | z58 | A-21 | Absent | W-4 | S-1/S-2 (8/2) | 10 | 62.5 | 6.4 | 15 | 75 | 5 |
| 19 | RB-14 | z65 | A-6 | Absent | W-3 | S-1/S-3 (6/4) | 10 | 62.5 | 6.4 | 15 | 75 | 5 |
| 20 | RB-15 | z5 | A-6 | Absent | W-3 | S-1/S-4 (8/2) | 11 | 62.5 | 6.4 | 15 | 75 | 5 |
| 21 | RB-16 | z12 | A-14 | Absent | W-3 | S-1/S-4 (8/2) | 11 | 62.5 | 6.4 | 15 | 75 | 5 |
| 22 | RB-17 | z27 | A-9 (0.01 g) | Absent | W-4 | S-1/S-2 (8/2) | 11 | 62.5 | 6.4 | 15 | 75 | 5 |
| 23 | RB-18 | z66 | A-9 (0.01 g) | N-1 (0.002 g) | W-4 | S-1/S-2 (8/2) | 11 | 62.5 | 6.7 | 18 | 75 | 3.1 |
| 24 | RB-1 (0.6 g) RB-2 (0.655 g) | z4 | A-23 | Absent | W-3 | S-1/S-3 (6/4) | 10 | 75 | 6.4 | 15 | 87.5 | 5 |
| 25 | RB-3 | z55 (0.04 g) z4 (0.0359 g) | A-28 | Absent | W-3 | S-1/S-4 (8/2) | 10 | 75 | 6.7 | 18 | 87.5 | 5 |

TABLE 3

| Comp. Ex. | Resin (1.255 g) | Acid Generator (0.0759 g) | Acid Generator (0.02 g) | Basic Compound (g) | Surfactant (0.002 g) | Solvent (mass ratio) | Sensitivity ($\mu C/cm^2$) | Resolution (nm) | LER (nm) | EL (%) | Dimension before Falling Down (nm) | Outgas (%) |
|---|---|---|---|---|---|---|---|---|---|---|---|---|
| 1 | RB-1 | z1 | Absent | N-3 (0.004 g) | W-4 | S-1/S-2 (8/2) | 13 | 125 | 7.2 | 8 | 200 | 5 |
| 2 | RB-2 | z2 | PAG-1 | Absent | W-4 | S-1/S-2 (8/2) | 9 | 75 | 6.5 | 7 | 100 | 15 |
| 3 | RB-2 | z2 | PAG-2 | Absent | W-4 | S-1/S-2 (8/2) | 9 | 75 | 6.5 | 7 | 100 | 5 |

The abbreviations used in Tables 1 to 3 are shown below.

PAG-1

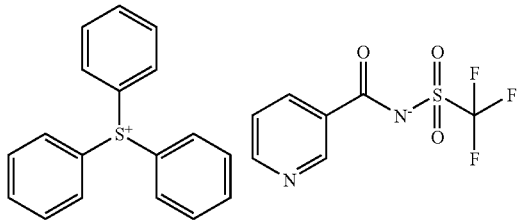

PAG-2

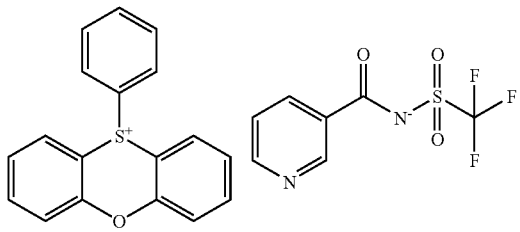

[Basic Compounds]

N-1: Trioctylamine

N-2: 1,5-Diazabicyclo[4.3.0]-5-nonene

N-3: 2,4,6-Triphenylimidazole

[Surfactants]

W-1: Megafac F176 (manufactured by Dainippon Ink and Chemicals Inc.)

W-2: Megafac R08 (manufactured by Dainippon Ink and Chemicals Inc.)

W-3: Troy Sol S-366 (manufactured by Troy Chemical Co., Ltd.)

W-4: Polyoxyethylene lauryl ether

[Solvents]

S-1: Propylene glycol monomethyl ether acetate

S-2: Propylene glycol monomethyl ether

S-3: Ethyl lactate

S-4: Cyclohexanone

As shown in Tables 1 to 3, the resist compositions in the invention are superior to comparative resist compositions in every item of sensitivity, resolution LER, exposure latitude, and falling down performance.

The same effect is also obtained by patterning with EUV exposure.

The invention can provide a resist composition excellent in sensitivity, resolution, roughness, exposure latitude, falling down of a pattern, and outgassing characteristics, and can provide a pattern-forming method using the resist composition.

The entire disclosure of each and every foreign patent application from which the benefit of foreign priority has been claimed in the present application is incorporated herein by reference, as if fully set forth.

What is claimed is:

1. A resist composition comprising:
   (A) a compound represented by the following formula (I):

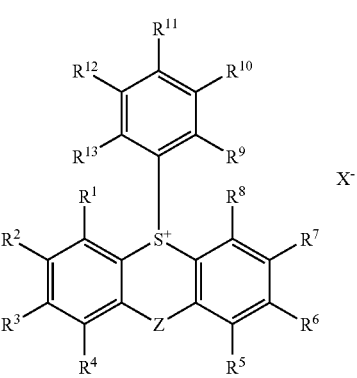

(I)

wherein
each of $R^1$ to $R^{13}$ independently represents a hydrogen atom or a substituent, provided that at least one of $R^1$ to $R^{13}$ is a substituent containing an alcoholic hydroxyl group;
Z represents a single bond or a divalent linking group; and
X represents an anion containing a proton acceptor functional group.

2. The resist composition according to claim 1, further comprising:
   (B) a resin capable of decomposing by the action of an acid to increase solubility in an alkali developing solution.

3. The resist composition according to claim 2, wherein the resin (B) is a resin having a hydroxystyrene repeating unit.

4. The resist composition according to claim 1, which is exposed with X-ray, electron beam or EUV.

5. A pattern-forming method comprising:
   forming a resist film with the resist composition according to claim 1, exposing the resist film, and developing the resist film.

6. A compound represented by the following formula (I):

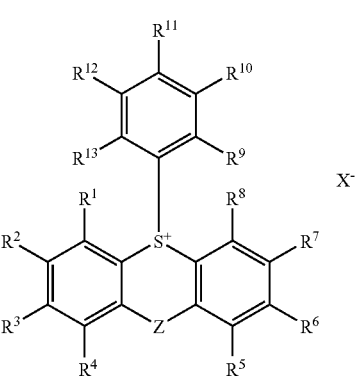

(I)

wherein
each of $R^1$ to $R^{13}$ independently represents a hydrogen atom or a substituent, provided that at least one of $R^1$ to $R^{13}$ represents a substituent containing an alcoholic hydroxyl group;

Z represents a single bond or a divalent linking group; and
X⁻ represents an anion containing a proton acceptor functional group.

7. A resist composition according to claim 1, wherein Z represents a single bond or a non-electron-withdrawing divalent linking group.

8. A resist composition according to claim 1, wherein Z represents a single bond.

9. A resist composition according to claim 1, wherein X⁻ in formula (I) is an anion represented by the formula (III)

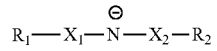
(III)

wherein each of $R_1$ and $R_2$ independently represents a univalent organic group, or $R_1$ and $R_2$ combine with each other to form a ring.

* * * * *